United States Patent [19]

Miyaoka et al.

[11] Patent Number: 5,384,738
[45] Date of Patent: Jan. 24, 1995

[54] SEMICONDUCTOR INTEGRATED CIRCUIT DEVICE

[75] Inventors: Shuuichi Miyaoka; Kazuhisa Miyamoto, both of Ohme; Masanori Odaka, Kodaira; Hideo Sawamoto, Hadano; Michiaki Nakayama, Ohme; Mitsugu Kusunoki, Ohme; Masato Ikeda, Ohme; Takashi Ogata, Ohme; Kouji Kobayashi, Ohme; Masao Kato, Hadano; Tsutomu Sumimoto, Hadano, all of Japan

[73] Assignees: Hitachi, Ltd.; Hitachi Microcomputer System, Ltd., Tokyo, Japan

[21] Appl. No.: 189,636

[22] Filed: Feb. 1, 1994

Related U.S. Application Data

[63] Continuation of Ser. No. 589,515, Sep. 28, 1990, Pat. No. 5,291,445.

[30] Foreign Application Priority Data

| Sep. 29, 1989 | [JP] | Japan | 1-251894 |
| Oct. 23, 1989 | [JP] | Japan | 1-275159 |
| Dec. 4, 1989 | [JP] | Japan | 1-314665 |
| Dec. 19, 1989 | [JP] | Japan | 1-329192 |
| Jan. 26, 1990 | [JP] | Japan | 2-14946 |
| Jan. 29, 1990 | [JP] | Japan | 2-18388 |
| Mar. 30, 1990 | [JP] | Japan | 2-87222 |

[51] Int. Cl.⁶ ............................................. G11C 7/00
[52] U.S. Cl. ............................ 365/189.08; 365/189.11; 365/233; 365/51; 365/177; 326/66; 326/43; 326/45
[58] Field of Search ............ 365/189.08, 51, 63, 365/177, 189.11, 233; 307/465, 465.1, 269, 480; 328/63, 72

[56] References Cited

U.S. PATENT DOCUMENTS 5,014,242  5/1991  Akimoto et al. .................. 365/63

Primary Examiner—Joseph A. Popek
Attorney, Agent, or Firm—Antonelli, Terry, Stout & Kraus

[57] ABSTRACT

A semiconductor integrated circuit device such as a memory device with logic function comprises a plurality of RAM macrocells and gate arrays. The RAM macrocells are constituted by bipolar CMOS RAMs having a total memory capacity of at least 100 kilobits, and the gate arrays contain at least 4000 gates. The logic circuits in the memory device with logic function or the like are constructed by selectively combining CMOS, bipolar CMOS or ECL gate circuits depending on the output load capacity, transmission characteristic requirement, power dissipation and required layout area. The level of signals at various circuits is set to the ECL level or MOS level depending on the local circuit configuration and other factors. The memory device further incorporates sequence control circuits required to be installed downstream of buffer storages of computers.

37 Claims, 37 Drawing Sheets

SEMICONDUCTOR INTEGRATED CIRCUIT DEVICE

This is a continuation of application Ser. No. 589,515, filed Sep. 28, 1990, now U.S. Pat. No. 5,291,445.

BACKGROUND OF THE INVENTION

The present invention relates to a semiconductor integrated circuit device and a semiconductor memory for such uses as a memory device with logic function constituting a buffer storage device (buffer memory device) for computers.

In the related art, there exists a prior art memory device with logic function having a plurality of RAM (random access memory) macrocells and gate arrays. There are digital processors such as a computer having a buffer storage that comprises the above memory device with logic function.

The memory device with logic function having multiple RAM macrocells and gate arrays is illustratively discussed in such publications as U.S. patent application Ser. No. 07/198,311, filed and assigned to Hitachi, Ltd. by Isomura et al. on May 25, 1988. The gate arrays of this prior art memory device comprise ECL (emitter coupled logic) circuits based on bipolar transistors for high-speed operation. The inventors found that this construction hampered efforts to reduce the power dissipation of the memory device and to enlarge the scale of circuit integration thereof. This has resulted in long delay times required for signal transmission and hence relatively low speeds of operation. The inventors' investigation further revealed that constraints on the circuit integration of the memory device with logic function kept the sharing of functions between the memory device and other devices from being optimized. The resultant long critical path of computers has imposed limitations on the cycle time thereof.

SUMMARY OF THE INVENTION

It is therefore an object of the present invention to provide a semiconductor integrated circuit device which optimizes the circuit and signal configuration of a memory device with logic function or the like in order to enlarge the circuit integration thereof and to reduce the power dissipation thereby.

It is another object of the present invention to provide a semiconductor integrated circuit device which optimizes the sharing of functions between the buffer storage comprising a memory device with logic function for a computer or the like on the one hand, and other devices on the other, so as to obtain a high-speed system.

It is a further object of the present invention to provide a semiconductor integrated circuit device comprising a plurality of means for enlarging the circuit integration of a memory device with logic function and of computers or the like containing the memory device, for stabilizing the performance of the memory device and computers, and for boosting the operation speed thereof, whereby-enhancing the ability thereof to be diagnosed.

The above and other related objects and features of the invention, as well as the novelty thereof, will clearly appear from the following description and from the accompanying drawings.

According to one aspect of the invention, there is provided a semiconductor integrated circuit device such as a memory device with logic function, the device comprising a plurality of RAM macrocells and gate arrays, the RAM macrocells being constituted by bipolar CMOS RAMs with a total memory size of at least 100 kilobits, the gate arrays containing at least 4K bipolar CMOS gates. The logic circuits for the memory device with logic function or the like are constituted by selectively combining CMOS, bipolar CMOS or ECL gate circuits in accordance with such parameters as output load capacity, required transmission characteristic, power dissipation and required layout area. The signal level at various parts is either the ECL level or the MOS level depending on the circuit configuration. Furthermore, a sequence control circuit required downstream of a computer buffer storage or the like is located inside the memory device with logic function or the like.

As indicated, the semiconductor integrated circuit device according to the invention optimizes the circuit and signal configuration of memories with logic function or the like while maintaining the high operation speeds thereof, whereby attaining the lower power dissipation thereby and a larger-scale circuit integration therein. At the same time, the semiconductor integrated circuit device shortens the delay time in transmission of a computer buffer storage or the like while optimizing the sharing of functions between the storage and other devices. This speeds up the machine cycle of computers or the like containing the buffer storage.

DETAILED DESCRIPTION OF THE PREFERRED EMBODIMENTS

Figure 1:
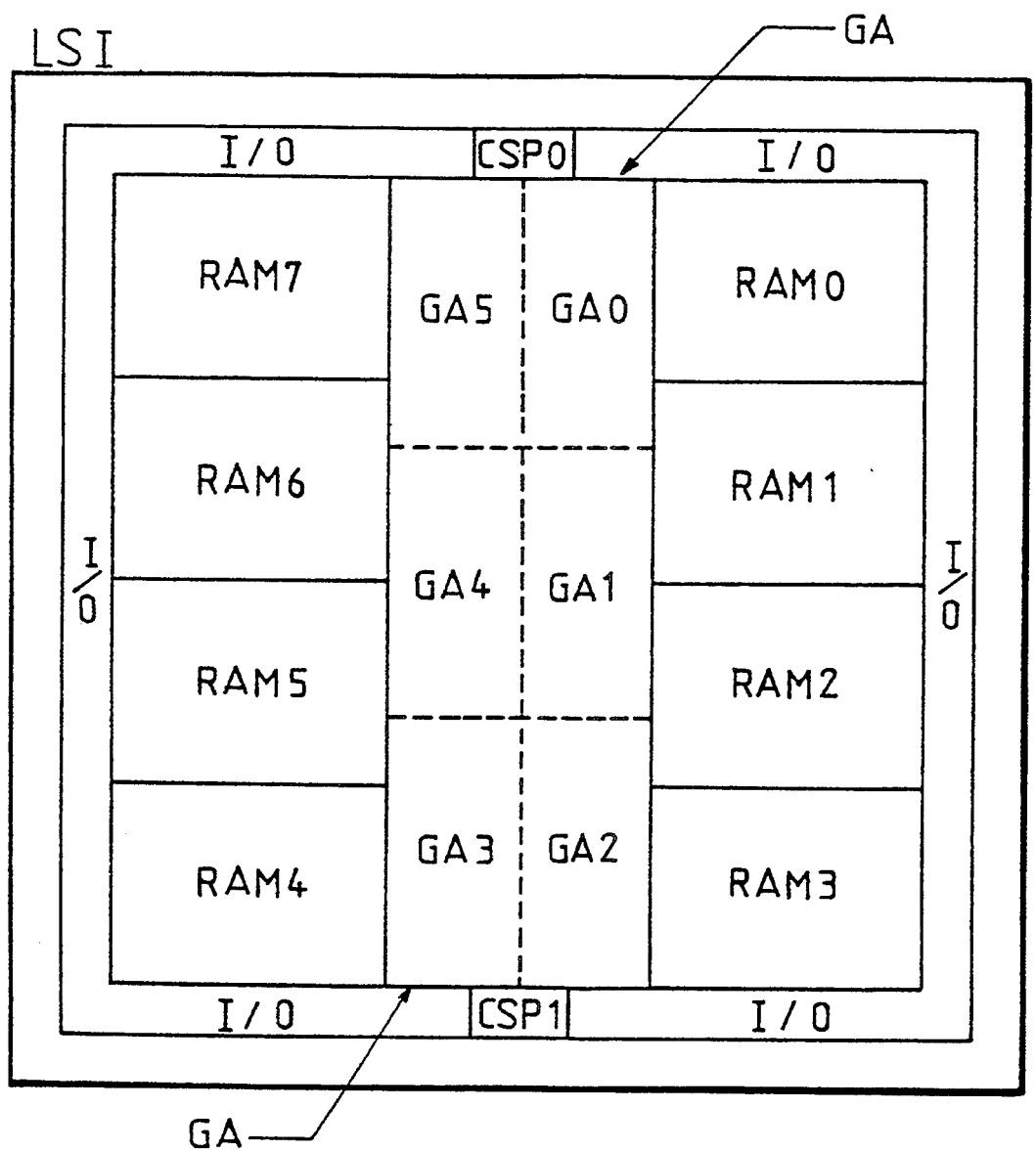
FIG. 1 is a layout view of a substrate bearing memory device with logic function embodying the present invention.
Figure 2:
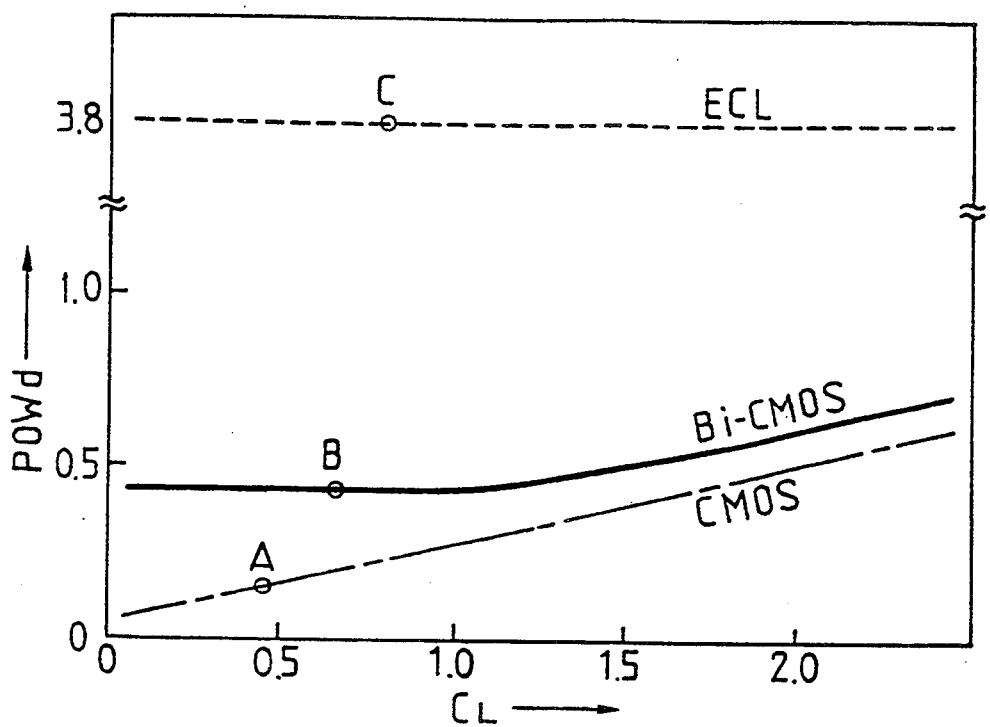
FIG. 2 is a general characteristic view comparing the output load capacity versus the power dissipation of CMOS, bipolar CMOS and ECL gate circuits.
Figure 3:
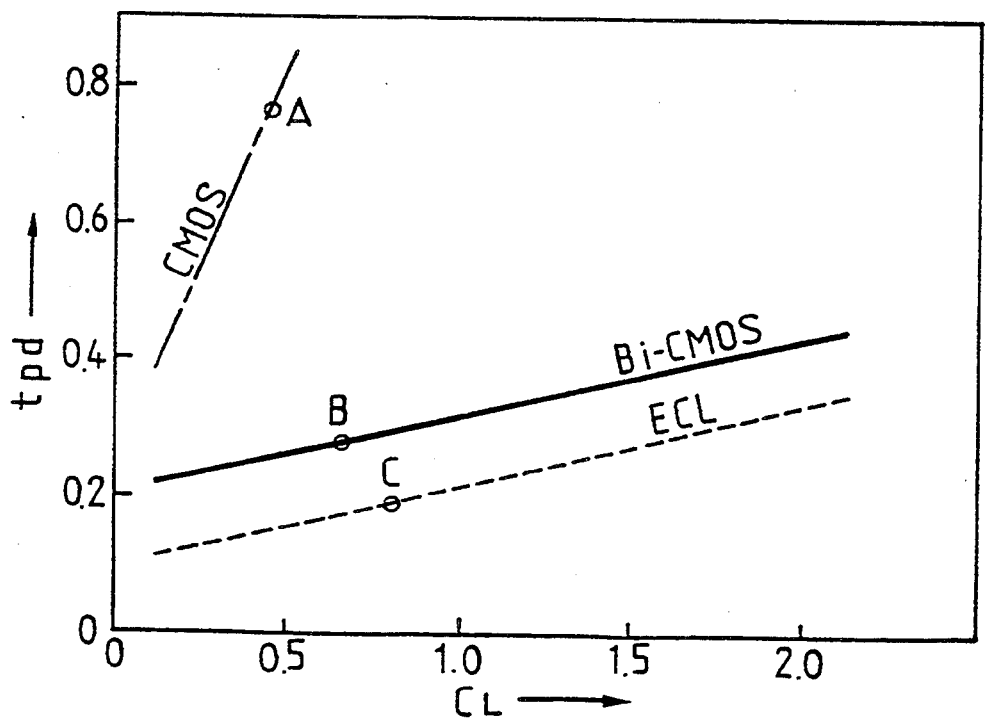
FIG. 3 is a general characteristic view comparing the output load capacity versus the transmission delay time of CMOS bipolar CMOS and ECL gate circuits.

Basic configuration of memory device with logic function:

FIG. 1 shows the layout of a substrate that bears memory device (LSI) with logic function embodying the invention FIG. 2 is a general characteristic view comparing the output load capacity versus the power dissipation of CMOS, bipolar CMOS and ECL gate circuits. FIG. 3 is also a general characteristic view comparing the output load capacity versus the transmission delay time of the same circuits. Referring to these figures, the basic configuration of the memory device with logic function embodying the invention, as well as some features of the memory device, will now be described.

The circuit elements shown in the following figures except FIGS. 38 and 39, as well as the circuit elements constituting each block, are installed on, but not limited to, a semiconductor substrate measuring about 10 mm by 10 mm and constituted by P-type monocrystal silicon. In the circuit diagrams that follow, the MOSFET (metal oxide semiconductor field effect transistor, generically representing the insulated gate transistor in this specification whose channel part (back gate) has an arrow pointing thereto is a P-channel MOSFET as opposed to an N-channel MOSFET with no arrow attached thereto. All bipolar transistors in the figures constitute, but are not limited to, NPN transistors. In FIGS. 2 and 3, point A indicates the average output load capacity of the corresponding CMOS logic gate circuit in a prior art logic circuit setup. Likewise, point B denotes the average output load capacity of the corresponding prior art bipolar CMOS logic gate circuit, and point C designates the average output load capacity of the corresponding prior art ECL gate circuit.

In FIG. 1, the memory device with logic function according to the invention is constituted, but not limited, by eight RAM macrocells (RAM 0–RAM 7) symmetrically arranged on both sides (4 on each side) of the semiconductor substrate measuring about 10 mm by 10 mm, and a gate array section GA at the substrate center sandwiched between these RAM macrocells. The outside of the RAM macrocells and gate array section is furnished with, but not limited by, an input/output circuit cell section (I/O) and clock shaping circuits CSP 0 and CSP 1 making up a clock circuit. The periphery of the semiconductor substrate (chip) is further provided with a plurality of bonding pads, not shown. The chip is designed to measure about 10 mm by 10 mm so as to attain a higher yield.

In the above-described embodiment, each of the eight RAM macrocells has, but is not limited to, a memory capacity of 24 bits×2048 words. Thus the memory device with logic function has a total memory capacity of 393,216 bits, or 384 kilobits. The gate array section GA, as will be described later, has about 1000 cell units (GCUs). The actual number of gates exceeds 11K gates. As described and according to the invention, the total memory capacity of a plurality of RAM macrocells in the memory device with logic function is set for at least 100 kilobits, and the number of gates in the gate array section is set for at least 4000. These settings turn the memory device with logic function into a unit whereby, in constructing various computer buffer storages using the memory device, it is possible to establish an effective memory capacity, an effective way of sharing functions, an effective number of chip-to-chip lines, and an effective production yield of the memory device. For the memory device with logic function, the gate array section GA (indicated by broken line in FIG. 1) is divided into six gate arrays GA 0 through GA5. The dividing of the gate array is in keeping with clock switching amplifiers CSA 0 through CSA 9, to be described later. It is to be noted that such division has no functional significance.

The internal circuits in the memory device with logic function are constituted, but not limited, by selectively combining CMOS, bipolar CMOS and ECL gate circuits in accordance with such parameters as output lead capacity, required operation speed, transmission characteristics including transmission delay time, power dissipation, and required layout area.

As depicted in FIGS. 2 and 3, the CMOS logic gate circuit has an advantage of a power dissipation level POWd lower than that of any other logic gate circuit, hence its conduciveness to circuit integration of larger scale. One disadvantage of the CMOS logic gate circuit is its relatively slow operation speed, hence the long transmission delay time "tpd" involved. Meanwhile, the ECL gate circuit has a power dissipation level POWd considerably higher than that of most other logic gate circuits and is thus not conductive to circuit integration of larger scale. However, the operation speed of the ECL gate circuit is so high that its transmission delay time "tpd" is the shortest. A differential circuit comprising such ECL circuits as its basic components may take on a large amplification factor, and is optimally fit to constitute a current sense circuit or the like containing RAM macrocells. Now, the bipolar CMOS logic gate circuit has a low power dissipation level POWd comparable to that of the CMOS logic gate circuit and a transmission delay time "tpd" as short as that of the ECL gate circuit, and is comparatively fit for circuit integration of larger scale.

Given such features, the memory device with logic function according to the invention is constituted, but not limited, by an ECL gate circuit in which the clock circuit is a dedicated built-in circuit, as will be described later. This arrangement is intended to reduce the signal skew and transmission delay time involved. All standard cells of the gate array section GA (i.e., cell units) are of a CMOS, bipolar CMOS logic gate circuit or are built in a feasible bipolar CMOS format. This arrangement is intended to reduce the power dissipation and to boost the scale of circuit integration. In addition, each RAM macrocell is composed of bipolar CMOS RAMs as its basic components. Various circuits of the RAM macrocell are formed by selectively combining CMOS, bipolar CMOS and ECL gate circuits in accordance with the function and characteristic required. This circuit construction is intended to increase the speed of the memory device with logic function, lower the power dissipation thereby, and enhance the scale of integration thereof.

The memory device with logic function in this embodiment is used in, but not limited to, constructing a buffer storage of the CPU for computers or the like. Thus the level of signals entering and leaving the memory device is always the ECL level in compliance with the system bus interface of computers. Meanwhile, as already mentioned, the various circuits of the memory device with logic function are formed by selectively combining CMOS, bipolar CMOS and ECL gate circuits. The level of signals transmitted inside these circuits is either the ECL level or the MOS level depending on the basic circuit construction. This requires the input/output circuit cell section (I/O) of the memory device with logic function to have a plurality of input circuit cells and output circuit cells. The input circuit cells transmit to the various circuits the input signal with its ECL level unchanged or after conversion to the MOS level. The output circuit cells turn the ECL or MOS level of output signals coming from the various circuits uniformly into the ECL level before these signals are output.

What follows is a detailed description in sequence of the construction, operation and features of the input-/output cell section (I/O), the gate array section GA, the RAM macrocells and the clock circuit, all constituting the memory device with logic function.

Figure 4:
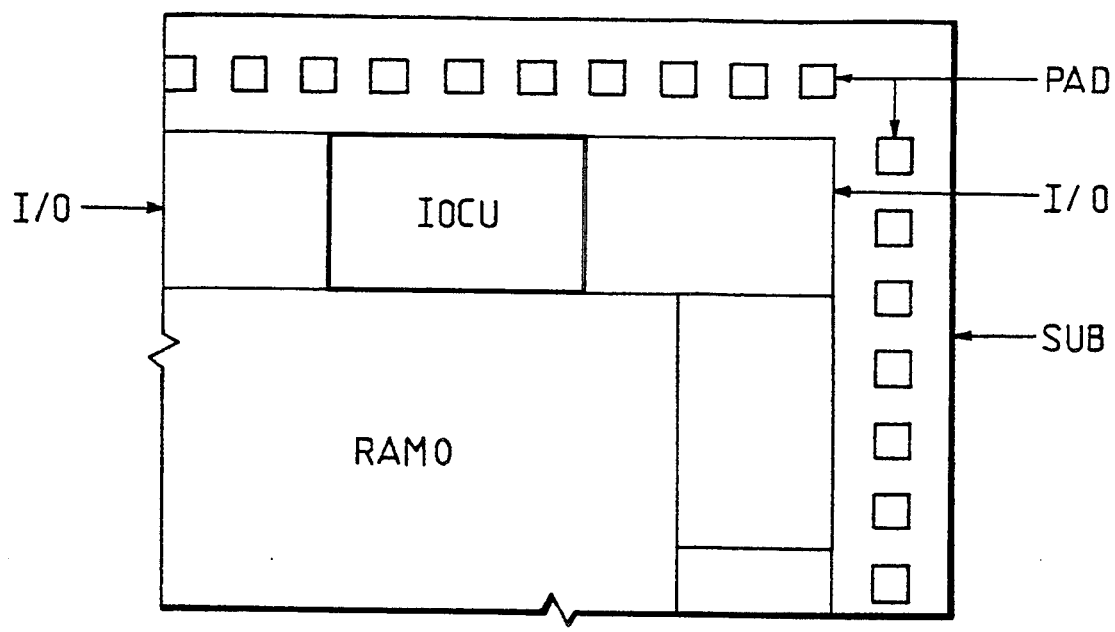
FIG. 4 is a partial layout view of input/output circuit cell units contained in the memory device with logic function depicted in FIG. 1.

Input/output cell section:

FIG. 4 shows a partial layout view of an input/output circuit cell section illustratively practiced in the memory device with logic function depicted in FIG. 1. In FIG. 4, the input/output circuit cell section I/O is furnished with, but not limited by, about 30 input/output circuit cell units (IOCUs). Inside of these input/output circuit cell units are RAM macrocells (RAM0, etc.). Outside of the IOCUs are a plurality of bonding pads (PADs) including protective circuits, arranged as illustrated.

Figure 5:
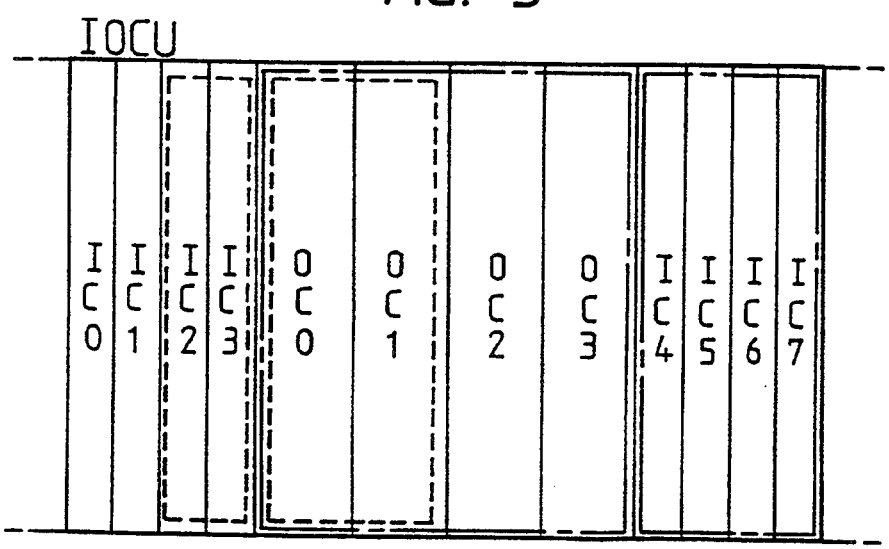
FIG. 5 is a layout view of a variation of the input-/output cell units of FIG. 4.

Input/output circuit cell units:

FIG. 5 is a layout view of a variation of the input-/output cell units constituting the input/output circuit cell section of FIG. 4. These input/output circuit cell units (IOCUs) contain, and are not limited to, four output circuit cells (OC 0–OC 3) and eight input circuit cells (IC 0–IC 3 on one side, IC 4–IC 7 on the other) sandwiching the output circuit cells, as illustrated in FIG. 5.

On a base chip of the memory device with logic function, the output circuit cells OC 0–OC 3 and the input circuit cells IC 0–IC 7 have their input and output terminals opened at their receiving and transmitting ends, with no connections attached thereto. These input and output terminals are coupled to the corresponding input and output terminals of internal circuits or to the bonding pads (PADs) by use of a photo mask. The photo mask is used to provide for a metal wire layer to be produced based on the user's specifications. The arrangement allows the output and input circuit cells to be used singly or in combination as needed.

For example, if the input and output circuits are not required to provide large driving capabilities or are used only for transmitting uninverted or inverted signals, the output circuit cells OC 0–OC 3 and the input circuit cells IC 0–IC 7 are used individually. On the other hand, if the input or output circuits are required to provide large driving capabilities or are used to transmit complementary signals, the output circuit cells OC 0–OC 3 and the input circuit cells IC 0–IC 7 are used in a combination of two or four cells at a time, as indicated by broken or dashed lines in FIG. 5.

As described, one input/output circuit cell unit is constituted by selectively combining four output circuit cells and eight input circuit cells as its components in accordance with the purpose of the signals to be transmitted and with the load driving capability requirement. This arrangement enhances the system flexibility of the input/output circuit cell section as well as the use efficiency thereof.

Figure 6:
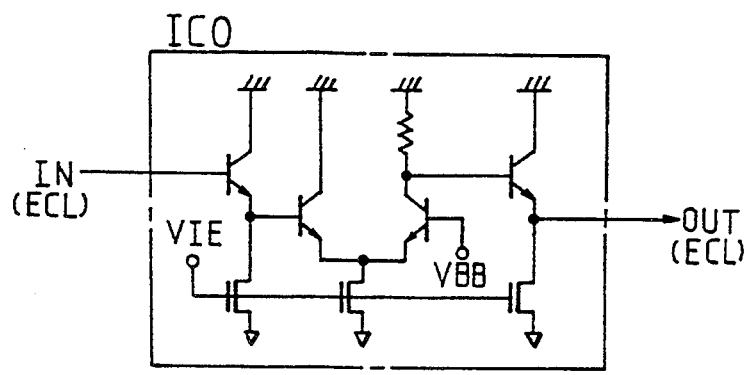
FIG. 6 is a circuit diagram of an input circuit cell contained in the input/output circuit cell units of FIG. 4.
Figure 7:
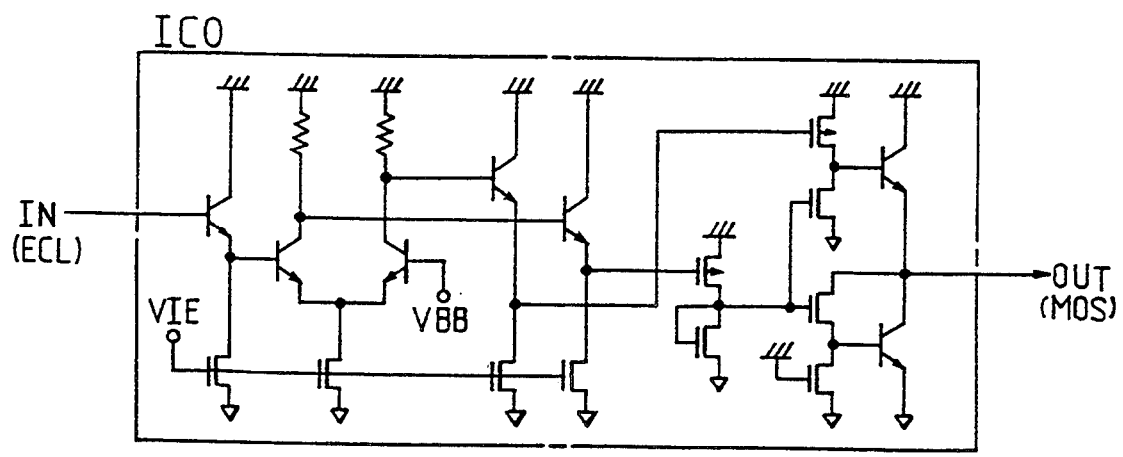
FIG. 7 is a circuit diagram of a variation of the input circuit cell contained in the input/output circuit cell units of FIG. 4.

Input circuit cells:

FIG. 6 is a circuit diagram of the input circuit cell IC 0 contained in the input/output circuit cell units (IOCUs) of FIG. 5. FIG. 7 is a circuit diagram of a variation of the input circuit cell arrangement shown in FIG. 5.

As described, an external device supplies the input signal at the ECL level to the memory device with logic function, the signal level staying unchanged or being changed to the MOS level before signal transmission to the corresponding internal circuit. The input/output circuit cell section (I/O) of the memory device with logic function uses the input circuit cell shown in FIG. 6 when transmitting the input signal with its ECL level kept intact to the corresponding internal circuit, or uses the input circuit cell of FIG. 7 when transmitting the input signal with its level changed to the MOS level to the corresponding internal circuit. In this embodiment, the input circuit cells of FIGS. 6 and 7 are incorporated in the same circuit when mounted on a base chip of the memory device with logic function. The configuration of this circuit is selectively determined by partially switching the photo mask of the metal wire layer.

The input circuit cell IC 0 of FIG. 6 includes and is not limited to an input emitter follower circuit that receives an ECL level input signal IN. The output of this input emitter follower circuit is supplied to the base of one bipolar transistor (or simply called the transistor hereinafter) constituting a differential circuit. The base of the other transistor is supplied with a predetermined reference potential VBB. This allows the differential circuit to act as a current switching circuit that uses the reference potential VBB as the logic threshold. The uninverted output signal of the current switching circuit turns into an output signal OUT of the input circuit cell IC 0 via an output emitter follower circuit, the signal being transmitted to the corresponding internal circuit while the ECL level of the signal remains unchanged.

The input circuit cell IC 0 of FIG. 7 comprises a pair of output emitter follower circuits besides the input emitter follower circuit of FIG. 6 and the differential circuit, the output emitter follower circuits transmitting the uninverted and inverted output signals of the differential circuit. The uninverted output signal of the differential circuit is transmitted to the gate of a P-channel MOSFET constituting a level conversion circuit. After inversion, the inverted output signal is transmitted to the gates of two N-channel MOSFETs constituting the level conversion circuit. The level conversion circuit includes a pair of output transistors that are provided in a totem pole manner between ground potential and supply voltage on the circuit. The commonly connected emitter and collector potential of these output transistors appears as an output signal OUT of the input circuit cell IC 0, the output signal being transmitted to the corresponding internal circuit. In this embodiment, the supply voltage of the circuit is −5.2 V, but not limited thereto.

When the input signal IN is brought High on the ECL level, the uninverted output signal of the differential circuit is also High as with the ground potential of the circuit, whereas the inverted output signal is Low as prescribed. Thus the output transistor on the ground potential side of the circuit is turned on, bringing the output signal OUT of the input circuit cell IC 0 High at the MOS level which is close to the ground potential of the circuit. On the other hand, when the input signal IN is brought Low on the ECL level, the uninverted output signal of the differential circuit is Low as prescribed while the inverted output signal is High. This causes the other output transistor to go on at the supply power side of the circuit, bringing the output signal OUT of the input circuit cell IC 0 Low at the MOS level which is close to the supply voltage of the circuit.

Figure 8:
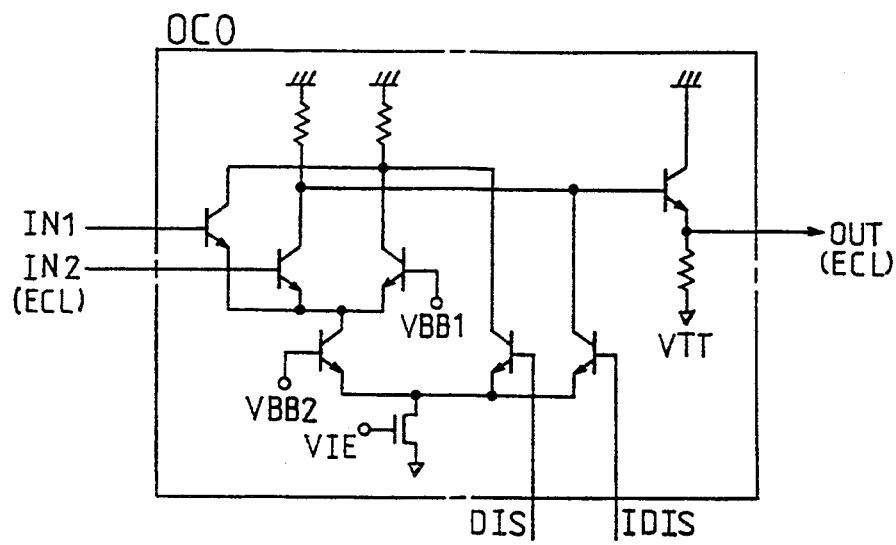
FIG. 8 is a circuit diagram of an output circuit cell contained in the input/output circuit cell units of FIG. 4.
Figure 9:
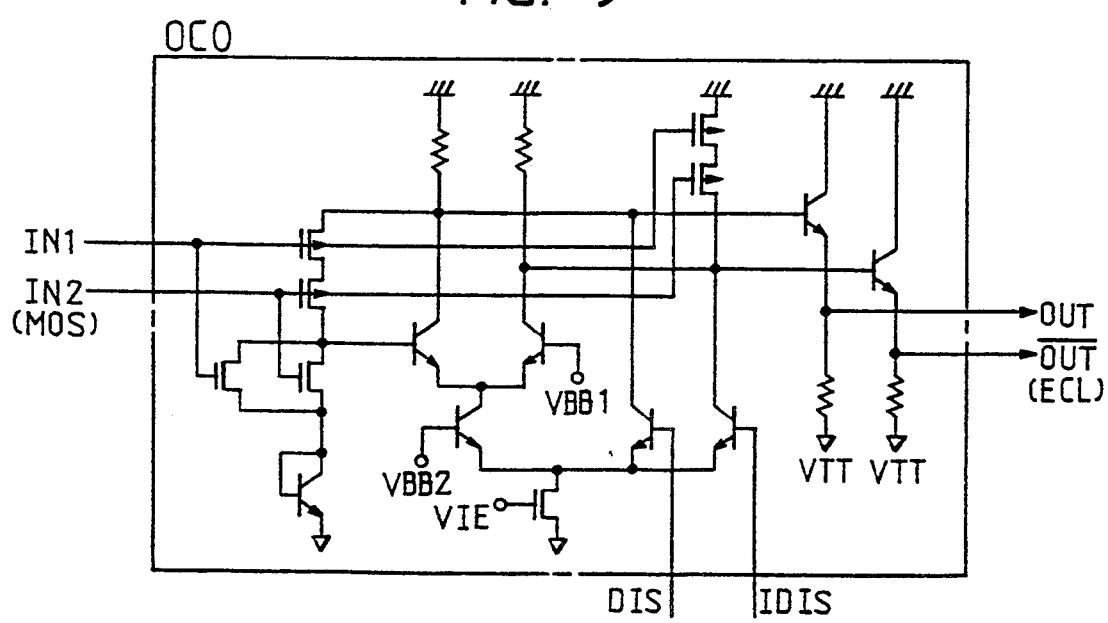
FIG. 9 is a circuit diagram of a variation of the output circuit cell contained in the input/output circuit cell of FIG. 4.

Output circuit cells:

FIG. 8 is a circuit diagram of the output circuit cell OC 0 contained in the input/output circuit cell units (IOCUs) of FIG. 4. FIG. 9 is a circuit diagram of a variation of the same output circuit cell.

As described, the signal output by the memory device with logic function to an outside device always takes on the ECL level, while the internal signal takes on either the ECL level or the MOS level as needed. Thus an internal signal at the ECL level may be transmitted as is to the outside, and an internal signal at the MOS level is changed to one at the ECL level before transmission to the outside. The input/output circuit cell section (I/O) of the memory device with logic function uses the output circuit cell of FIG. 8 when the internal signal to be output is on the ECL level, and uses the output circuit cell of FIG. 9 when the internal signal to be output is on the MOS level. In this embodiment, the output circuit cells of FIGS. 8 and 9 are incorporated into the same circuit when mounted on the base chip of the memory device with logic function. The configuration of this circuit is selectively determined by partially switching the photo mask of the metal wire layer.

The output circuit cell OC 0 of FIG. 8 constitutes, but is not limited to, a parallel setup with two bases comprising a pair of input transistors for receiving two ECL level input signals IN 1 and IN 2, the input transistors being coupled to another transistor to make up a differential setup, the latter transistor receiving a predetermined reference potential VBB 1 at its base. These transistors function as a current switching circuit using the reference potential VBB 1 as the logic threshold.

The three transistors constituting the differential circuit are connected via a transistor to the drain of the MOSFET making up a constant current source, the transistor receiving a predetermined reference potential VBB 2 at its base. The uninverted output node of the differential circuit is connected via a control transistor to the drain of the above-mentioned MOSFET, the control transistor receiving an internal control signal DIS at its base. The inverted output node of the differential circuit is connected via another control transistor to the drain of the above MOSFET, the control transistor receiving an internal control signal IDIS at its base. The inverted output signal of the differential circuit is forwarded past the output emitter follower circuit and goes out of the memory device with logic function as the output signal OUT of the output circuit cell OC 0 with its ECL level kept intact.

The differential circuit of the output circuit cell OC 0 is selectively activated when the two internal control signals DIS and IDIS are both Low. At this time, the output signal OUT of the output circuit cell OC 0 is selectively brought High on the ECL level when the input signals IN 1 and IN 2 are both Low. When the internal control signal IDIS is High, the output signal OUT of the output, circuit cell OC 0 is always Low regardless of the logic level of the input signals IN 1 and IN 2.

The output circuit cell OC 0 of FIG. 9 includes, and is not limited to, a CMOS NOR gate circuit and a differential circuit, the CMOS NOR gate circuit receiving the input signals IN 1 and IN 2 at the MOS level, the differential circuit receiving an inverted output signal from the CMOS NOR gate circuit. The uninverted output node of the differential circuit is connected via a control transistor to the drain of the MOSFET constituting a constant current source, the control transistor receiving the internal control signal DIS at its base. The uninverted output node is eventually connected to the uninverted output terminal OUT of the output circuit cell OC 0 via the corresponding output emitter follower circuit. Likewise, the inverted output node of the differential circuit is also connected via another control transistor to the drain of the above-mentioned MOSFET, the control transistor receiving the internal control signal IDIS at its base. The inverted output node is eventually connected to the inverted output terminal $\overline{\text{OUT}}$ of the output circuit cell OC 0 via the corresponding output emitter follower circuit.

The differential circuit of the output circuit cell OC 0 is selectively activated when the internal control signals DIS and IDIS are both Low. At this time, the uninverted output signal OUT of the output circuit cell OC 0 is selectively brought High on the ECL level when the input signal IN 1 or IN 2 is High on the MOS level. The inverted output signal $\overline{\text{OUT}}$ is a complementary signal of the above-mentioned uninverted output signal OUT. When the internal control signal DIS is High, the uninverted output signal OUT of the output circuit cell OC 0 is always Low regardless of the logic level of the input signals IN 1 and IN 2. Likewise, when the internal control signal IDIS is High, the inverted output signal $\overline{\text{OUT}}$ of the output circuit cell OC 0 is always Low regardless of the logic level of the input signals IN 1 and IN 2.

Gate array section:

As described, the memory device with logic function in this embodiment has the gate array section GA comprising about 1000 cell units (GCAs). These cell units are divided into six gate arrays GA 0–GA 5, each array being supplied with a predetermined complementary internal clock signal from the corresponding clock switching amplifier, as will be described later.

Figure 10:
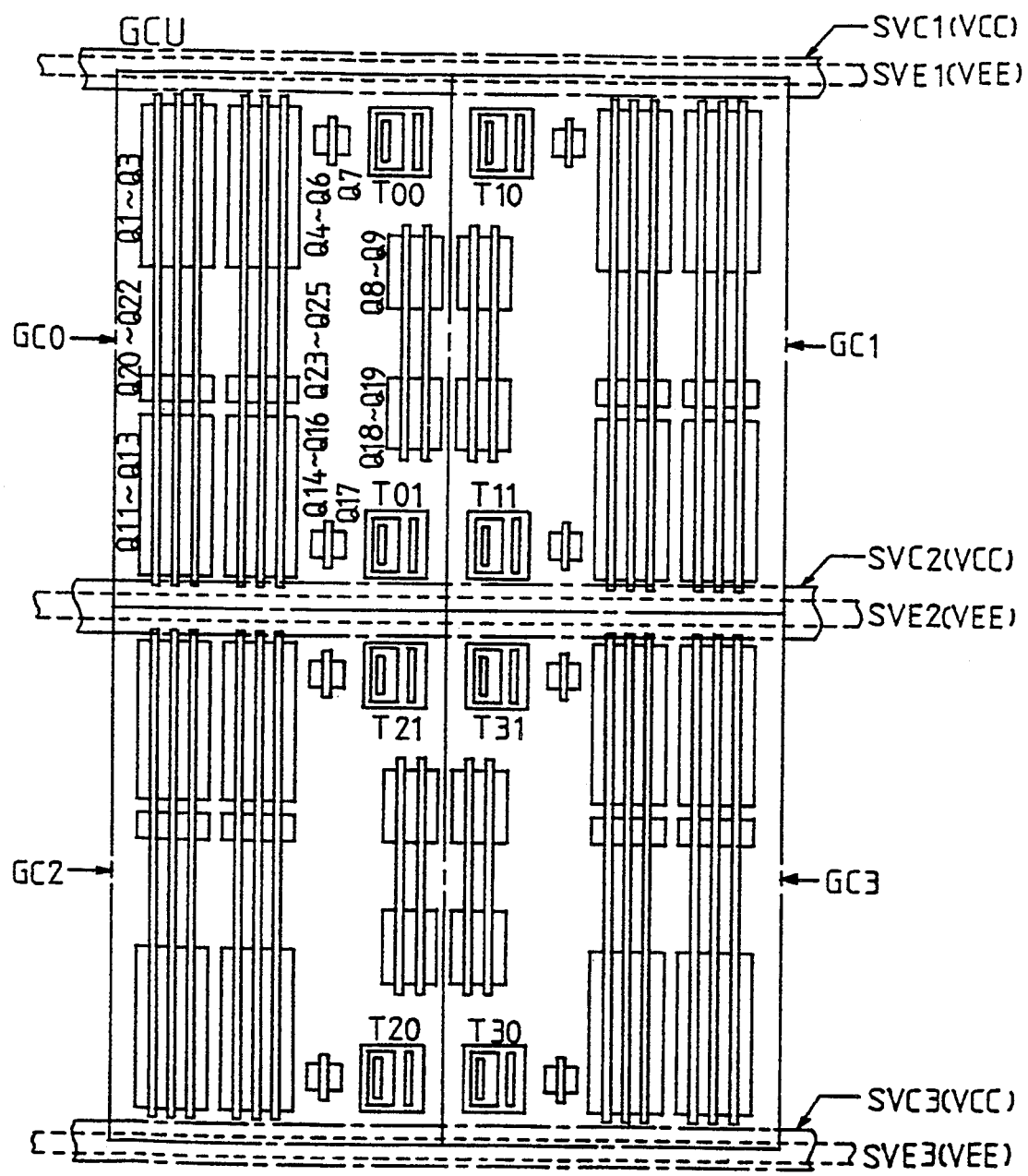
FIG. 10 is a layout view of a cell unit constituting the gate arrays of the memory device with logic function shown in FIG. 1.
Figure 11:
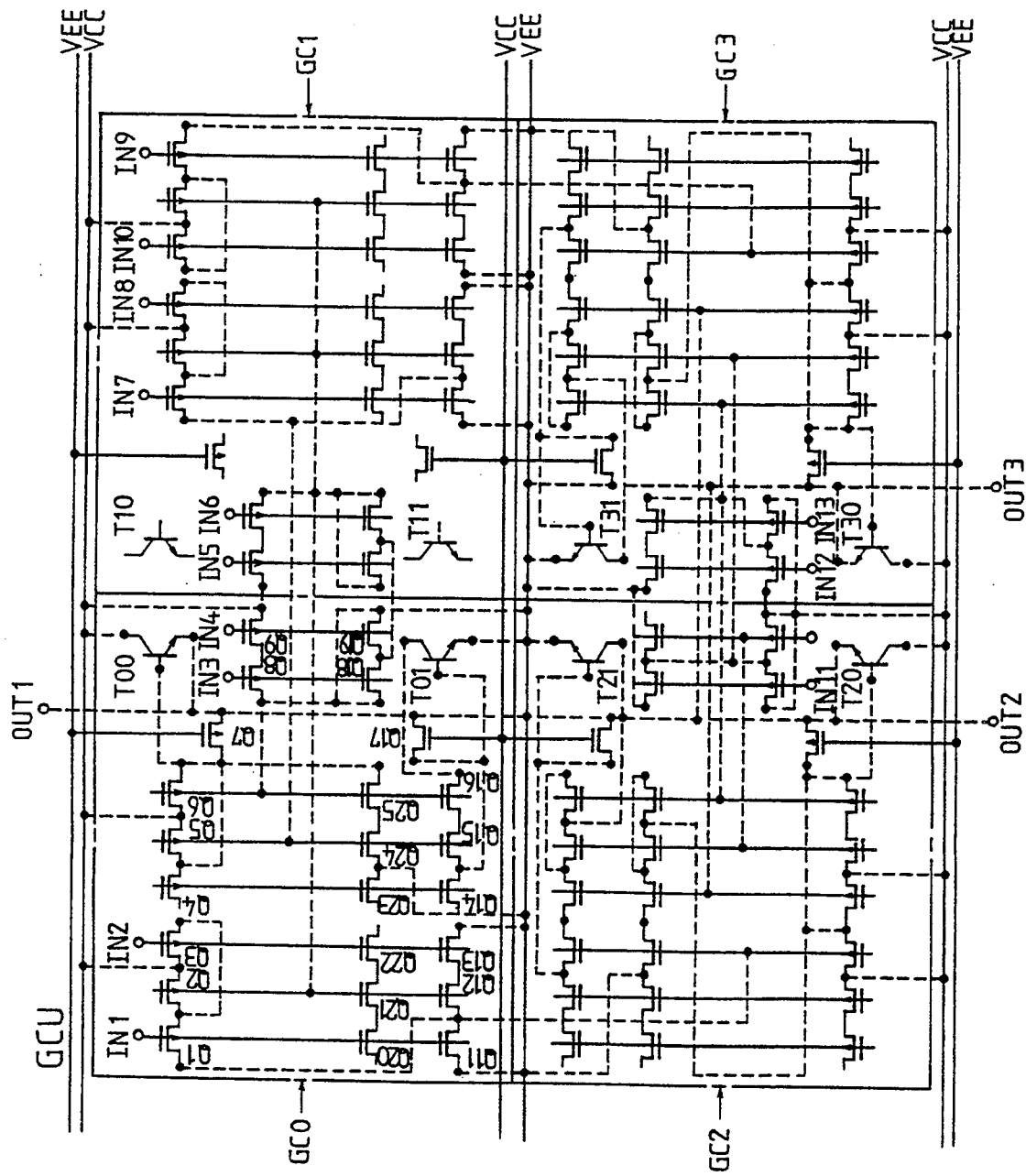
FIG. 11 is a block diagram of equivalent elements constituting the cell unit of FIG. 10.

Cell units and unit cells:

FIG. 10 is a layout view of the cell unit GCU constituting the gate arrays GA 0–GA 5 of the memory device with logic function shown in FIG. 1. FIG. 11 is a block diagram of equivalent elements constituting the cell unit GCU of FIG. 10.

In this embodiment, each of the cell units GCUs constituting the gate array section GA has, but is not limited to, the same circuit configuration involving four unit cells GC 0–GC 3 arranged as illustrated in FIG. 10.

The unit cells GC 0–GC 3 each comprise, and are not limited to, two transistors T 00 and T 01, nine P-channel MOSFETs Q 1–Q 9, and 15 N-channel MOSFETs Q 11–Q 25. As a result of this, each cell unit GCU comprises a total of eight transistors, 36 P-channel MOSFETs and 60 N-channel MOSFETs.

In the unit cells GC 0–GC 3 constituting each cell unit, the P-channel MOSFETs Q 1–Q 3 and N-channel MOSFETs Q 11–Q 13 and Q 20–Q 22 are interconnected via a polysilicon layer to make up a commonly connected gate arrangement but are not limited thereto; the P-channel MOSFETs Q 4–Q 6 and N-channel MOSFETs Q 14–Q 16 and Q 23–Q 25 are interconnected to make up another commonly connected gate arrangement; the P-channel MOSFETs Q 8–Q 9 and N-channel MOSFETs Q 18–Q 19 are interconnected to make up yet another commonly connected gate arrangement.

As shown in FIG. 1, the semiconductor substrate bearing the memory device with logic function in this embodiment has its gate array section GA longitudinally elongated. Accordingly, the above-described cell unit in actual size is also longitudinally elongated, with the corresponding length-and-breadth ratio maintained. This allows a large number of cell units to be effectively arranged in the gate array section GA.

Figure 12:
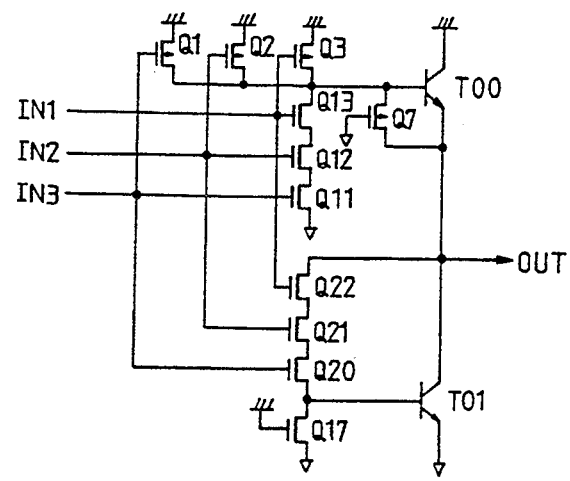
FIG. 12 is a circuit diagram of a NAND gate circuit comprising the cell unit of FIG. 10.
Figure 13:
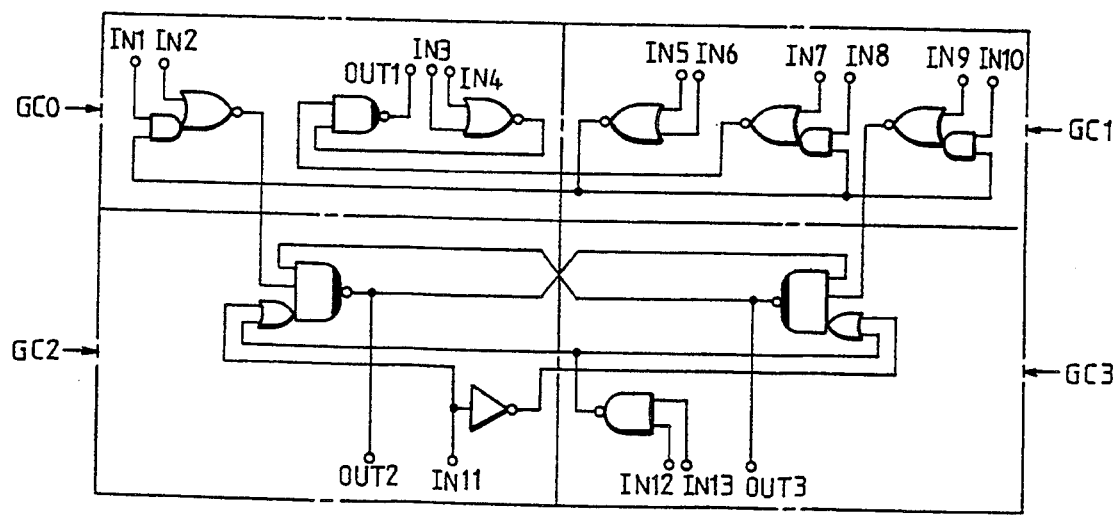
FIG. 13 is a circuit diagram of a latch circuit comprising the cell unit of FIG. 10.

Circuit examples constituted by gate arrays:

FIG. 12 is a circuit diagram of a bipolar CMOS NAND gate circuit comprising the unit cells or the cell unit of FIG. 10. FIG. 13 is a circuit diagram of a latch circuit comprising the unit cells or the cell unit of FIG. 10.

The unit cells GC 0–GC 3 of each cell unit are illustratively combined with the P-channel MOSFETs Q 1–Q 3 and Q 7, N-channel MOSFETs Q 11–Q 13, Q 17 and Q 20–Q 22, and transistors T 00 and T 01 to make up the three-input bipolar CMOS NAND gate circuit shown in FIG. 12. From the standpoint of the cell unit GCU as a whole, the MOSFETs and transistors of the unit cells GC 0–GC 3 are combined as depicted by broken lines in FIG. 11 to make up the latch circuit of FIG. 13. As described, each cell unit GCU of the gate array section GA comprises eight transistors, 36 P-channel MOSFETs and 60 N-channel MOSFETs, thus practically capable of constituting a total of 12 logic gate circuits. Therefore the gate array section GA has a total of 11K gates in practice.

On the base chip of the memory device with logic function, each terminal of the MOSFETs and transistors constituting each unit cell of the gate array section GA is left open as depicted in FIGS. 10 and 11. That is, each of these terminals has no connection attached thereto. The terminals are selectively connected using the photo mask of the metal wire layer to be produced based on the user's specifications. This arrangement allows a desired logic gate circuit, and hence a desired logic circuit, to be constructed. As a result, the gate array section GA is illustratively used to construct registers, selector circuits and various arithmetic circuits, the registers holding input and output data of the RAM macrocells.

As indicated, the cell unit in the gate array section GA of the memory device with logic function is produced in a bipolar CMOS arrangement. This allows the gate array section GA to keep operating at high speed while reducing its power dissipation and increasing the scale of circuit integration. With the total number of gates in the gate array section GA set to at least 4000, an appreciable number of logic circuits are incorporated into the memory device with logic function. This provides a benefit of optimizing the sharing of functions with the buffer storage of computers or the like. Other benefits include reduction of the number of chip-to-chip lines and a sufficiently high level of production yield for the memory device with logic function.

RAM macrocells:

As described, the memory device with logic function in this embodiment has eight RAM macrocells (RAM 0–RAM 7). These RAM macrocells comprise bipolar CMOS RAMs as their basic components, each having a memory capacity of 24 bits×2048 words. The eight RAM macrocells are constituted by four pairs of RAMs, i.e., RAM 0 paired with RAM 1, RAM 2 with RAM 3, RAM 4 with RAM 5, and RAM 6 with RAM 7, a functional part of each pair being shared by all other RAMs. Below is a description of how the RAM macrocell of this embodiment is constructed, how it operates and what it offers as its features with reference to RAM 0 as an example. The corresponding information about the other RAM macrocells will be inferred from the description of RAM 0.

Figure 14:
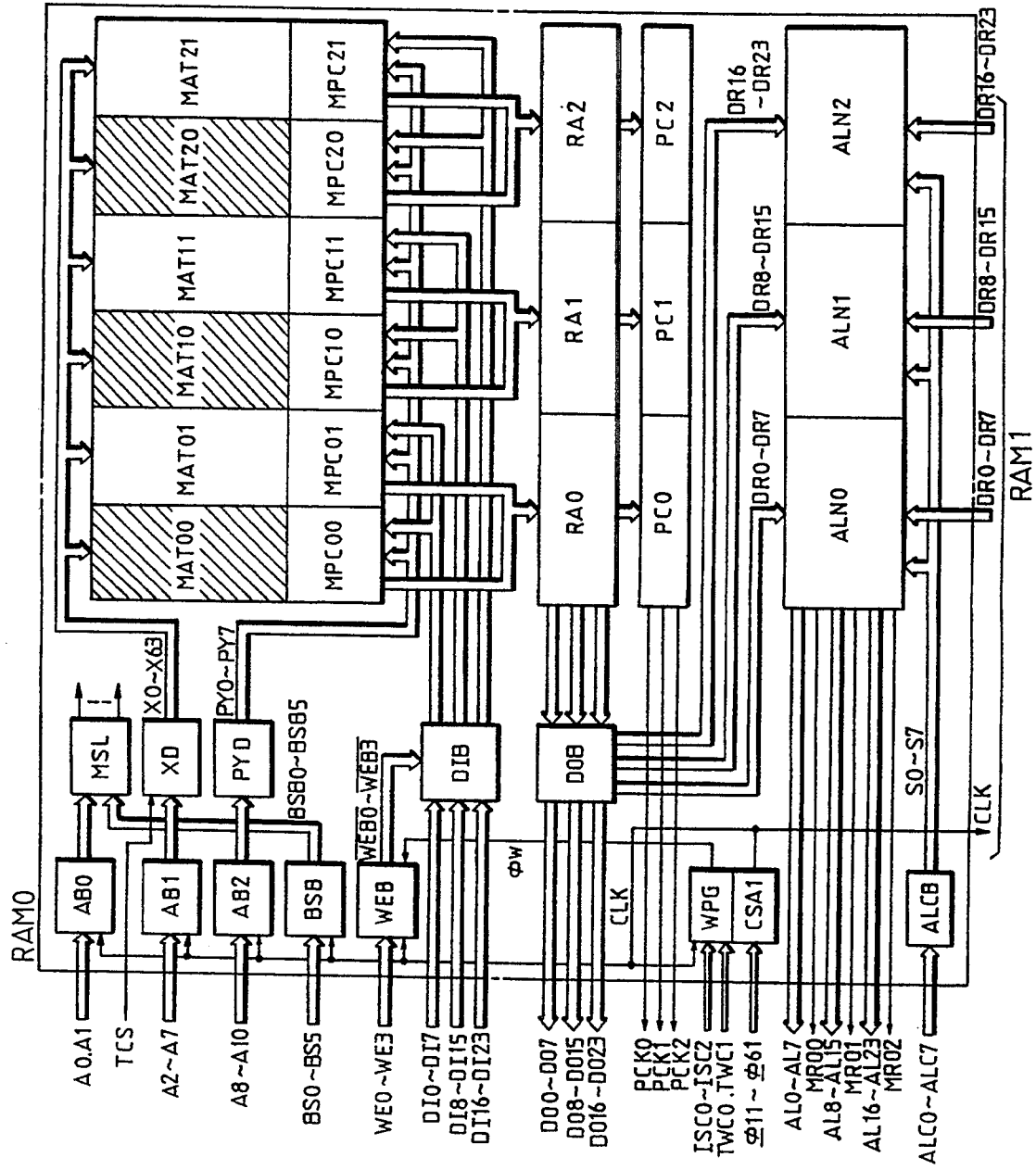
FIG. 14 is a block diagram of a RAM macrocell of the memory device with logic function shown in FIG. 1.
Figure 15:
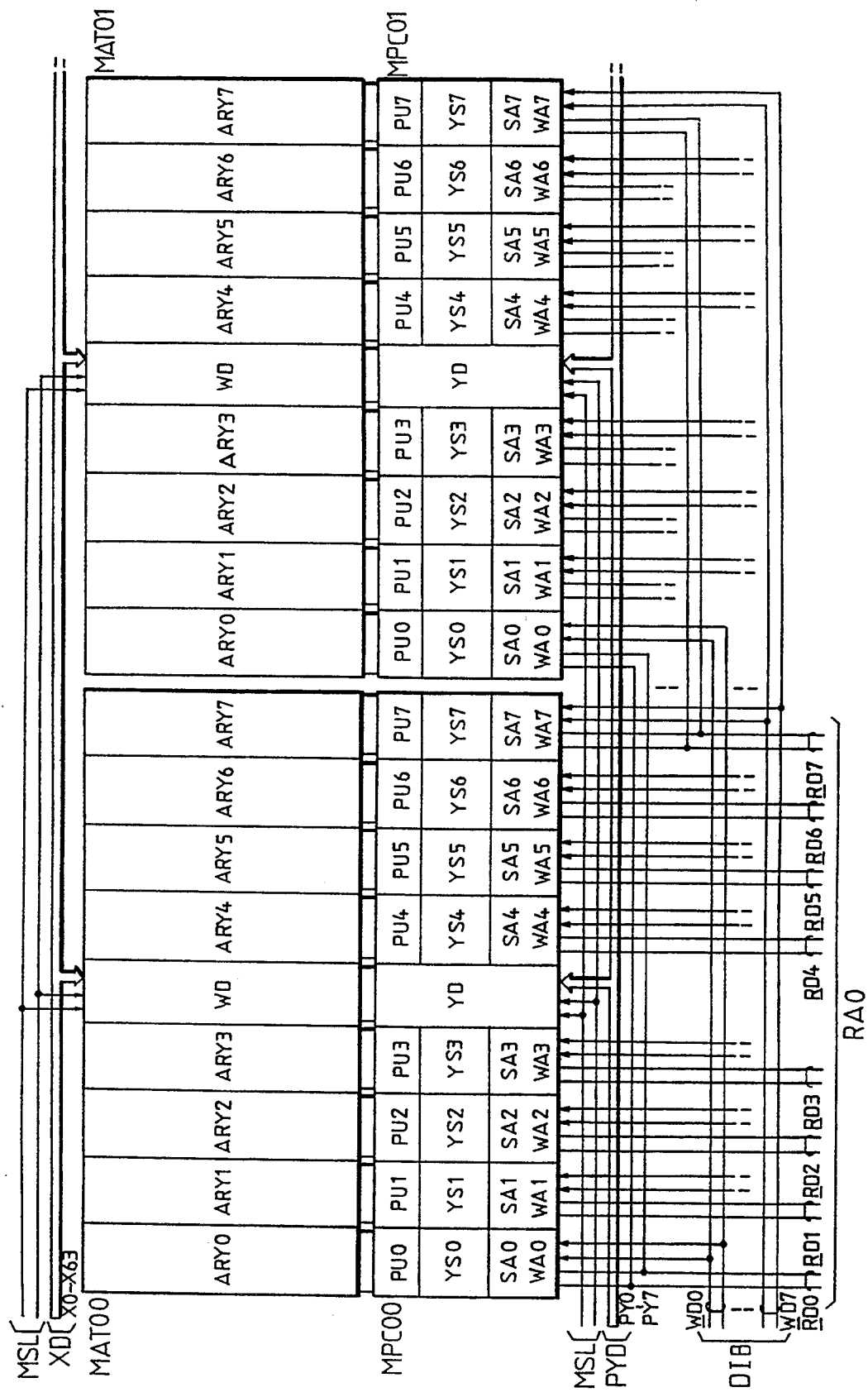
FIG. 15 is a partial block diagram of a memory mat and its peripheral circuits contained in the RAM macrocell of FIG. 14.
Figure 16:
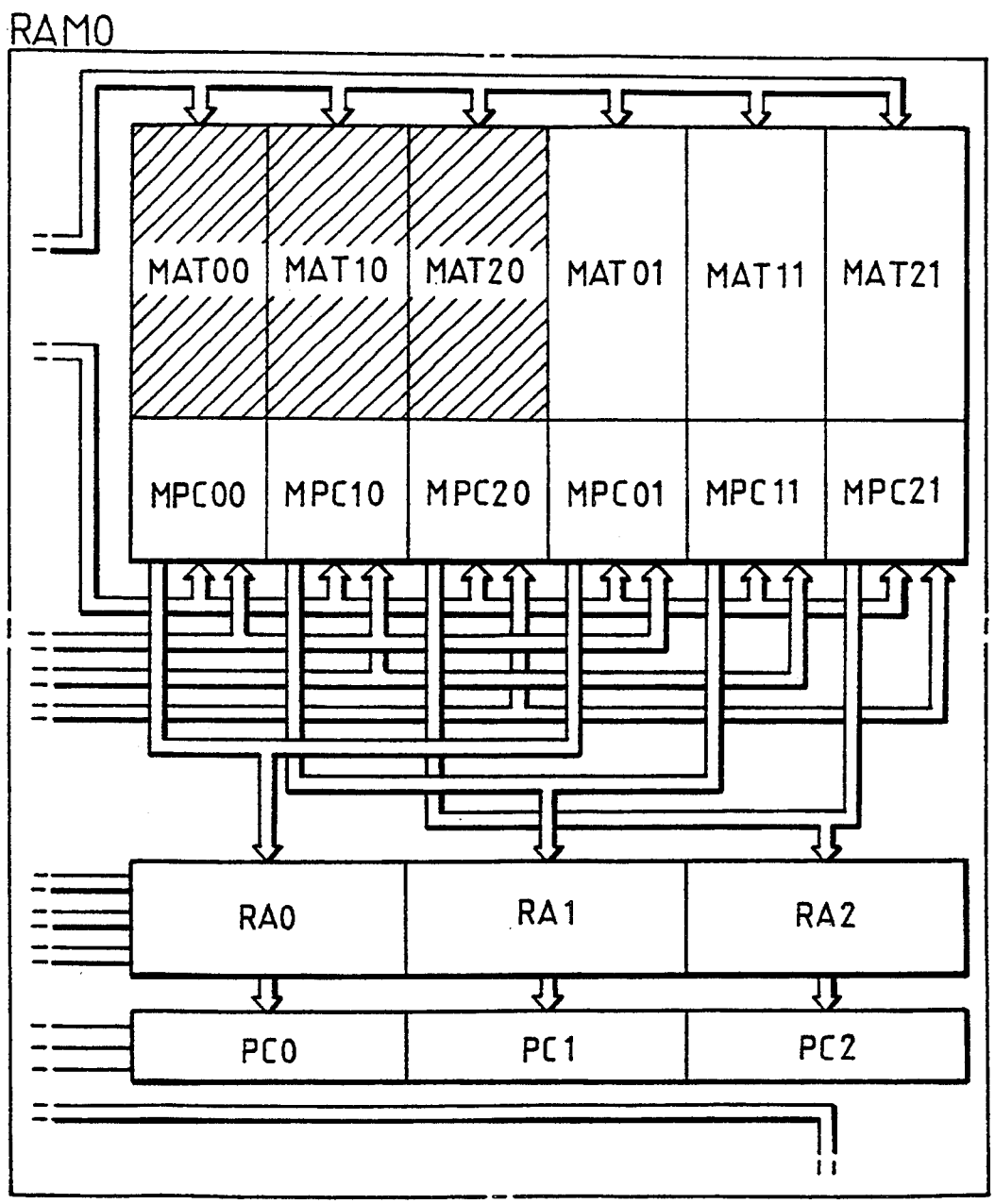
FIG. 16 is a block diagram of a prior art memory device with logic function previously developed by the inventors of the present invention.

Block construction of the RAM macrocell:

FIG. 14 is a block diagram of a RAM macrocell (i.e., RAM 0) of the memory device with logic function shown in FIG. 1. This is a typical block construction of the RAM macrocell (semiconductor memory device) practiced according to the invention. FIG. 15 is a partial block diagram of a memory mat and its peripheral circuits illustratively practiced in the RAM macrocell of FIG. 14. FIG. 16 is a block diagram of a prior art memory device with logic function previously developed by the inventors of the present invention.

In FIG. 14, the RAM macrocell comprises, and is not limited to, six memory mats MAT 00–MAT 20 and MAT 01–MAT 21, and six mat peripheral circuits MPC 00–MPC 20 and MPC 01–MPC 21 corresponding thereto. The memory mats are arranged in the direction of word line extensions. As will be described later, the memory mats and their peripheral circuits are divided into pairs of adjacent mats and circuits, each pair corresponding to three read amplifiers RA 0–RA 2, three parity check circuits PC 0–PC 2 and three aligners ALN 0–ALN 2.

In this embodiment, the memory mats MAT 00–MAT 20 and MAT 01–MAT 21 each have a memory capacity of 8 bits×1024 words, as will be described later. These memory mats are activated in, but not limited by, units of three at a time, one from each of the three pairs, i.e., MAT 00–MAT 20 or MAT 01–MAT 21 activated concurrently as indicated by shades in FIG. 14. This allows each RAM macrocell to possess a total memory capacity of 24 bits×2048 words. The address space of the RAM macrocell is alternatively determined, but not limited, by an 11-bit address signal A 0–A 10. The data to be written to the address space is given as 24-bit input data DI 0–DI 23 to the RAM macrocell; the data to be read from the address space is output as 24-bit output data DO 0–DO 23 from the RAM macrocell. In the RAM macrocell, the 24-bit read or write data is processed in units of, but not limited by, eight bits or one byte.

The 24-bit data to be concurrently written and read to and from the RAM macrocell is selected in units of four bits by each of six blocks, and is alternatively specified by six-bit block selection signals BS 0–BS 5. When the RAM macrocell is in write mode, the four bits constituting each block are alternatively specified by four-bit write enable signals WE 0–WE 3. This permits alternative storage data update of the 24 bits that are selected concurrently.

The memory mats MAT 00–MAT 20 and MAT 01–MAT 21 each have eight memory arrays ARY 0–ARY 7, four on each side of a word line driving circuit WD, as typically shown in the memory mats MAT 00–MAT 01 of FIG. 15. The blocks for the data to be stored in are arranged so as to correspond to four memory arrays located on the left or right side of the three memory mats that are concurrently activated. Of these memory arrays, one array is selectively activated by the write enable signals WE 0–WE 3. The word line driving circuit WD of each memory mat is supplied with, but not limited by, a memory mat and memory array upper/lower selection signal from a mat selector circuit MSL and a word line selection signal from an X address decoder XD.

Each of the eight memory arrays ARY 0–ARY 7 making up each memory mat contains, and is not limited to, 128 word lines which are arranged in parallel and alternatively selected and eight pairs of complementary data lines which are arranged perpendicularly and alternatively selected, as shown in FIG. 15. This arrangement provides a memory capacity of 1 bit×1024 words. In this embodiment, 128 word lines constituting each memory array are divided into, but not limited by, an upper and a lower half of 64 lines each. Either the upper half or the lower is selectively specified by the memory array upper/lower selection signal mentioned above.

The memory mat peripheral circuits MPC 00–MPC 20 and MPC 01–MPC 21 each have one Y address decoder YD, eight pull-up circuits PU 0–PU 7, eight Y switching circuits YS 0–YS 7, eight sense amplifiers SA 0–SA 7 and eight write amplifiers WA 0–WA 7, the eight circuits in each of the four groups corresponding to the eight memory arrays constituting each memory mat, as typically depicted in the memory mat peripheral circuits MPC 00 and MPC 01 of FIG. 15. The Y address decoder YD is supplied with, but not limited by, the appropriate memory mat or memory array selection signal from the mat selector circuit MSL and predecode signals PY 0–PY 7 from a Y predecoder PYD. The write amplifiers WA 0–WA 7 are supplied with corresponding complementary write signals $\overline{WD}$ 0–$\overline{WD}$ 7 from a data input buffer DIB (complementary write signal $\overline{WD}$ 0 generically represents both uninverted write signal WD 0 and inverted write signal $\overline{WD\ 0}$; the same holds for notations of complementary signals and complementary signal lines hereinafter). The output currents, i.e., the sense currents of the sense amplifiers SA 0–SA 7 are transmitted as complementary read signals $\overline{RD}$ 0–$\overline{RD}$ 7 to the corresponding read amplifiers $\overline{RA}$ 0–$\overline{RA}$ 7.

Specific constructions, overall operations and features of the components making up the memory mat peripheral circuits MPC 00–MPC 20 and MPC 01–MPC 21 will be discussed later in detail.

In the memory device with logic function of this embodiment, as described, three of the six memory mats constituting each RAM macrocell are selectively and concurrently activated. The pairs of the memory mats sharing a read amplifier each are arranged side by side. As a result, the average length of lines interconnecting the paired memory mats and the memory mat peripheral circuits is shortened. This drastically reduces the circuit layout area required.

Most of the input and output signals to and from the memory device with logic function take on the MOS level with the exception of complementary internal clock signals $\phi 11$–$\phi 61$. Of 11-bit address signals A 0–A 10, the high-order two bits, signals A 0 and A 1, are transmitted to, but not limited by, the mat selector circuit MSL via an address buffer AB 0 for memory mat selection or for memory array upper/lower selection. The low-order three bits, address signals A 8–A 10, are transmitted to the Y predecoder PYD via an address buffer AB 2 for selecting eight pairs of complementary data lines of each memory array. The remaining six bits, address signals A 2–A 7, are transmitted to the X address decoder XD via an address buffer AB 1 for selecting the 64 word lines of the upper or lower half of the memory arrays.

Likewise, the block selection signals BS 0–BS 5 are transmitted to, but not limited by, the above-mentioned mat selector circuit MSL via a block selection signal buffer BSB for memory mat selection as well as for memory array left- or right-hand half section. The write enable signals WE 0–WE 3 are transmitted to the data input buffer DIB via a write enable signal buffer WEB for write control. In addition, the input data DI 0–DI 23 is supplied via the data input buffer DIB to the write amplifiers of the corresponding memory mat peripheral circuits MPC 0–MPC 20 and MPC 01–MPC 21.

Meanwhile, a read signal is read from a selected memory cell of the memory mats MAT 00–MAT 20 and MAT 01–MAT 21 via the corresponding memory mat peripheral circuit. After being amplified by the corresponding read amplifiers RA 0–RA 2, the read signal is transmitted, with its ECL level unchanged, to the corresponding parity check circuits PC 0–PC 2 as well as to a data output buffer DOB.

The parity check circuits PC 0–PC 2, comprising ECL circuits, check each read signal for parity in units of eight bits, the signal coming from the corresponding read amplifiers RA 0–RA 2. The output signal of the parity check circuits PC 0–PC 2 is internally converted to an MOS level signal before being output as parity signals PCK 0–PCK 2.

The data output buffer DOB converts to an MOS level signal each read signal fed by the read amplifiers RA 0–RA 2, outputs the converted signal as output data DO 0–DO 23, and supplies the signal as internal output data DR 0–DR 23 to the corresponding aligners ALN 0–ALN 2 (sequence control circuit).

The aligners ALN 0–ALN 2 are shared but not limited by another RAM macrocell (RAM 1) paired with RAM 0, and receive similar 24-bit internal output data DR 0–DR 23 from RAM 1. The aligners ALN 0–ALN 2 select, or change the sequence of, a total of 48 bits of read data in units of bytes in accordance with eight-bit aligner control signals ALC 0–ALC 7, i.e., selection signals S 0–S 7, supplied via an aligner control signal buffer ALCB. In this embodiment, the aligners ALN 0–ALN 2 have a diagnostic latch circuit that admits the read data selected in accordance with the aligner control signal for the so-called scan-out when the memory device with logic function enters a predetermined diagnostic mode. The read data, when placed under sequence control by the aligners ALN 0–ALN 2, is output as aligner output signals AL 0–AL 23. The output signal of the diagnostic latch circuit is output as scan-out signals MR 00–MR 02.

The RAM macrocell is further provided with a clock switching amplifier CSA 1 and a write pulse generation circuit WPG. The clock switching amplifier CSA 1 is shared but not limited by the other RAM macrocell (RAM 1) being paired. Based on complementary internal clock signals $\phi 11$–$\phi 61$ transmitted via a clock distribution circuit CDA, the clock switching amplifier CSA 1 generates a predetermined clock signal CLK and supplies it to the various parts of the RAM macrocell.

The write pulse generation circuit WPG generates, but is not limited to, a predetermined write pulse signal $\phi w$ in accordance with the clock signal CLK from the clock switching amplifier CSA 1. The write pulse signal is supplied to the write enable signal buffer WEB. In this embodiment, the time required to set up the write pulse signal $\phi w$ is selectively switched according to internal control signals ISC 0–ISC 2. The pulse width is also selectively switched in accordance with internal control signals TWC 0–TWC 1.

Figure 17:
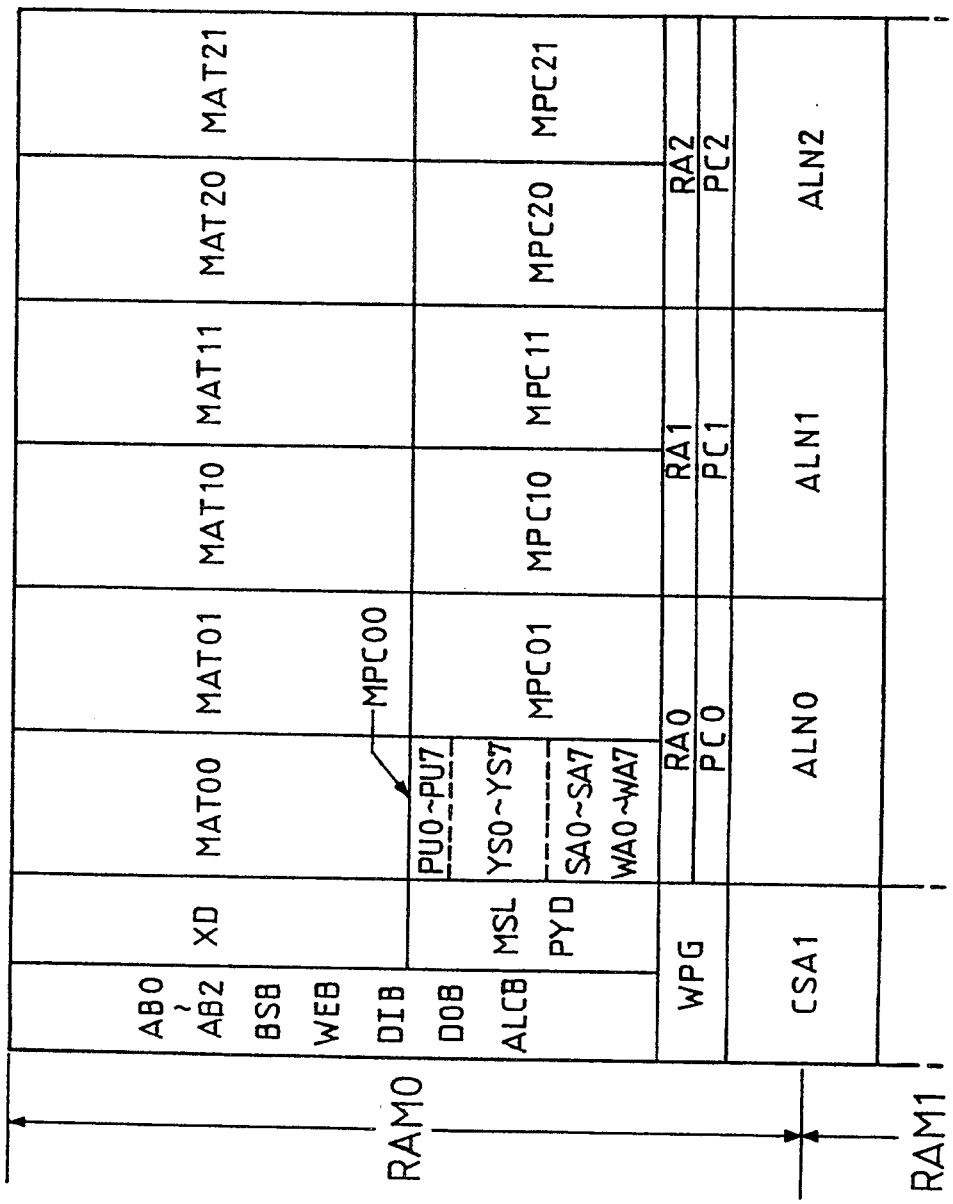
FIG. 17 is a layout view of a variation of the RAM macrocell shown in FIG. 14.

Layout of RAM macrocell:

FIG. 17 is a layout view of a variation of the RAM macrocell RAM 0 shown in FIG. 14. The other RAM macrocells RAM 1–RAM 7 are arranged in, but not limited by, a vertically or horizontally symmetrical pattern around RAM 0.

In FIG. 17, the six memory mats MAT 00–MAT 20 and MAT 01–MAT 21 constituting the RAM macrocell are arranged in, but not limited by, a pattern corresponding to the block construction of FIG. 14. On the left-hand side, i.e., inside of the semiconductor substrate, is the X address decoder XD. Under these memory mats are the corresponding memory mat peripheral circuits MPC 00–MPC 20 and MPC 01–MPC 21. To the left are the mat selector circuit MSL and Y predecoder PYD. As typically shown in the memory mat peripheral circuit MPC 00, the pull-up circuits PU 0–PU 7 are located closest to their corresponding memory mat. Under the pull-up circuits are Y switching circuits YS 0–YS 7, the sense amplifiers SA 0–SA and the write amplifiers WA 0–WA 7, in that order. In the prior art memory device with logic function invented by the inventors of the present invention, the pull-up circuits PU 0–PU 7 are located above the memory mat corresponding thereto. In this embodiment, as described, the pull-up circuits PU 0–PU 7 are located under the corresponding memory mat, i.e., between the sense and write amplifiers associated with the memory array that includes the complementary data lines. This arrangement enhances the speed of the pull-up operation on the complementary data lines by the pull-up circuits.

Under the paired memory mat and memory mat peripheral circuit, the read amplifiers RA 0–RA 2 and parity check circuits PC 0–PC 2 corresponding thereto are located. Between RAM 0 and the paired RAM macrocell (RAM 1) are the aligners ALN 0–ALN 2 shared thereby. To the left of the X address decoder XD, mat selector circuit MSL and Y predecoder PYD are the address buffers AB 0–AB 2, block selection signal buffer BSB, write enable signal buffer WEB, data input buffer DIB, data output buffer DOB, and aligner control signal buffer ALCB. Under these buffers is the write pulse generation circuit WPG. Between RAM 0 and the paired RAM macrocell (RAM 1) is the clock switching amplifier CSA 1 shared thereby.

Figure 18:
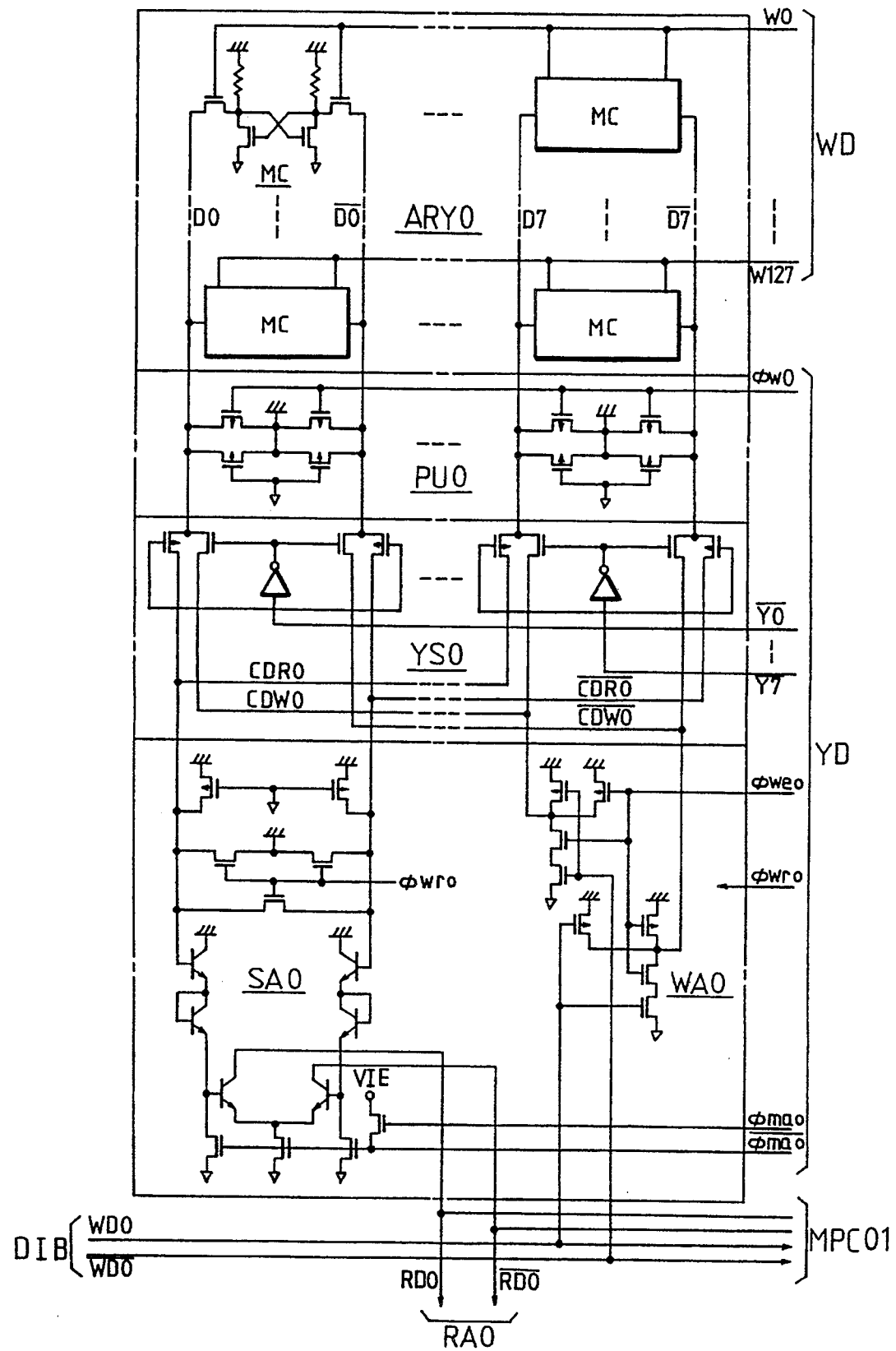
FIG. 18 is a partial circuit diagram of memory mats and their peripheral circuits contained in the RAM macrocell of FIG. 14.
Figure 24:
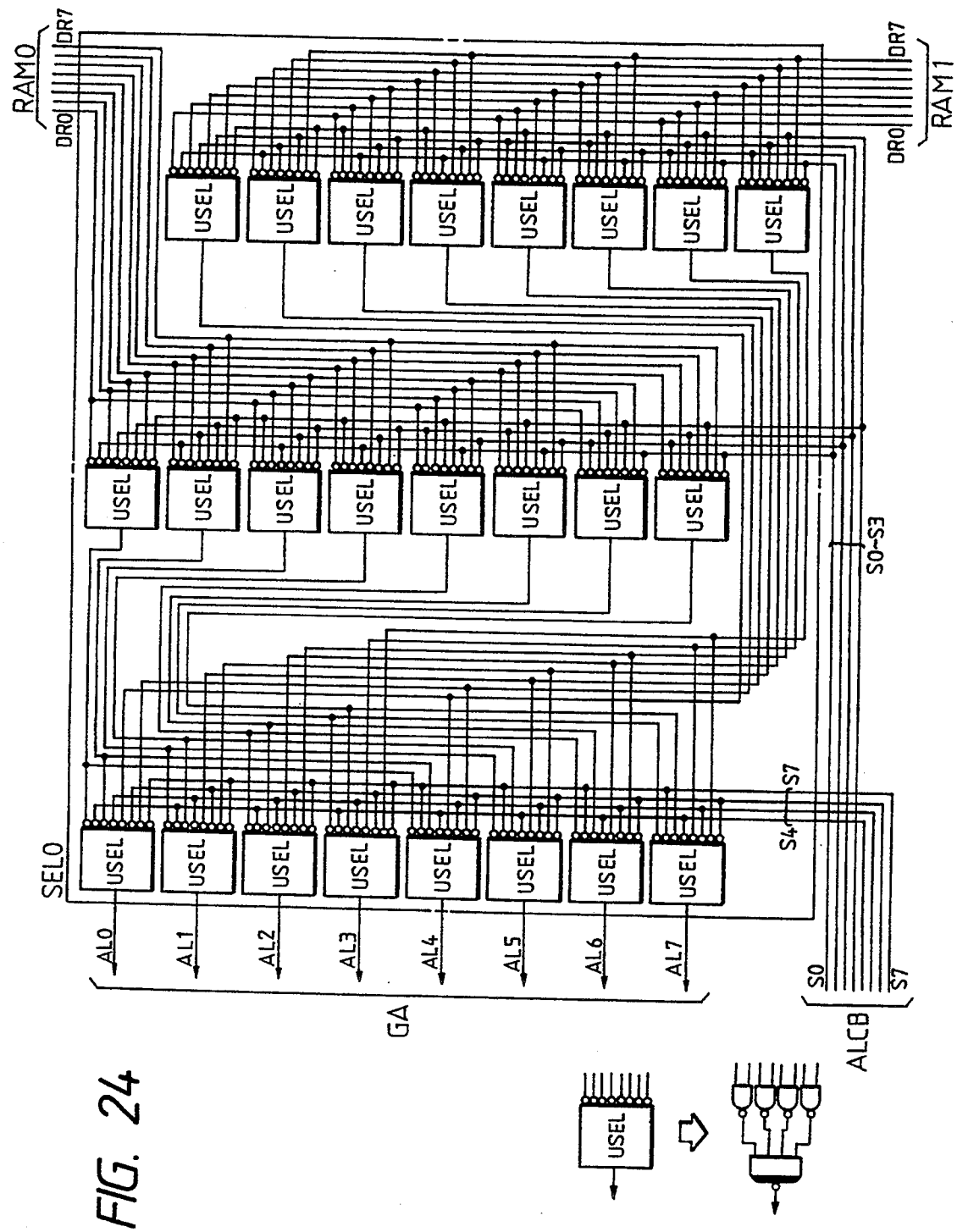
FIG. 24 is a circuit diagram of a selector circuit contained in the aligner of FIG. 23.

Memory arrays and their peripheral circuits:

FIG. 18 is a partial circuit diagram showing part of the memory mats MAT 00–MAT 20 and MAT 01–MAT 21 and their peripheral circuits MPC 00–MPC 20 and MPC 01–MPC 21 illustratively practiced in the RAM macrocell of FIG. 24. This figure illustrates the memory array ARY 0 contained in the memory mat MAT 00, as well as the pull-up circuit PU 0, Y switching circuit YS 0, sense amplifier SA 0 and write amplifier WA 0 constituting the memory mat peripheral circuit MPC 00. The same circuit configuration holds for the other memory arrays, pull-up circuits, Y switching circuits, sense amplifiers and write amplifiers making up the memory mat and its peripheral circuit, for the other memory mats MAT 10–MAT 20 and MAT 01–MAT 21, and for the memory mat peripheral circuits MPC 10–MPC 20 and MPC 01–MPC 21. With reference to FIG. 18, there will now be described specific circuit constructions, overall operations and features of the memory mats and memory mat peripheral circuits of the RAM macrocell in this embodiment.

In FIG. 18, the memory array ARY 0 of the memory mat MAT 00 comprises, and is not limited to, 128 word lines W 0–W 127 and eight complementary data lines $\underline{D}$ 0–$\underline{D}$ 7 which are vertically arranged. At the intersection points formed by these word lines and complementary data lines are 1024 (i.e., 128×8) high-resistance load type static memory cells MCs in a grid pattern.

The word lines W 0–W 127 constituting the memory array ARY 0 are connected to the word line driving circuit WD via three memory arrays ARY 1–ARY 3. In this embodiment, as described, the word line driving circuit WD is shared by eight memory arrays ARY 0–ARY 7. The word lines W 0–W 127, shared by these memory arrays, are so located as to "skewer" these arrays. Furthermore, the word lines W 0–W 127 are divided into two groups, the upper and the lower half each comprising 64 lines for each memory array, as described. The two groups of word lines are selectively activated in accordance with the memory array upper/lower selection signal coming from the mat selector circuit MSL. The word line driving circuit WD alternatively brings half of the word lines W 0–W 127 High by combining word line selection signals X 0–X 63 from the X address decoder XD and the above-mentioned memory array upper/lower selection signal.

The complementary data lines $\underline{D}$ 0–$\underline{D}$ 7 constituting the memory array ARY 0 are connected to, but not limited by, the corresponding Y switching circuit YS 0 via the pull-up circuit PU 0 associated with the memory mat peripheral circuit MPC 00.

The pull-up circuit PU 0 of the memory mat peripheral circuit MPC 00 includes, and is not limited to, 16 pairs of P-channel MOSFETs, two pairs being located between uninverted/inverted signal lines and circuit ground potential for each of the complementary data lines $\underline{D}$ 0–$\underline{D}$ 7 constituting the memory array ARY 0. One side of the P-channel MOSFETs being paired is designed to have a relatively large conductance, the gates thereof being commonly connected to a timing signal $\phi$w 0 that is selectively brought High when the RAM macrocell is placed in write mode. The other side of the P-channel MOSFETs being paired is designed to have a relatively small conductance, the gates thereof being connected to the circuit supply voltage.

When the RAM macrocell is placed in write mode and the timing signal $\phi$w 0 is brought Low, two pairs of P-channel MOSFETs are simultaneously turned on in each unit circuit of the pull-up circuit PU 0. This causes the complementary data lines $\underline{D}$ 0–$\underline{D}$ 7 of the memory array ARY 0 to be supplied with a relatively high bias voltage, thereby suppressing the incidence of soft errors attributable to alpha rays. On the other hand, when the RAM macrocell is placed in write mode and the timing signal $\phi$w 0 is brought High, only those pairs of P-channel MOSFETs having the relatively small conductance are turned on in the pull-up circuit PU 0. Thus the complementary data lines $\underline{D}$ 0–$\underline{D}$ 7 of the memory array ARY 0 are supplied with the relatively low bias voltage, whereby a sufficient write signal amplitude is obtained.

As described, the pull-up circuit PU 0 is located between the complementary data lines $\underline{D}$ 0–$\underline{D}$ 7 constituting the memory array ARY 0 on the one hand, and the Y switching circuit YS 0 on the other, i.e., between the corresponding sense amplifier SA 0 and write amplifier WA 0. This arrangement boosts the speed of the pull-up operation and enhances the effect thereof.

The Y switching circuit YS 0 includes eight pairs of P-channel MOSFETs and eight pairs of N-channel MOSFETs installed in conjunction with the complementary data lines $\underline{D}$ 0–$\underline{D}$ 7 of the memory array ARY 0. One side of the $\overline{P}$- and N-channel MOSFETs being paired and constituting the Y switching circuit YS 0 is commonly connected to the uninverted or inverted signal lines of the corresponding complementary data lines $\underline{D}$ 0–$\underline{D}$ 7. The other side of the P-channel MOSFETs being paired is commonly connected to the uninverted or inverted signal line of a read complementary common data line CDR 0. The other side of the N-channel MOSFETs being paired is commonly connected to the uninverted or inverted signal of a write complementary common data line CDW 0. The gates of the paired P-channel MOSFETs are commonly connected and supplied with the corresponding inverted data line selection signals $\overline{Y}$ 0–$\overline{Y}$ 7 coming from the Y address decoder YD. Likewise, the gates of the paired N-channel MOSFETs are connected and supplied with an inverted signal from a CMOS inverter circuit using the inverted data line selection signals $\overline{Y}$ 0–$\overline{Y}$ 7.

Each pair of P- and N-channel MOSFETs constituting the Y switching circuit YS 0 is turned on selectively and simultaneously when the corresponding inverted data line selection signals $\overline{Y}$ 0–$\overline{Y}$ 7 are alternatively brought Low. As a result of this, the corresponding group of complementary data lines $\underline{D}$ 0–$\underline{D}$ 7 of the memory array ARY 0 is connected to the sense amplifier SA 0 via the read complementary common data line CDR 0, and to the write amplifier WA 0 via the write complementary common data line CDW 0.

The sense amplifier SA 0 includes, and is not limited to, a differential circuit comprising a pair of transistors. The bases of these transistors are connected to the uninverted or inverted signal line of the read complementary common data line CDR 0 via a suitable level shift circuit. The commonly connected emitters of these transistors are connected to the circuit ground potential via a constant current source that is selectively activated in accordance with an inverted timing signal $\overline{\phi ma}$ 0. The collectors of the transistors making up the differential circuit are connected to the complementary read signal line RD 0 and to the corresponding read amplifier RA 0. The complementary read signal line RD 0 is commonly connected to the outpost terminal of the corresponding sense amplifier SA 0 of the memory mat peripheral circuit MPC 01 being paired.

Furthermore, the sense amplifier SA 0 comprises P-channel MOSFETs and a pre-charge circuit. The P-channel MOSFETs are installed between the uninverted and inverted signal lines of the read complementary common data line CDR 0 on the one hand, and the circuit ground potential on the other. The pre-charge circuit is located between the uninverted and inverted signal lines and is selectively turned on in accordance with a timing signal $\phi$wr 0.

In the setup described above, a read signal is transmitted from a selected memory cell MC of the memory array ARY 0 via the corresponding complementary data lines $\underline{D}$ 0–$\underline{D}$ 7 as well as the read complementary common data line CDR 0. The read signal is converted to a comparable current signal by the collectors of the transistors constituting the differential circuit of the sense amplifier SA 0. The converted signal is then transmitted to the read amplifier RA 0. At this time, the sense amplifier SA 0 is selectively activated in accordance with the timing signal $\phi$ma 0, i.e., the mat selection signal mentioned earlier. This causes the write amplifier WA 0 of the paired memory mat MPC 00 or MPC 01 to be alternatively activated.

The write amplifier WA 0 includes, and is not limited to, a pair of two-input NAND gate circuits comprising CMOSs. The input terminals on one side of these NAND gates are commonly supplied with a corresponding timing signal $\phi$we 0 from the Y address decoder YD. The input terminals on the other side of the NAND gates are supplied with the inverted write signal $\overline{WD\ 0}$ or the uninverted write signal WD 0 from the data input buffer DIB. The output terminals of the NAND gates are connected to the uninverted and inverted signal lines of the write complementary common data line CDW 0.

In the above setup, the complementary write signal transmitted via the data input buffer DIB is supplied to the selected memory cell MC of the memory array ARY 0 via the write complementary common data line CDW 0 to carry out a write operation. At this time, the write amplifier WA 0 is selectively activated in accordance with the timing signal $\phi$we 0, i.e., the mat selection signal. This in turn causes the write amplifier WA 0 of the paired memory mats MPC 00 and MPC 01 to be selectively activated.

Figure 19:
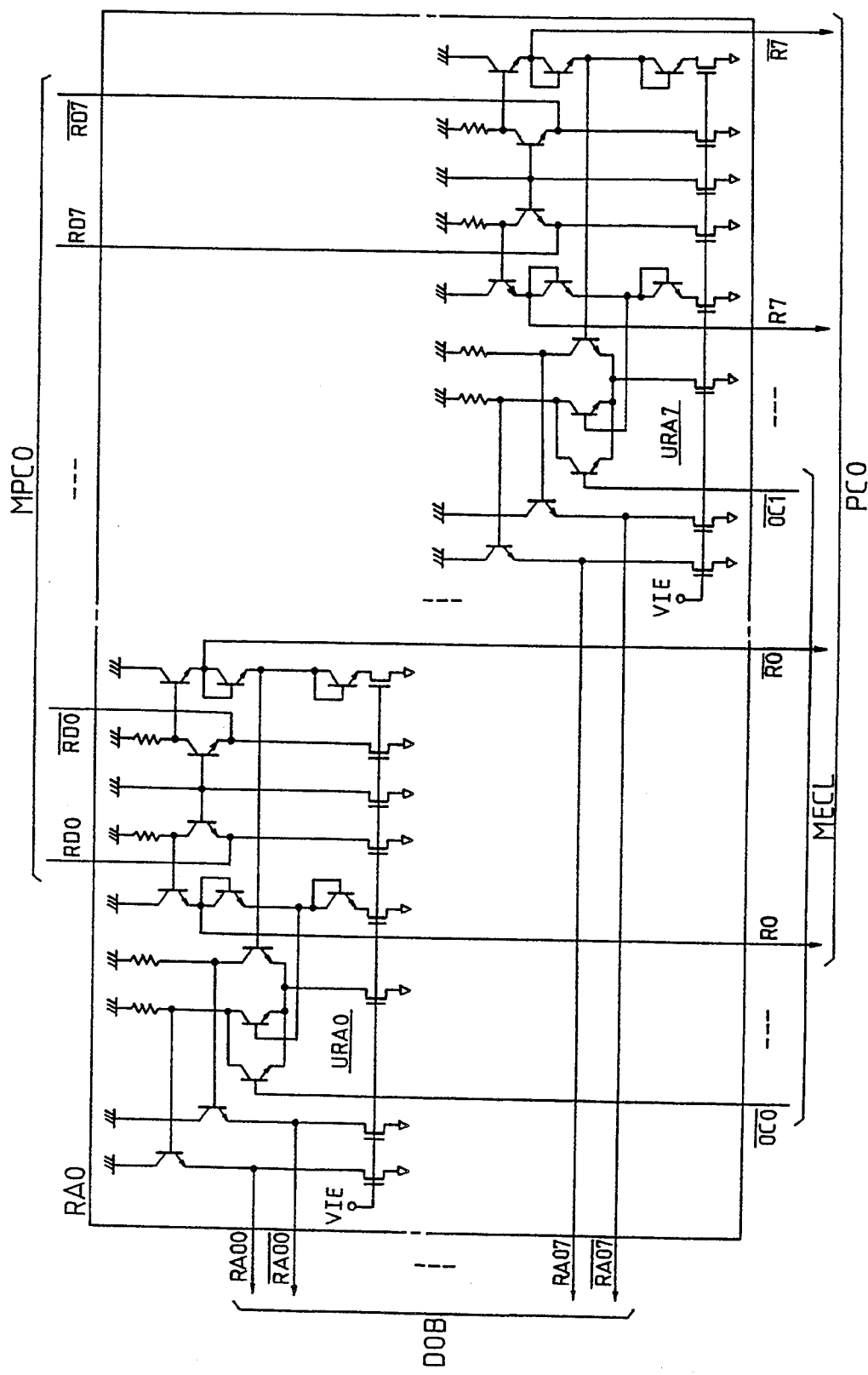
FIG. 19 is a partial circuit diagram of a read amplifier contained in the RAM macrocell of FIG. 14.

Read amplifiers:

FIG. 19 is a partial circuit diagram of the read amplifier RA 0 illustratively practiced in the RAM macrocell of FIG. 14. The other read amplifiers RA 1 and RA 2 have the same circuit configuration as the read amplifier RA 0 shown in FIG. 19. With reference to the read amplifier RA 0, there will now be described the constructions, overall operations and features of the read amplifiers RA 0–RA 2 of the RAM macrocell in this embodiment.

In FIG. 19, the read amplifier RA 0 comprises sense amplifiers SA 0–SA 7 of the paired memory mat peripheral circuits MPC 00 and MPC 01, i.e., eight unit read amplifiers URA 0–URA 7 provided in conjunction with the memory arrays ARY 0–ARY 7 of the memory mats MAT 00 and MAT 01. Each unit read amplifier includes, and is not limited to, a cascade circuit that receives complementary read signals RD 0–RD 7 from the corresponding sense amplifiers SA 0–SA 7, as typically shown in the unit read amplifiers URA 0 and URA 7 of FIG. 19. The complementary output signals from these cascade circuits are transmitted to a differential circuit made up of transistors via a pair of level shift circuits, and are supplied as complementary read signals $\underline{R\ 0}$–$\underline{R\ 7}$ to the parity check circuit PC 0. The output signals from the above-mentioned differential circuit are supplied to the data output buffer DOB over complementary read signal lines $\underline{RA\ 00}$–$\underline{RA\ 07}$ past the corresponding output emitter follower circuit.

In the setup described above, a sense current is generated based on the read signal from a selected memory cell of the sense amplifiers SA 0–SA 7. The sense current is converted back to an ECL level voltage signal by the corresponding cascade circuit of the read amplifier RA 0. The voltage signal is then transmitted, with its ECL level unchanged, to the data output buffer DOB and to the corresponding parity check circuit PC 0.

The differential circuit of each unit read amplifier in the read amplifiers RA 0–RA 2 further comprises output control transistors for receiving inverted internal control signals $\overline{OC\ 0}$–$\overline{OC\ 5}$. The inverted internal control signals are selectively brought Low when the block selection signals BS 0–BS 5 are brought High. Of these inverted internal control signals, the signal $\overline{OC\ 0}$ is commonly supplied to the bases of the output control transistors in the four unit read amplifiers URA 0–URA 3 constituting the read amplifier RA 0; the inverted internal control signal $\overline{OC\ 1}$ is commonly supplied to the bases of the output control transistors in the remaining four unit read amplifiers URA 4–URA 7. Likewise, the inverted internal control signals $\overline{OC\ 2}$, $\overline{OC\ 3}$, $\overline{OC\ 4}$ and $\overline{OC\ 5}$ are each commonly supplied to the four unit read amplifiers URA 0–URA 3 constituting the read amplifier RA 1 or RA 2 as well as to the unit read amplifiers URA 4–URA 5. This allows the amplifying operation of the read signal performed by the read amplifiers RA 0–RA 2 to be controlled in accordance with the inverted internal control signals $\overline{OC\ 0}$–$\overline{OC\ 5}$, i.e., with the block selection signals BS 0–BS 5.

Figure 20:
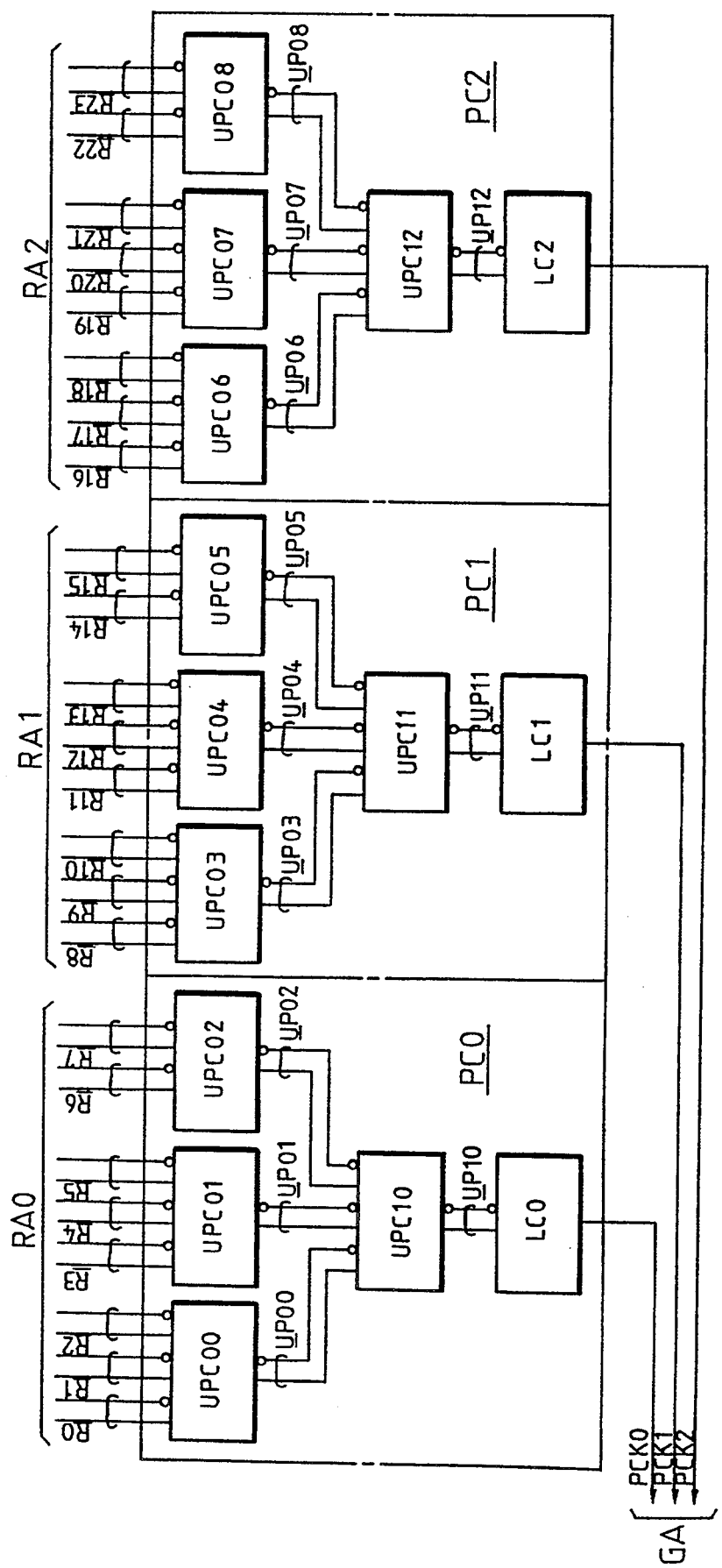
FIG. 20 is a block diagram of parity check circuits contained in the RAM macrocell of FIG. 14.
Figure 21:
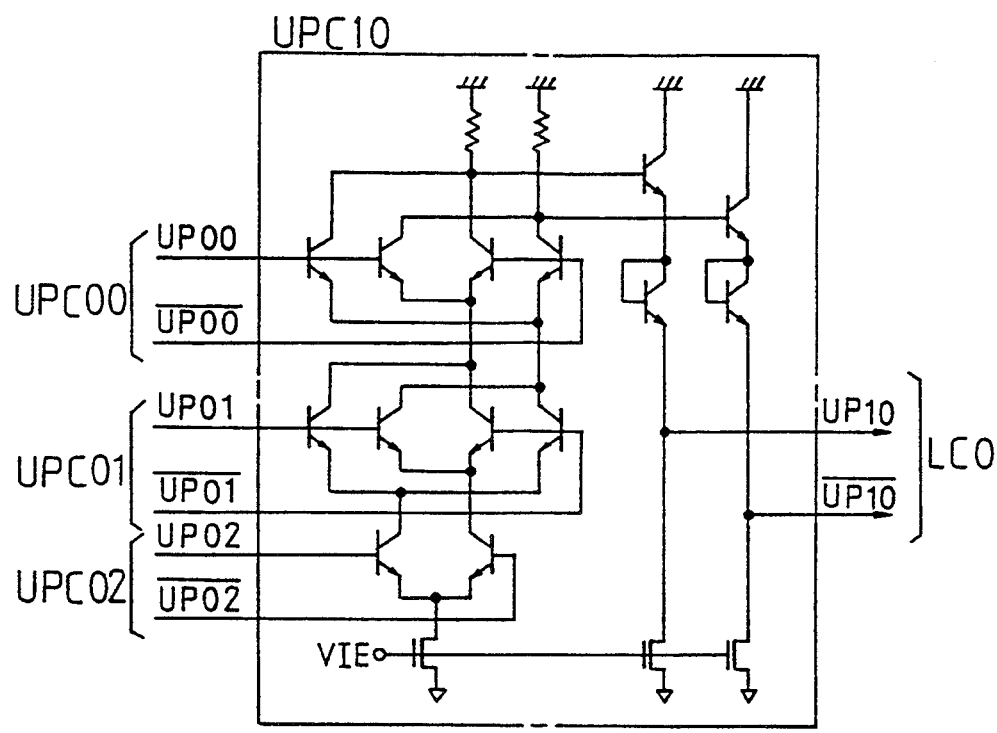
FIG. 21 is a block diagram of a unit parity check circuit contained in the parity check circuit of FIG. 20.
Figure 22:
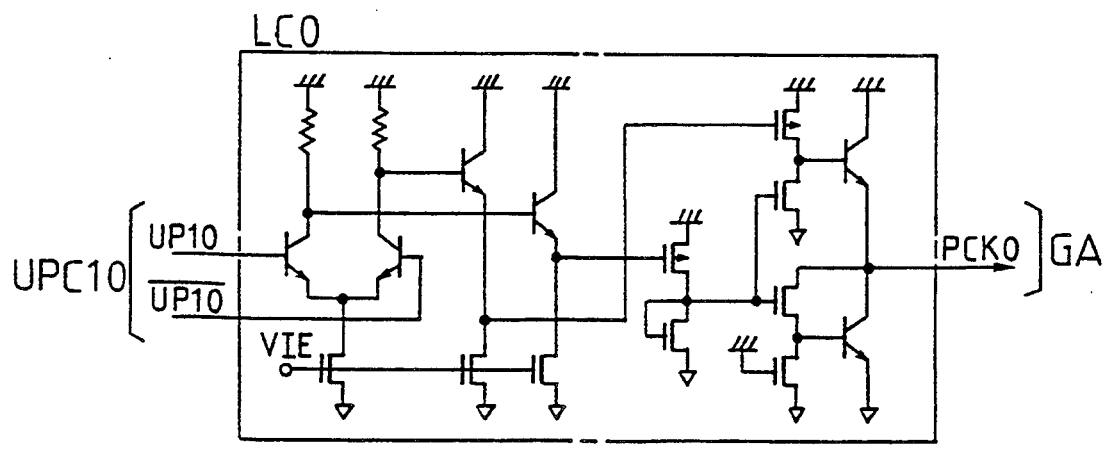
FIG. 22 is a circuit diagram of a level conversion circuit contained in the parity check circuit of FIG. 20.

Parity check circuits:

FIG. 20 is a block diagram of the parity check circuit PC 0–PC 2 illustratively practiced in the RAM macrocell of FIG. 14. FIG. 21 is a block diagram of a unit parity check circuit UPC 10 illustratively practiced in the parity check circuit of FIG. 20. FIG. 22 is a circuit diagram of a level conversion circuit LC 0 for use with the parity check circuits of FIG. 20. The other unit parity check circuits UPC 00–UPC 02 contained in the parity check circuit PC 0, and the unit parity check circuits and level conversion circuits contained in the ether parity check circuits PC 1 and PC 2, have the same circuit configuration as the unit parity check circuit UPC 10 of FIG. 21 and as the level conversion circuit of FIG. 22.

In FIG. 20, the parity check circuit PC 0 contains, and is not limited to, three unit parity check circuits UPC 00–UPC 02 for receiving the complementary read signals $\underline{R\ 0}$–$\underline{R\ 7}$ from the read amplifier RA 0 in combinations of 2 or 3 bits, another unit parity check circuit UPC 10 for receiving complementary output signals $\underline{UP\ 00}$–$\underline{UP\ 02}$ from the three unit parity check circuits, and the level conversion circuit LC 0 for receiving a complementary output signal $\underline{UPC\ 10}$ from the unit parity check circuit UPC 10. Likewise, the parity check circuit PC 1 comprises three unit parity check circuits UPC 03–UPC 05 for receiving complementary read signals $\underline{R\ 8}$–$\underline{R\ 15}$ from the read amplifier RA 1 in a suitable bit combination, another unit parity check circuit UPC 11 for receiving complementary output signals $\underline{UP\ 03}$–$\underline{UP\ 05}$ from these unit parity check circuits, and a level conversion LC 1 for receiving a complementary output signal $\underline{UPC\ 11}$ from the unit parity check circuit UPC 11. The parity check circuit PC 2 comprises three unit parity check circuits UPC 06–UPC 08 for receiving complementary read signals $\underline{R\ 16}$–$\underline{R\ 23}$ in a suitable combination from the read amplifier RA 2, another unit parity check circuit UPC 12 for receiving complementary output signals $\underline{UP\ 06}$–$\underline{UP\ 08}$ from the three unit parity check circuits, and a level conversion circuit LC 2 for receiving a complementary output signal $\underline{UPC\ 12}$ from the unit parity check circuit UPC 12.

The unit parity check circuits UPC 0–UPC 8 and UPC 10–UPC 12 constituting each parity check circuit contain as their basic components, and are not limited thereto, ECL series gate circuits for receiving complementary output signals $\underline{UP\ 00}$–$\underline{UP\ 02}$, complementary output signals $\underline{P\ 03}$–$\underline{UP\ 08}$, or complementary read signals $\underline{R\ 0}$–$\underline{R\ 23}$, as typically shown in the unit parity check circuit UPC 10 of FIG. 21. The uninverted and inverted output signals of these ECL series gate circuits are output via the corresponding output emitter follower circuits, illustratively appearing as an uninverted output signal UP 10 or inverted output signal $\overline{UP\ 10}$.

As indicated, the uninverted output signal UP 10 of the unit parity check circuit UPC 10 is selectively brought Low in one of the following two cases:

(1) where the complementary output signal $\overline{UP\,00}$ is set to 0 (signal $\overline{UP\,00}$ is considered to be set to 0 when uninverted output signal UP 00 is Low and inverted output signal $\overline{UP\,00}$ is High; the same holds hereinafter), and UP 01 and UP 02 are both set to 0 or 1, or (2) where the complementary output signal $\overline{UP\,00}$ is set to 1 and either UP 01 or UP 02 is set to 1.

In any case other than the above, the uninverted output signal UP 10 is brought High. That is, with reference to the uninverted output signal UP 10 of the unit parity check circuit UPC 10, the signal is selectively brought High in accordance with the following logical expression:

$$UP\,10 = \overline{UP\,00} \cdot \overline{UP\,01} \cdot UP\,02 + \overline{UP\,00} \cdot UP\,01 \cdot \overline{UP\,02} +$$
$$UP\,00 \cdot \overline{UP\,01} \cdot \overline{UP\,02} + UP\,00 \cdot UP\,01 \cdot UP\,02$$
$$= UP\,00 \oplus UP\,01 \oplus UP\,02$$

Thus the unit parity check circuit UPC 10 acts an exclusive OR circuit for input. Needless to say, the inverted output signal $\overline{UP\,10}$ of the unit parity check circuit UPC 10 is brought High according to the following logical expression:

$$\overline{UP\,10} = \overline{UP\,00} \cdot \overline{UP\,01} \cdot \overline{UP\,02} + \overline{UP\,00} \cdot UP\,01 \cdot UP\,02 +$$
$$UP\,00 \cdot \overline{UP\,01} \cdot UP\,02 + UP\,00 \cdot UP\,01 \cdot \overline{UP\,02}$$
$$= UP\,00 \oplus UP\,01 \oplus UP\,02$$

As may be induced from the foregoing, the uninverted output signals UP 00–UP 02 of the unit parity check circuits UPC 00–UPC 02 are brought High in accordance with the logical expressions:

UP 00 = R 0 ⊕ R 1 ⊕ R 2

UP 01 = R 3 ⊕ R 4 ⊕ R 5

UP 02 = R 6 ⊕ R 7

Thus the uninverted output signal UP 10 of the unit parity check circuit UPC 10 is given as

UP 10 = R 0 ⊕ R 1 ⊕ R 2 ⊕ R 3 ⊕ R 4 ⊕ R 5 ⊕ R 6 ⊕ R 7

It will then be understood that the uninverted output signal UP 10 of the unit parity check circuit UPC 10 becomes the result of even parity checks on the eight-bit complementary read signals R 0–R 7.

The complementary read signals R 0–R 7 from the read amplifier RA 0 remains set to the ECL level, as mentioned. Each unit parity check circuit is composed of ECL series gates as its basic components. Thanks to this setup as embodied above, the speed of parity checks is significantly boosted, compared with the prior art memory device with logic function wherein the parity checks are performed by use of the read signals amplified to the MOS level, with a relatively large number of logical stages required. The higher speed of parity checks in turn increases the cycle time of buffer storages or the like. In other words, the enhanced speed of parity checks makes it possible for the memory device with logic function to incorporate parity check circuits without restricting the access time involved.

In FIG. 20, the complementary output signals UP 10–UP 12 of the unit parity checks UPC 10–UPC 12 are converted to the MOS level by the corresponding level conversion circuits LC 0–LC 2 and are then output as parity check signals PCK 0–PCK 2. Needless to say, these parity check signals each correspond to the eight-bit complementary output signals R 0–R 7 or R 16–R 23, i.e., one-byte read data.

As typically depicted in the level conversion circuit LC 0 of FIG. 22, the level conversion circuits LC 0–LC 2 have the same circuit configuration as that of the input circuit cell IC 0 of FIG. 7 excluding the input emitter follower. An outline of how these level conversion circuits operate is found in the description of the input circuit cell IC 0.

Figure 23:
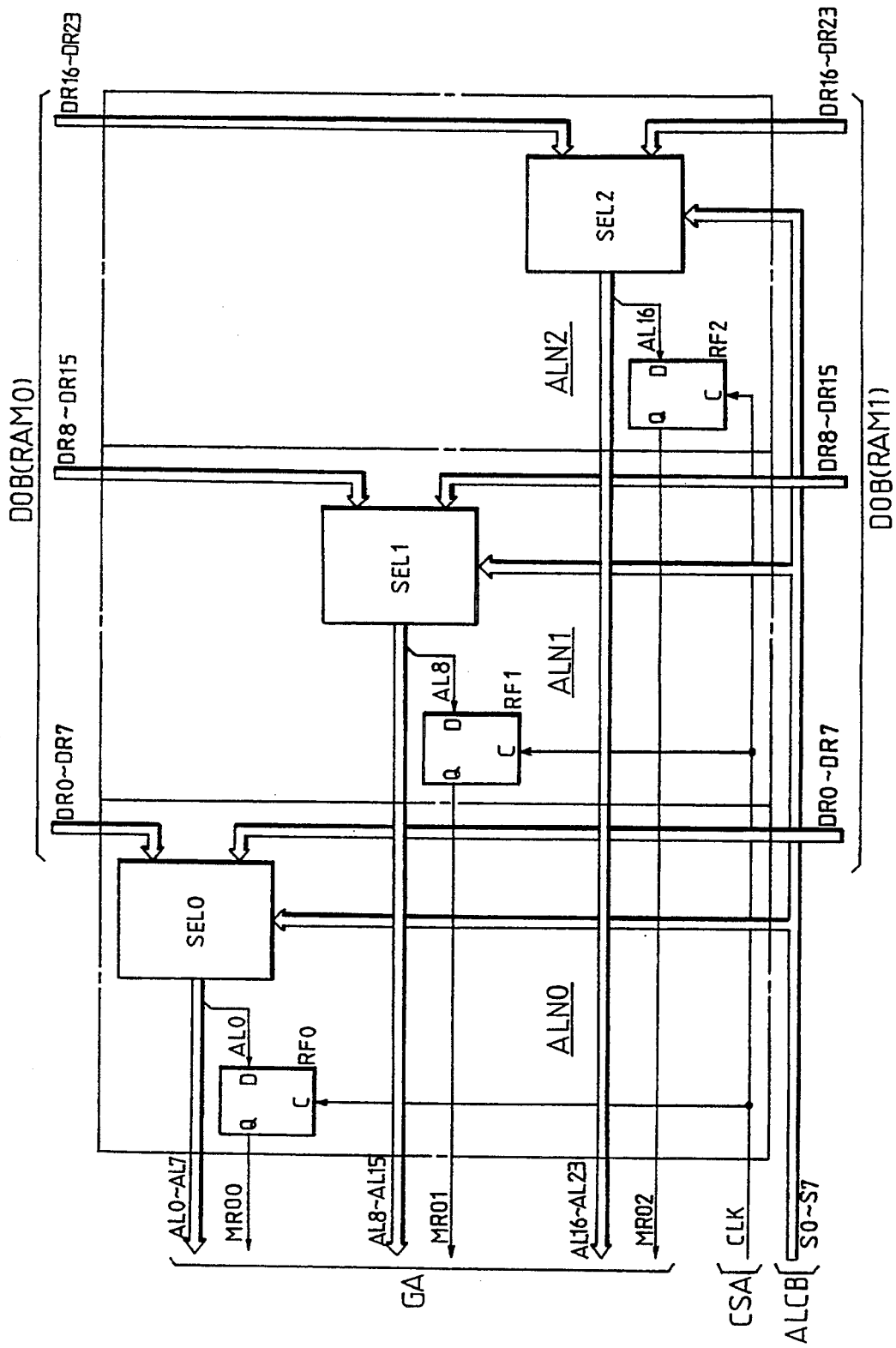
FIG. 23 is a block diagram of aligners contained in the RAM macrocell of FIG. 14.

Aligners and scan-out tests:

FIG. 23 is a block diagram of aligners (sequence control circuits) ALN 0–ALN 2 illustratively practiced in the RAM macrocell RAM 0 of FIG. 14. FIG. 24 is a circuit diagram of a selector circuit SEL 0 illustratively constituting the aligner ALN 0 of FIG. 23. The aligners ALN 1 and ALN 2 have the same circuit configuration as that of the aligner ALN 0 of FIG. 24. As described, the aligners ALN 0–ALN 2 are shared by a pair of RAM macrocells, i.e., RAM 0 and RAM 1.

In FIG. 23, the aligner ALN 0 contains, and is not limited to, the selector circuit SEL 0 and a diagnostic latch circuit RF 0 for receiving some of the output signals from this selector circuit. Likewise, the aligner ALN 1 comprises a selector circuit SEL 1 and a diagnostic latch circuit RF 1 for receiving some of the output signals from this selector circuit. The aligner ALN 2 includes a selector circuit SEL 2 and a diagnostic latch circuit RF 2 for receiving some of the output signals from this selector circuit. The selector circuits SEL 0–SEL 2 of these aligners are supplied with, and not limited by, the corresponding eight-bit read signals DR 0–DR 7 or DR 16–DR 23 from the data output buffer DOB, as well as the corresponding eight-bit read signals DR 0–DR 7 or DR 16–DR 23 from the data output buffer DOB of the paired RAM macrocell RAM 1. Each selector circuit is supplied with eight-bit selection signals S 0–S 7 from the aligner control signal buffer ALCB. These selection signals are brought High, but not limited thereby, in units of bits in combinations of selection signals S 0–S 3 or S 4–S 7.

As typically shown in the selector signal SEL 0 of FIG. 24, the selector signals SEL0–SEL 2 comprise 16 unit selector circuits USELs for receiving in a suitable combination the read signals DR 0–DR 7 and selection signals S 0–S 3 from the paired RAM macrocells, and eight unit selector circuits USELs for receiving in an appropriate combination the output signals from these unit selector circuits and selection signals S 4–S 7.

As shown in the left-hand area of FIG. 24, each of the 24 unit selector circuits USELs contains, and is not limited to, four CMOS two-input NAND gate circuits, and a bipolar CMOS four-input NAND gate circuit for receiving inverted output signals from these NAND gate circuits. The input terminals on one side of the two-input NAND gate circuits in each unit selector circuit receive the read signals DR 0–DR 7 or the output signals from the upstream unit selector circuits USELs in a suitable sequence; the input terminals on the other side receive the selection signals S 0–S 3 or S 4–S 7 in an appropriate sequence. Thanks to this setup, the output terminals AL 0–AL 7 of the selector circuits SEL 0–SEL 2 receive the read signals DR 0–DR 7 or DR 16–DR 23 from the paired RAM macrocells, eight bits at a time, in the sequence and combination according to the selection signals S 0–S 7. These output signals are further combined in a predetermined sequence by buffer storages or the like constituted by a plurality of memory devices with logic function of the above type. This results in the formation of an aligner (sequence control circuit) from the viewpoint of the digital processor such as a computer. The selective operation of the aligner expands the actual address space of the memory device with logic function. This feature contributes to building various types of memory device having relatively large memory capacities.

With particular reference to the first-bit output signal AL 0 of the selector circuit SEL 0, the read signals DR 0–DR 7 from the paired RAM macrocells are output in the following combinations in accordance with the selection signals S 0–S 7:

above-mentioned complementary internal address signals $\overline{MA}$ 2–$\overline{MA}$ 4 and $\overline{MA}$ 5–$\overline{MA}$ 7 are generated by the address buffer AB 1 based on the corresponding address signals A 2–A 4 and A 5–A 7.

Figure 25:
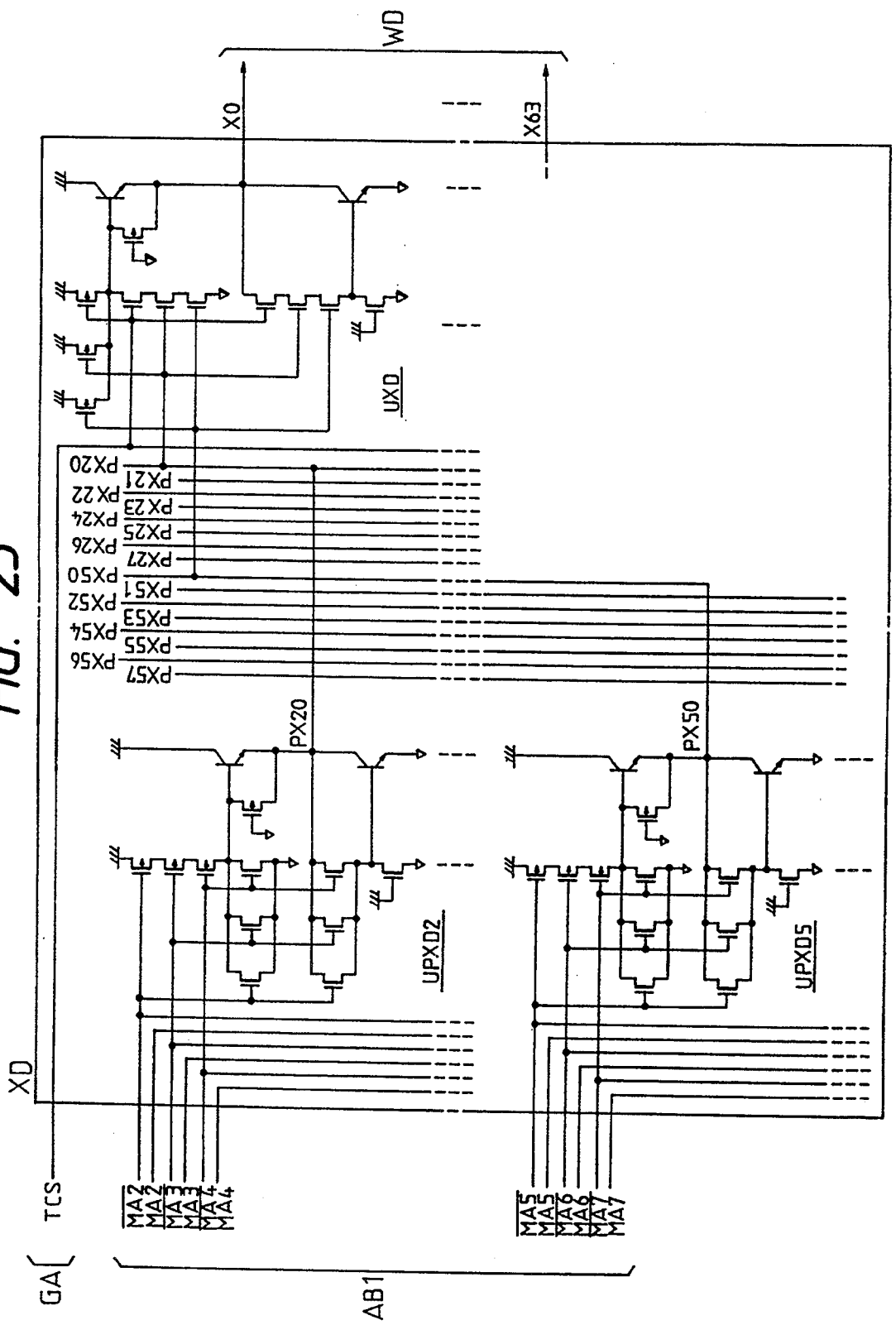
FIG. 25 is a circuit diagram of an X address decoder contained in the RAM macrocell of FIG. 14.

Each of the unit X predecoders UPXD 2s comprises, and is not limited to, bipolar CMOS three-input NOR gate circuits, as typically illustrated in FIG. 25. The output signals of these circuits, i.e., predecode signals PX 20–PX 27, are selectively brought High when the uninverted or inverted signals of the corresponding three-bit complementary internal address signals $\overline{MA}$ 2–$\overline{MA}$ 4 are all brought Low. Likewise, each of the unit X predecoders UPXD 5s contains bipolar CMOS three-input NOR gate circuits. The output signals of these circuits, i.e., predecode signals PX 50–PX 57, are selectively brought High when the uninverted or inverted signals of the corresponding three-bit complementary internal address signals $\overline{MA}$ 5–$\overline{MA}$ 7 are all brought

| Selection Signal | | | | | | | | AL 0 | |
|---|---|---|---|---|---|---|---|---|---|
| S 0 | S 1 | S 2 | S 3 | S 4 | S 5 | S 6 | S 7 | RAM 0 | RAM 1 |
| 1 | 0 | 0 | 0 | 1 | 0 | 0 | 0 | DR 0 | |
| 0 | 1 | 0 | 0 | 1 | 0 | 0 | 0 | DR 1 | |
| 0 | 0 | 1 | 0 | 1 | 0 | 0 | 0 | DR 2 | |
| 0 | 0 | 0 | 1 | 1 | 0 | 0 | 0 | DR 3 | |
| 1 | 0 | 0 | 0 | 0 | 1 | 0 | 0 | DR 4 | |
| 0 | 1 | 0 | 0 | 0 | 1 | 0 | 0 | DR 5 | |
| 0 | 0 | 1 | 0 | 0 | 1 | 0 | 0 | DR 6 | |
| 0 | 0 | 0 | 1 | 0 | 1 | 0 | 0 | DR 7 | |
| 1 | 0 | 0 | 0 | 0 | 0 | 1 | 0 | | DR 0 |
| 0 | 1 | 0 | 0 | 0 | 0 | 1 | 0 | | DR 1 |
| 0 | 0 | 1 | 0 | 0 | 0 | 1 | 0 | | DR 2 |
| 0 | 0 | 0 | 1 | 0 | 0 | 1 | 0 | | DR 3 |
| 1 | 0 | 0 | 0 | 0 | 0 | 0 | 1 | | DR 4 |
| 0 | 1 | 0 | 0 | 0 | 0 | 0 | 1 | | DR 5 |
| 0 | 0 | 1 | 0 | 0 | 0 | 0 | 1 | | DR 6 |
| 0 | 0 | 0 | 1 | 0 | 0 | 0 | 1 | | DR 7 |

As listed above, for the first-bit output signals AL 0, AL 8 and AL 16 of the selector circuits SEL 0–SEL 2, the read signals DR 0–DR 7 or DR 16–DR 23 of the paired RAM macrocells are consecutively scanned out, in combinations of eight bits at a time, when the selection signals S 0–S 3 and S 4–S 7 are consecutively set to 1, i.e., brought High. As shown in FIG. 23, these output signals are admitted into the corresponding diagnostic latch circuits RF 0–RF 2 in accordance with a predetermined clock signal CLK when the memory device with logic function is placed in a predetermined diagnostic mode. The signals are then output as scan-out signals MR 00–MR 02. Thanks to this arrangement, a computer system or the like containing buffer storages constituted by memory devices with logic function of the above type can perform diagnostic operations on each incorporated RAM macrocell efficiently.

X address decoder and margin tests:

FIG. 25 is a partial circuit diagram of the X address decoder XD illustratively contained in the RAM macrocell RAM 0 of FIG. 14. In FIG. 25, the X address decoder XD comprises, and is not limited to, eight unit X predecoder UPXD 2s for receiving in a suitable combination the uninverted or inverted signals of three-bit complementary internal address signals $\overline{MA}$ 2–$\overline{MA}$ 4, eight unit X predecoders UPXD 5s for receiving in an appropriate combination the uninverted or inverted signals of three-bit complementary internal address signals $\overline{MA}$ 5–$\overline{MA}$ 7, and 64 unit X address decoders UXDs for receiving in a suitable combination the output signals of the above unit X predecoders, i.e., predecode signals PX 20–PX 27 and PX 50–PX 57. The Low.

As illustrated in FIG. 25, each of the unit X address decoders UXDs comprises, and is not limited to, bipolar CMOS three-input NAND gate circuits. The second input terminals of these NAND gates are supplied with the predecode signals PX 20–PX 27 in a suitable sequence; the third input terminals thereof are supplied with the predecode signals PX 50–PX 57 in an appropriate sequence. In this embodiment, the first input terminals of the NAND gate circuits constituting the unit X address decoders UXDs are commonly supplied with a test control signal TCS. The test control signal TCS is commonly supplied to, and not limited by, eight RAM macrocells incorporated in the memory device with logic function. the signal TCS is selectively brought Low when margin tests are carried out on the RAM macrocells in the memory device.

When the memory device with logic function is in ordinary operation mode and the test control signal TCS is found High the predecode signals PX 20–PX 27 are alternatively brought High in conjunction with the logic level of the complementary internal address signals $\overline{MA}$ 2–$\overline{MA}$ 4 inside the X address decoder XD; the predecode signals PX 50–PX 57 are alternatively brought High in conjunction with the logic level of the complementary internal address signals $\overline{MA}$ 5–$\overline{MA}$ 7. In this arrangement, the output signals of the unit X address decoders UXDs, i.e., word line selection signals X 0–X 63, are alternatively brought High in response to the combinations of these predecode signals. As described earlier, the word line-selection signals X 0–X 63 are commonly supplied to the word line driving circuits WD of the memory mats MAT 00-MAT 20 and MAT 01-MAT 21, to be later combined with a mat selection signal and memory array upper/lower selection signal from the mat selector circuit MSL. As a result, the corresponding word lines W 0-W 127 of three memory mats MAT 00-MAT 20 or MAT 01-MAT 21 are alternatively brought High.

Meanwhile, when the memory device with logic function is placed in a predetermined margin test mode and the test control signal TCS is found Low, the output signals of all unit X address decoders UXDs, i.e., word line selection signals X 0-X 63, are always Low regardless of the address signals A 2-A 7 in the X address decoder XD. All word lines of each RAM macrocell are simultaneously placed in unselected state. At this time, in the memory device with logic function, the circuit supply voltage is brought to, but not limited by, an abnormally low level for a predetermined period of time, and the address signals A 0-A 10 are made to change randomly. After the circuit supply voltage is returned to normal, the contents of each RAM macrocell are read out for verification. This permits testing of the operation margin with the RAM macrocells for normality thereof. In this manner, the memory device with logic function is given the ability to place in unselected state all word lines of all RAM macrocells in accordance with the test control signal TCS. This feature makes it possible to perform margin tests on the RAM macrocells with high levels of efficiency.

Figure 26:
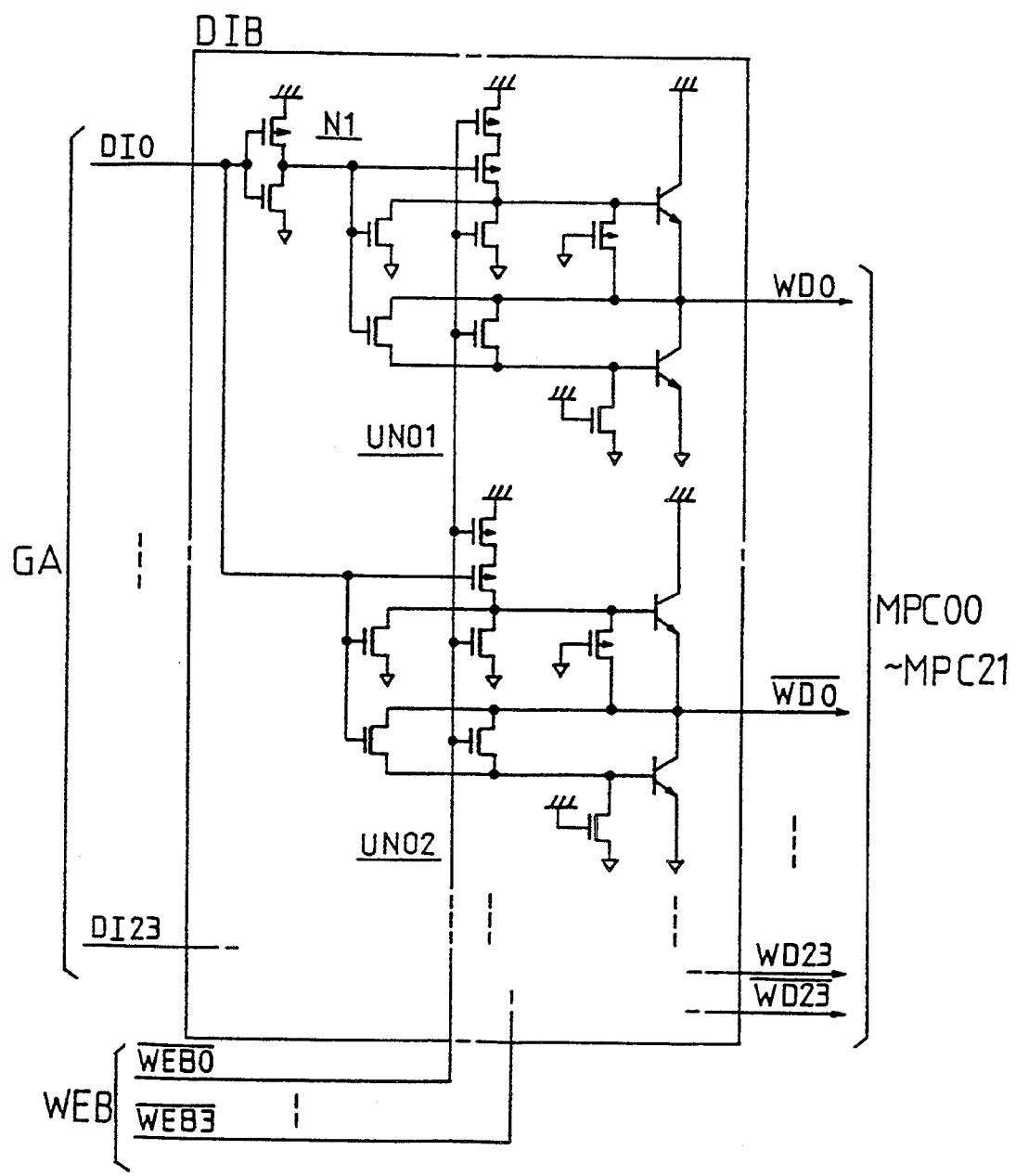
FIG. 26 is a circuit diagram of a data input buffer contained in the RAM macrocell of FIG. 14.

Data input buffer:

FIG. 26 is a partial circuit diagram of the data input buffer DIB illustratively contained in the RAM macrocell RAM 0 of FIG. 14. In FIG. 26, the data input buffer DIB comprises, and is not limited to, 26 CMOS inverter circuits N1s associated with input data DI 0-DI 23, and 48 bipolar CMOS two-input NOR gate circuits UN 01s-UN 02s. The first input terminals of the NOR gate circuits UN 01s are supplied with the output signals of the corresponding inverter circuits N1s, i.e., inverted signals of the corresponding input data DI 0-DI 23; the remaining input terminals are supplied with suitable combinations of the corresponding inverted write enable signals $\overline{\text{WEB 0}}$-$\overline{\text{WEB 3}}$. The first input terminals of the NOR gate circuits UN 02s are supplied with the corresponding input data DI 0-DI 23 unchanged; the second input terminals thereof are supplied with suitable combinations of the inverted write enable signals $\overline{\text{WEB 0}}$-$\overline{\text{WEB 3}}$.

The inverted write enable signals $\overline{\text{WEB 0}}$-$\overline{\text{WEB 3}}$ are generated by the write enable buffer WEB based on the corresponding write enable signals WE 0-WE 3, respectively. These signals are commonly supplied to every fourth bit of the second input terminals of the NOR gate circuits UN 01s and UN 02s. For example, the inverted write enable signal $\overline{\text{WEB 0}}$ is commonly supplied to the second input terminals of the NOR gate circuits UN 01s and UN 02s corresponding to the input data DI 0, DI 4, DI 8, DI 12, DI 16 and DI 20; the inverted write enable signal $\overline{\text{WEB 3}}$ is commonly supplied to the second input terminals of the NOR gate circuits corresponding to the input data DI 3, DI 7, DI 11, DI 15, DI 19 and DI 23. In other words, the inverted write enable signals $\overline{\text{WEB 0}}$-$\overline{\text{WEB3}}$ are commonly supplied to the second input terminals of those 12 NOR gate circuits UN 01s and UN 02s which correspond to the six-bit input data that occurs as the first or fourth bit in the four-bit stored data which are split into blocks. As a result, when the corresponding inverted write enable signals $\overline{\text{WEB 0}}$-$\overline{\text{WEB 3}}$ are brought Low, six bits of the output signals of the NOR gate circuits UN 01s and UN 02s, i.e., complementary write signals $\overline{\text{WD}}$ 0-$\overline{\text{WD}}$ 23, are selectively set to 0 or 1 depending on the logic level of the corresponding input data.

As described, the output signals of the data input buffer DIB, i.e., complementary write signals $\overline{\text{WD}}$ 0-$\overline{\text{WD}}$ 23, are supplied in a suitable combination to the write amplifiers WA 0-WA 7 contained in the memory mats MPC 00-MPC 20 and MPC 01-MPC 21. These signals undergo gate control provided by the block selection signals BS 0-BS 5 before being written to selected memory cells. As a result of this, it becomes possible to alternatively update stored data in simultaneously selected 24 memory cells. Needless to say, it is possible to simultaneously update the stored data in the selected 24 memory cells by enabling all the write enable signals WE 0-WE 3 and block selection signals BS 0-BS 5.

Figure 27:
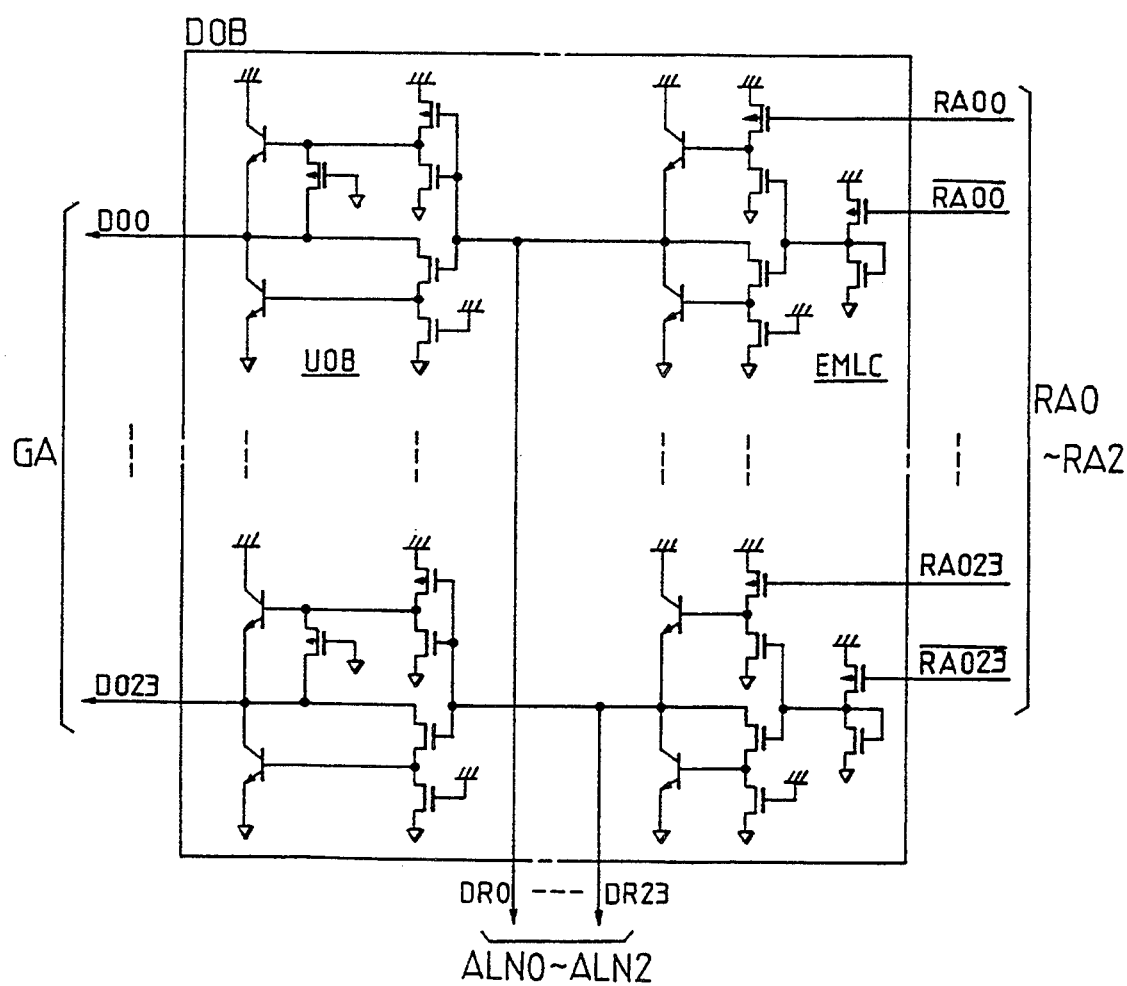
FIG. 27 is a circuit diagram of a data output buffer contained in the RAM macrocell of FIG. 14.
Figure 28:
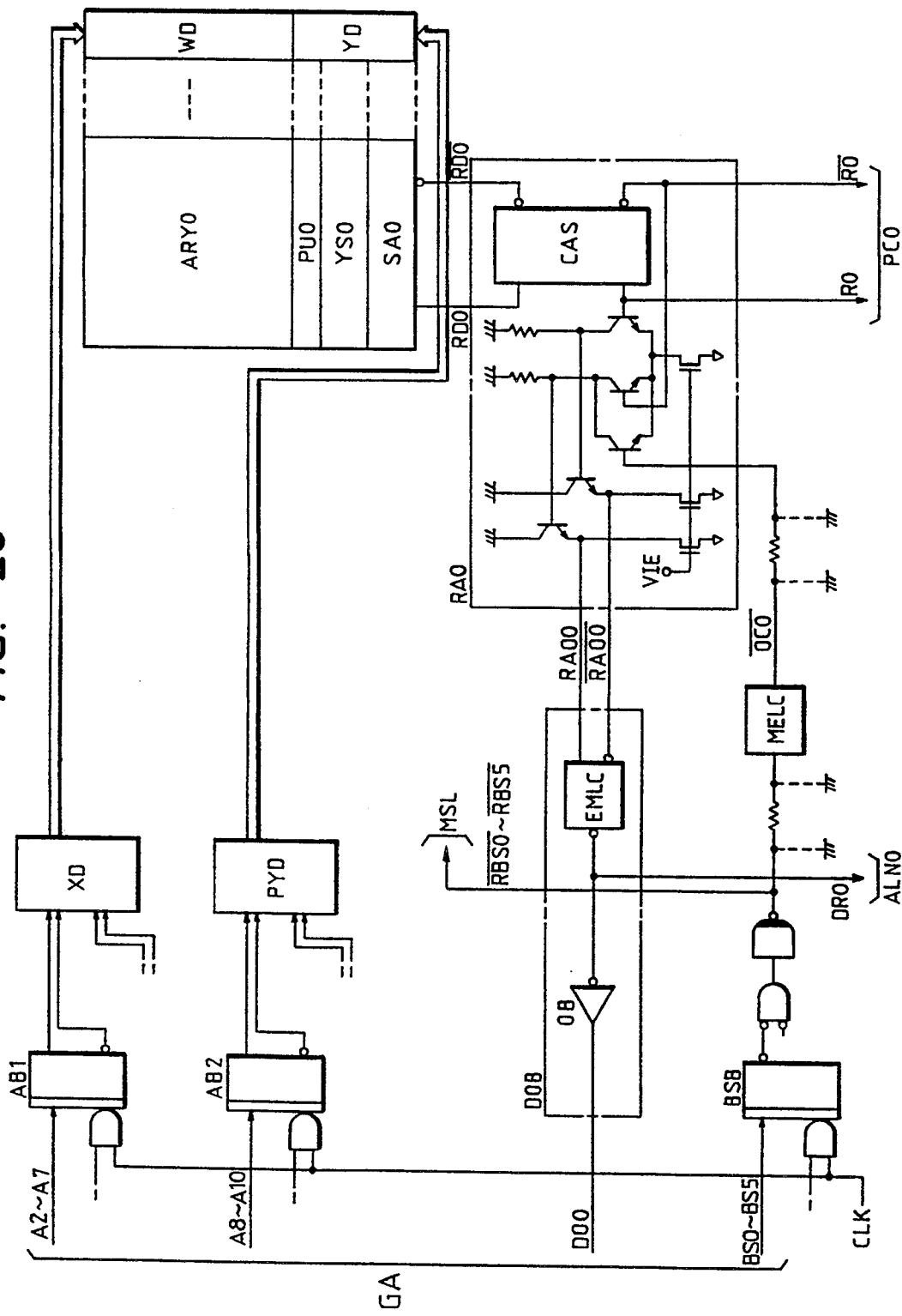
FIG. 28 is a schematic diagram of the RAM macrocell of FIG. 14 in its read mode.
Figure 29:
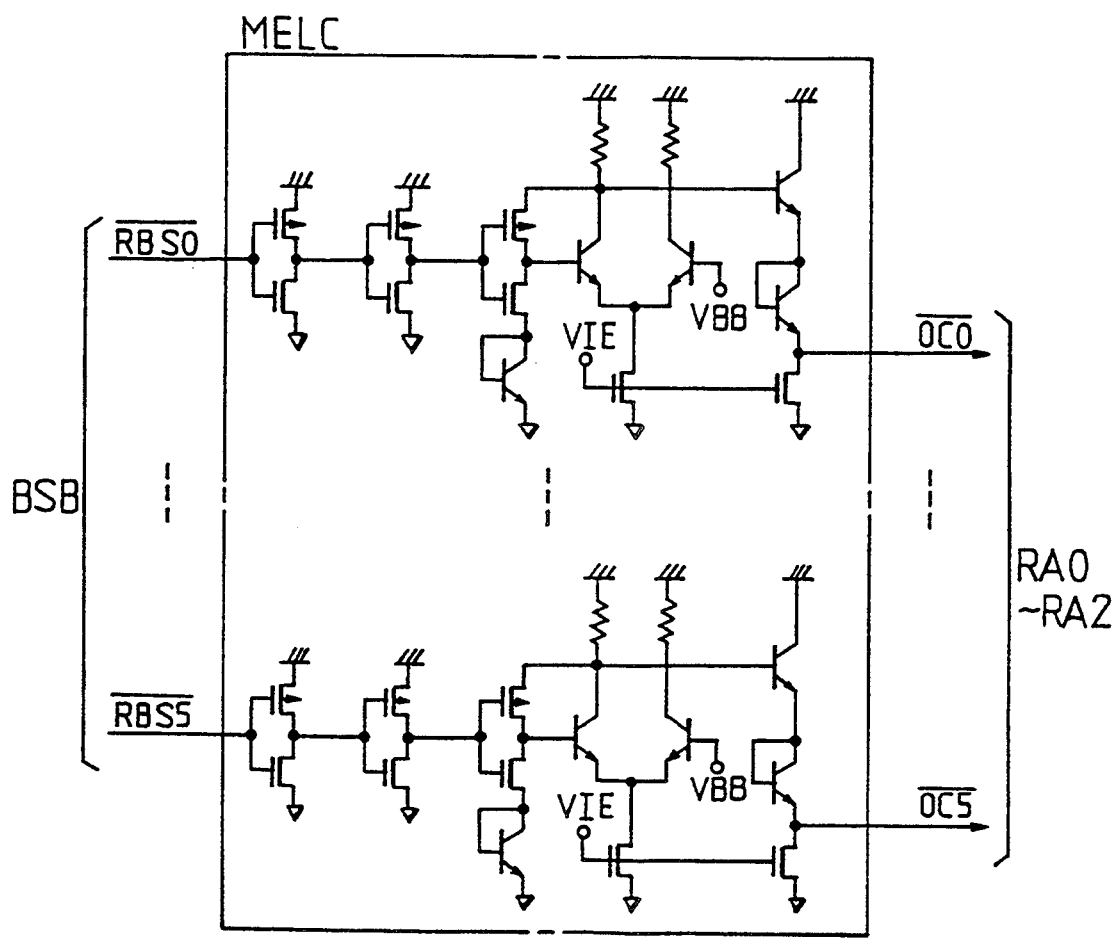
FIG. 29 is a circuit diagram of an embodiment of the MOS/ECL level conversion circuit shown in FIG. 28.

Data output buffer:

FIG. 27 is a partial circuit diagram of the data output buffer DOB illustratively contained in the RAM macrocell of FIG. 14. FIG. 28 is a schematic diagram of the RAM macrocell in its read mode along with the signal flow involved, the macrocell containing the data output buffer DOB of FIG. 27. FIG. 29 is a circuit diagram of the MOS/ECL level conversion circuit MELC illustratively contained in the schematic diagram of FIG. 29.

In FIG. 27, the data output buffer DOB comprises, and is not limited to, 24 ECL/MOS level conversion circuits EMLCs and 24 unit output buffers UOBs for addressing output data DO 0-DO 23. Of these circuits, the level conversion circuits EMLCs have the same circuit configuration as the level conversion circuit on the downstream side of the input circuit cell IC 0 of FIG. 7, as depicted in FIG. 27. The uninverted and inverted input terminals of the level conversion circuits EMLCs are supplied respectively with the uninverted and inverted signals of the corresponding complementary read signals RAO 0-RAO 23 from the read amplifiers RA 0-RA 2. The level conversion circuits EMLCs convert these complementary read signals to the MOS level for transmission to the corresponding unit output buffers UOBs. As described, the output signals of each level conversion circuit EMLC are also supplied to the aligners ALN 0-ALN 2 in the form of read signals DR 0-DR 23.

As illustrated in FIG. 27, each of the unit output buffers UOBs comprises, and is not limited to, bipolar CMOS inverter circuits. The MOS level output signals of the corresponding level conversion circuits EMLCs are output as output data DO 0-DO 23 of the RAM macrocells.

The complementary read signals RAO 0-RAO 23 from the read amplifiers RA 0-RA 2 are subjected to gate control, as shown in FIG. 28, provided by the inverted output control signals $\overline{\text{OC}}$ 0-$\overline{\text{OC}}$ 5, i.e., block selection signals BS 0-BS 5. In this embodiment, the block selection signals BS 0-BS 5 are converted to ECL-level inverted output control signals $\overline{\text{OC}}$ 0-$\overline{\text{OC}}$ 5 by the MOS/ECL level conversion circuits MELCs. The converted signals are then transmitted in a suitable combination to the output control transistors of the unit read amplifiers in the read amplifiers RA 0-RA 2. As a result, the actual number of gate stages for the read-related circuits in the memory device with logic function of the above-described setup is smaller by one than the typical prior art memory device with logic function wherein read signals, after being converted to the MOS level, are subjected to gate control by use of MOS level block selection signals. With the fewer gate stages, the access time of the RAM macrocells is shortened accordingly.

As depicted in FIG. 29, the MOS/ECL level conversion circuits MELCs substantially inherit the same circuit configuration as, but are not limited by, that of the output circuit cell OC 0 of FIG. 9.

Clock-related circuits:

Eight RAM macrocells (RAM 0–RAM 7) constituting the memory device with logic function and the gate arrays GA 0–GA 5 are synchronized in operation with, but not limited by, six-phase complementary clock signals $\overline{CP}$ 1–CP 6. To implement this feature, the memory device with logic function contains, and is not limited to, two clock shaping circuits CSP 0 and CSP 1, one clock distribution circuit CDA, 10 clock switching amplifiers CSA 0–CSA 9, and clock-related circuits for generating suitable internal clock signals based on the complementary clock signals $\overline{CP}$ 0–$\overline{CP}$ 6 for distribution to various circuits. Each RAM macrocell comprises a write pulse generation circuit WPG for generating write pulses needed to write data by use of the clock signal CLK coming from the corresponding clock switching amplifier. What follows is a description of specific constructions, overall operations and features of these clock-related circuits, including the write pulse generation circuits WPGs.

Figure 30:
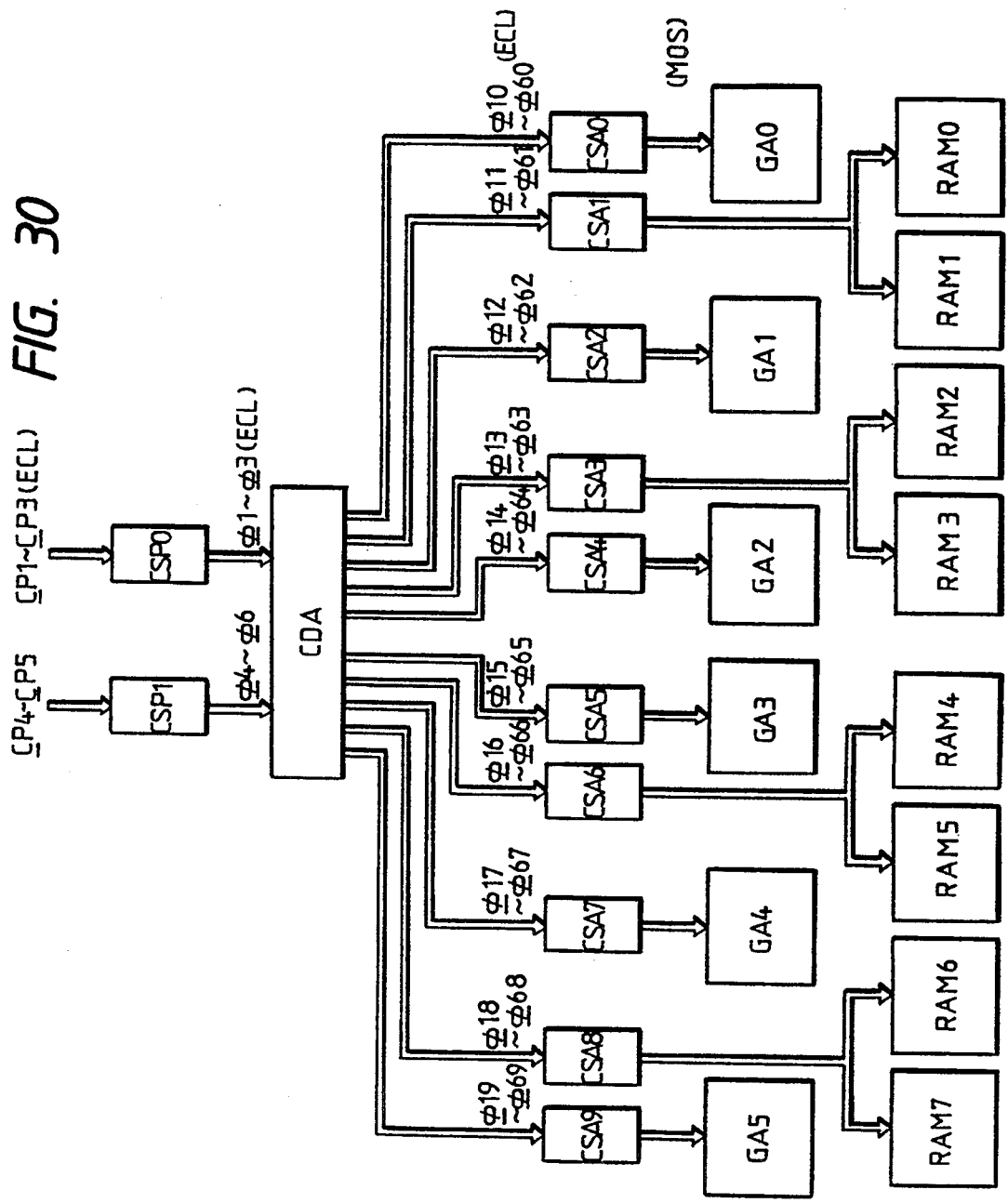
FIG. 30 is a block diagram of clock-related circuits for the memory device with logic function shown in FIG. 1.

Block construction of clock-related circuits:

FIG. 30 is a block diagram of the clock-related circuits for the memory device with logic function shown in FIG. 1. In FIG. 30, of the six-phase complementary clock signals supplied to the memory device with logic function, three-phase complementary clock signals $\overline{CP}$ 1–$\overline{CP}$ 3 are supplied to, but not limited by, the clock shaping circuit CSP 0. The remaining three-phase complementary clock signals $\overline{CP}$4–$\overline{CP}$ 6 are fed to the clock shaping circuit CSP 1. These complementary clock signals are adjusted in terms of setup time and signal amplitude by the corresponding clock shaping circuit CSP 0 or CSP 1. These signals are then supplied to the clock distribution circuit CDA as shaped complementary internal clock signals $\phi1$–$\phi3$ and $\phi4$–$\phi6$.

The clock distribution circuit CDA causes the complementary internal clock signals $\phi1$–$\phi6$ to branch by a factor of 10 for distribution to the corresponding clock switching amplifiers CSA 0–CSA 9 in the form of complementary internal clock signals $\phi10$–$\phi19$ or $\phi60$–$\phi69$.

The clock switching amplifiers CSA 0–CSA 9 generate MOS-level distribution clock signals based on the corresponding complementary internal clock signals $\phi10$–$\phi60$ or $\phi19$–$\phi69$. The distribution clock signals generated by six clock switching amplifiers CSA 0, CSA 2 CSA 4, CSA 5, CSA 7 and CSA 9 are supplied to, but not limited by, the adjoining gate arrays GA 0, GA 1, GA 2, GA 3, GA 4 and GA 5. The distribution clock signals generated by the clock switching amplifiers CSA 1, CSA 3, CSA 6 and CSA 8 are supplied respectively to the adjoining pairs of RAM macrocells RAM 0 and RAM 1, RAM 2 and RAM 3, RAM 4 and RAM 5, and RAM 6 and RAM 7.

Some of the distribution clock signals generated by the clock switching amplifiers CSA 1, CSA 3, CSA 6 and CSA 8 are supplied as clock signals CLK to the write pulse generation circuit WPG of the corresponding pair of RAM macrocells.

In this embodiment, the complementary clock signals $\overline{CP}$ 0–$\overline{CP}$ 5 are supplied at the ECL level to the memory device with logic function, and are transmitted with their ECL level unchanged to the clock switching amplifiers CSA 0–CSA 9. These signals are converted to the MOS level at the receiving ends of each clock switching amplifier, i.e., the corresponding RAM macrocell or gate arrays. To implement this feature, as will be described later, the ECL circuits primarily made of bipolar transistors constitute the clock shaping circuits CSP 0 and CSP 1, clock distribution circuit CDA, and upstream circuits in the clock switching amplifiers CSA 0–CSA 9, all combining to constitute the clock-related circuits.

Figure 31:
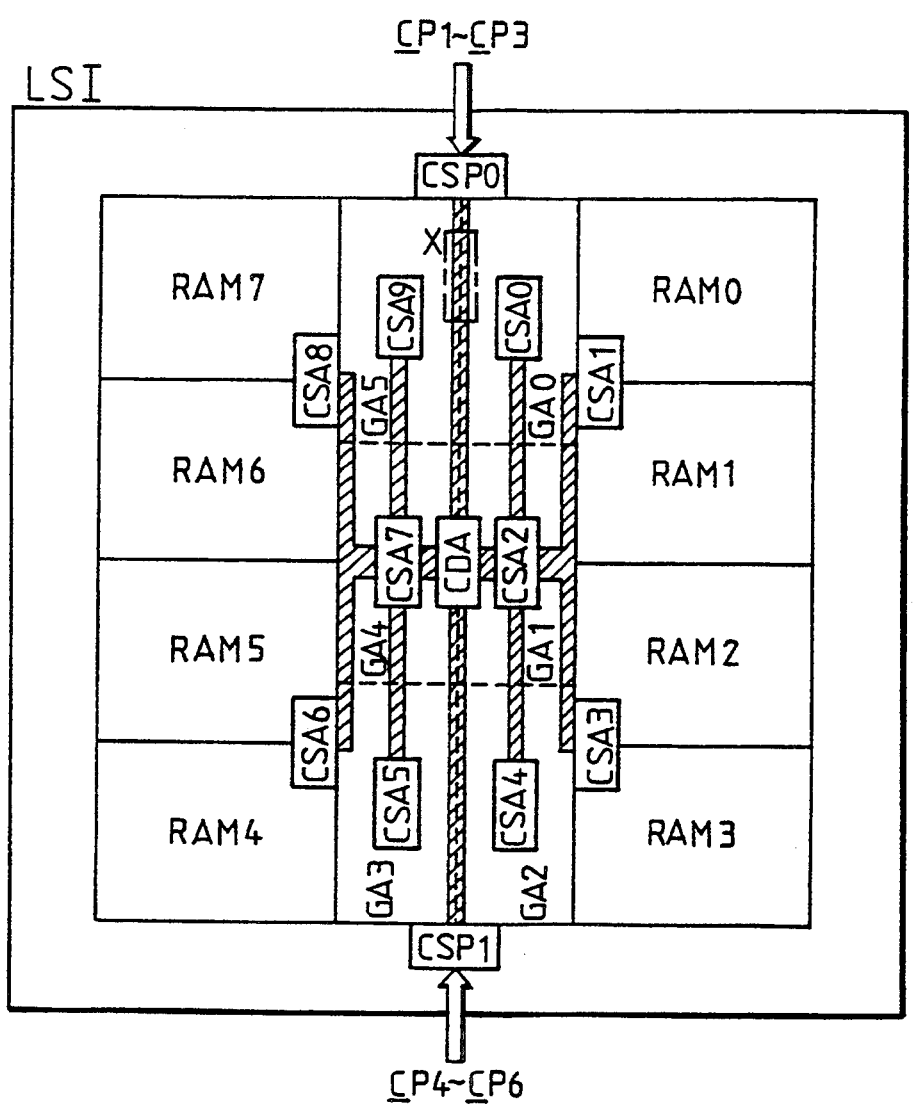
FIG. 31 is a layout view of a variation of the clock-related circuits shown in FIG. 30.
Figure 32:
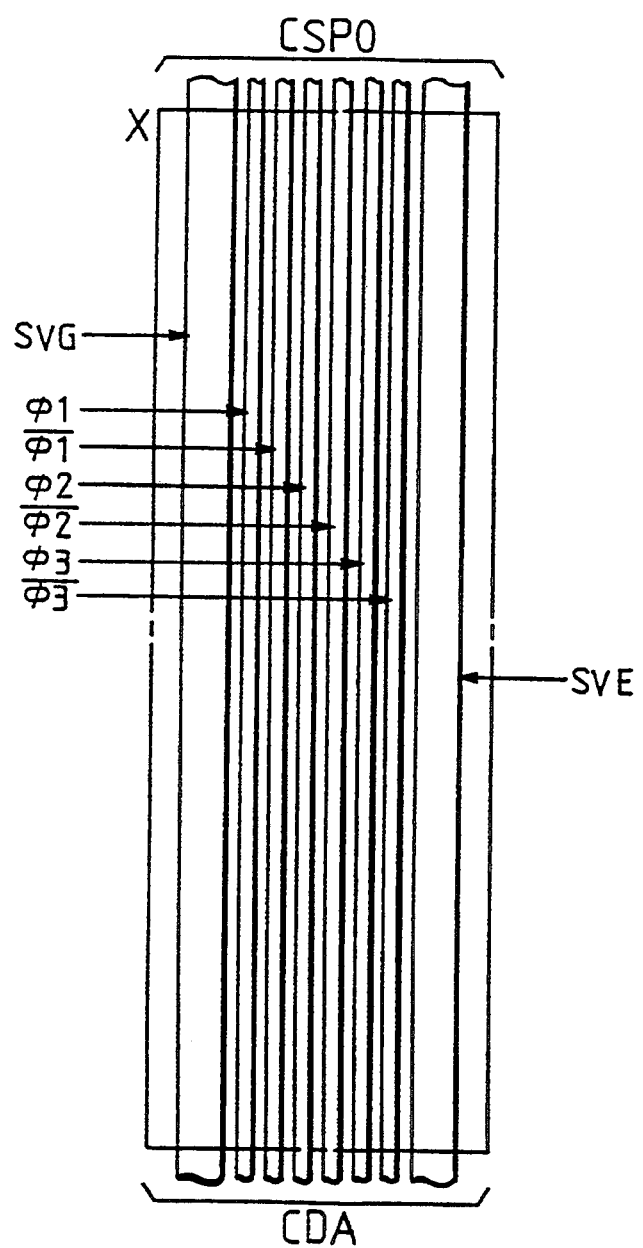
FIG. 32 is an enlarged partial layout view of the clock circuits shown in FIG. 31.

Layout of clock-related circuits:

FIG. 31 is a layout view of the clock-related circuits as embodied in the memory device with logic function (LSI) mounted on the substrate. FIG. 32 is an enlarged partial layout view of a wiring region X surrounded by dashed lines in the dedicated wiring domain shown in FIG. 31.

In FIG. 31, the clock shaping circuits CSP 0 and CSP 1 constituting the clock-related circuits are located in, but not limited by, the middle of the top and bottom portions of the semiconductor substrate, respectively, while the clock distribution circuit CDA is located at the center of the semiconductor substrate. Six clock switching amplifiers CSA 0, CSA 2, CSA 4, CSA 5, CSA 7 and CSA 9 are located substantially in the middle of the corresponding gate arrays GA 0–GA 5. The remaining four clock switching amplifiers CSA 1, CSA 3, CSA 6 and CSA 8 are each located in the middle of each receiving side of the corresponding two RAM macrocells being paired.

In this embodiment, the clock shaping circuits CSP 0 and CSP 1, clock distribution circuit CDA, and clock switching amplifiers CSA 0–CSA 9 are formed by use of dedicated embedded regions, i.e., without the use of standard cells contained in the gate arrays GA 0–GA 5. As described, the clock distribution circuit CDA is located substantially at the center of the semiconductor substrate and keeps approximately the same distance to both clock shaping circuits CSP 0 and CSP 1. As shown shaded in FIG. 31, clock signal lines are formed in dedicated wiring regions without the use of general wiring channel regions, the clock signal lines transmitting the complementary internal clock signals from the clock shaping circuits CSP 0 and CSP 1 to the clock distribution circuit CDA and from CDA to the clock switching amplifiers CSA 0–CSA 9. As depicted in FIG. 32, on both sides of these dedicated wiring regions are shielding wires comprised of a ground potential line SVG and a supply voltage line SVE. This setup suppresses dispersions in transmission characteristic of the clock shaping circuits and clock distribution circuit, the dispersions stemming from changes in the production process or environment, minimizes the irregularities in clock signal line lengths, and inhibits the adverse effects that may be exerted by the MOS level internal signals transmitted via the signal lines surrounding the dedicated wiring regions. As a result, the interphase skew of each complementary internal clock signal is reduced, the noise therefrom is suppressed, and the operation of the memory device with logic function is stabilized.

Figure 33:
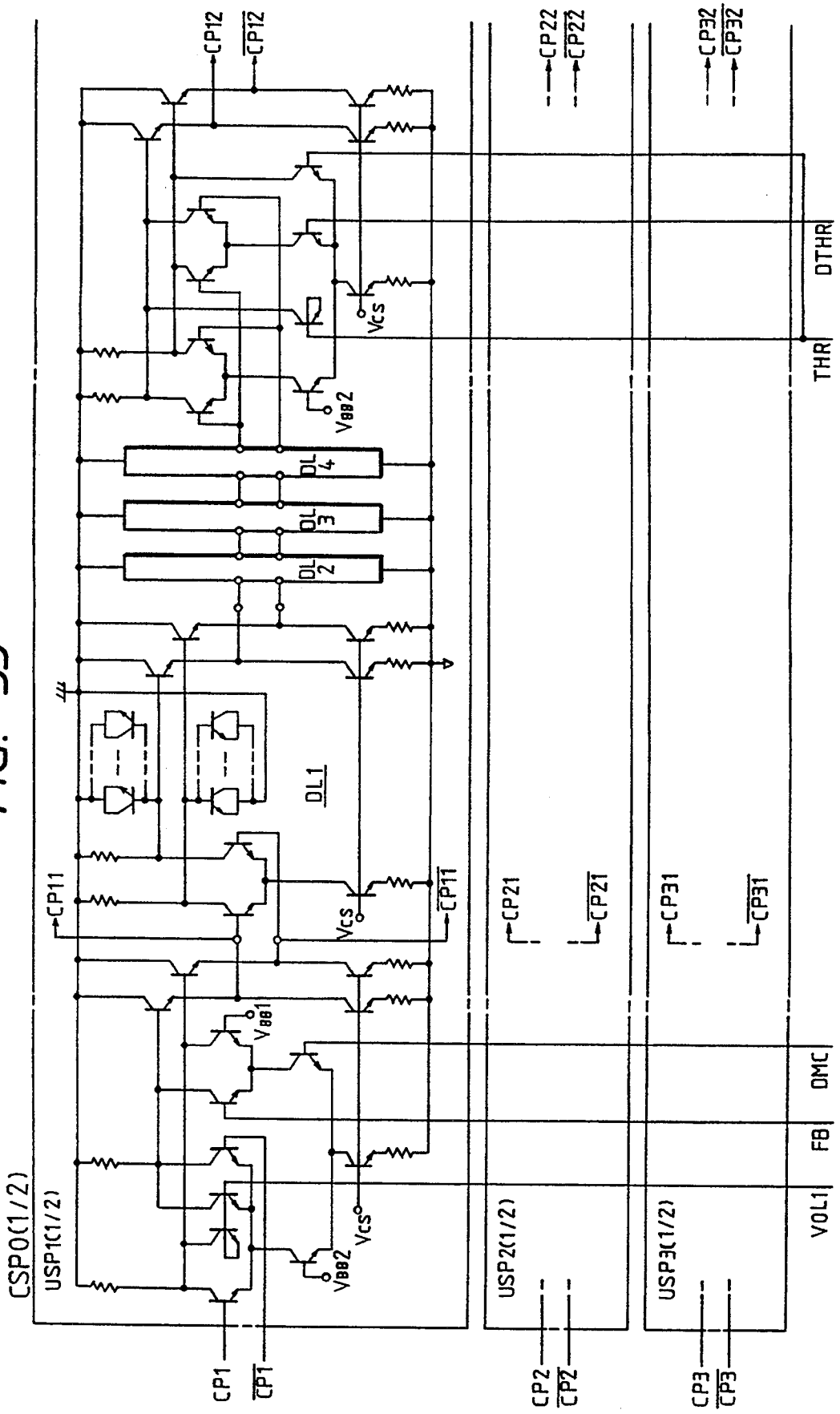
FIGS. 33 and 34 are circuit diagrams of a clock shaping circuit contained in the clock-related circuits of FIG. 30.
Figure 34:
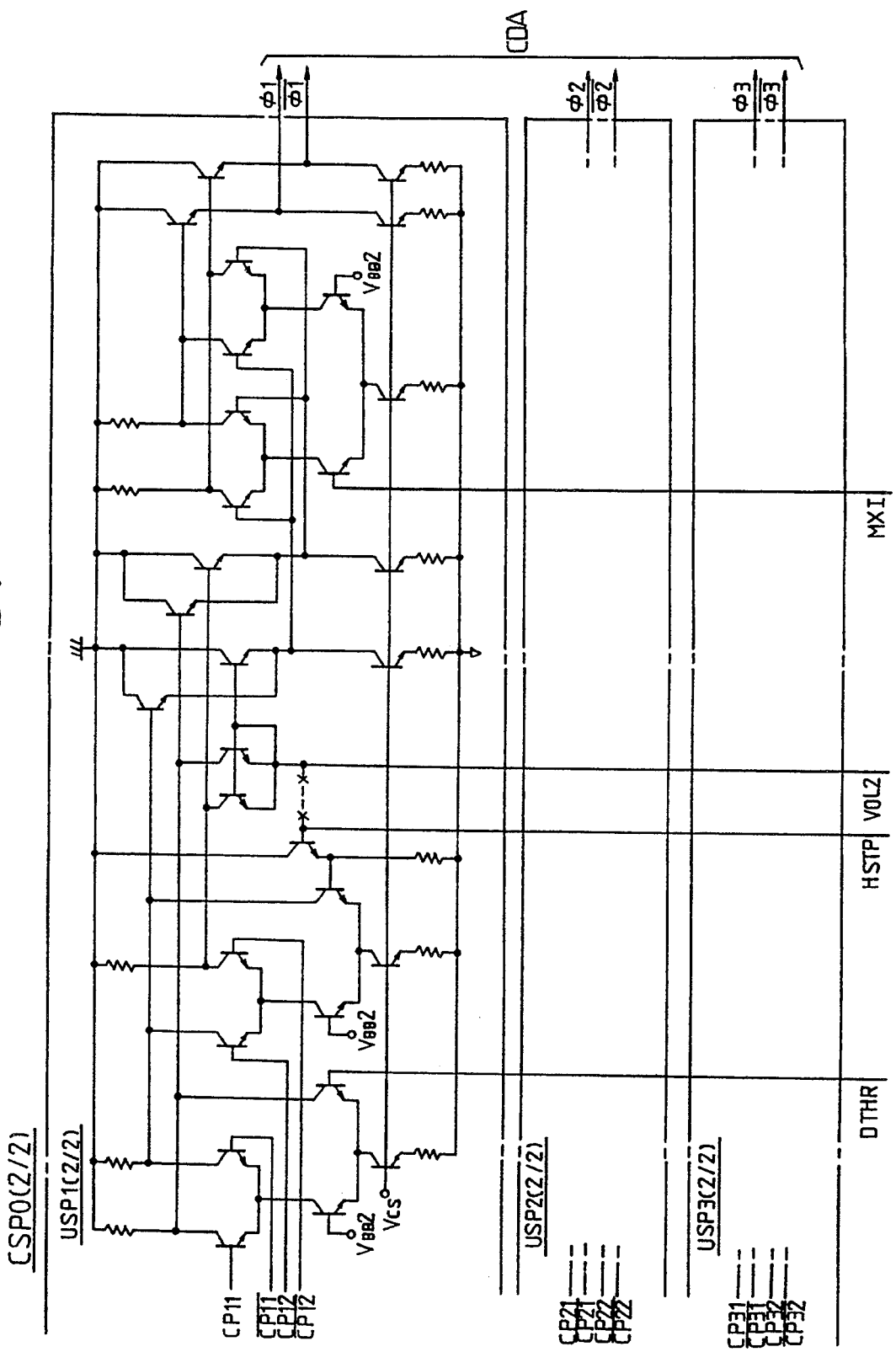

Clock shaping circuits:

FIGS. 33 and 34 are circuit diagrams of the clock shaping circuit CSP 0 as practiced in FIG. 30. The other clock shaping circuits have the same circuit configuration as, but are not limited by, that of the clock shaping circuit CSP 0.

In FIGS. 33 and 34, the clock shaping circuits CSP 0 and CSP 1 each comprise, and are not limited to, three unit shaping circuits USP 1–USP 3 for addressing the complementary clock signals CP 1–CP 3 or CP 4–CP 6, as typically depicted in the clock shaping circuit CSP 0. These unit shaping circuits contain ECL differential circuits as their basic components, as typically depicted in the unit shaping circuit USP 1. Each unit shaping circuit also includes four delay circuits DL 1–DL 4, a pulse composing circuit arrangement, etc.

The clock shaping circuits CSP 0 and CSP 1 adjust the complementary clock signals CP 1–CP 3 or CP 4–CP 6 in terms of setup time and pulse width to generate the required complementary internal clock signals $\phi1-\phi3$ and $\phi4-\phi6$, respectively. As described, these complementary clock signals are transmitted to the clock distribution circuit CDA through the corresponding clock signal lines installed in the dedicated wiring regions, the circuit CDA being located at the center of the semiconductor substrate.

Figure 35:
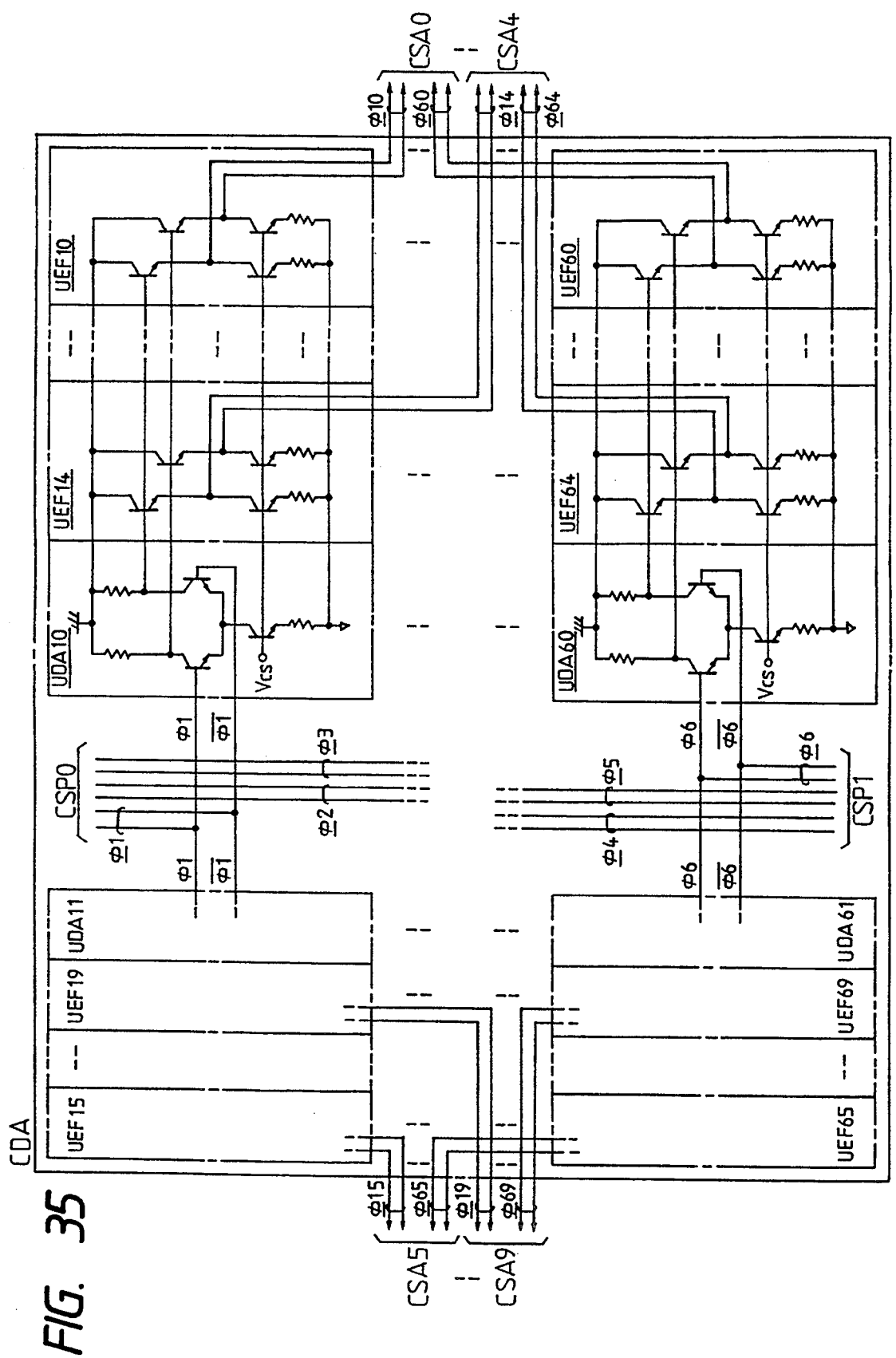
FIG. 35 is a circuit diagram of a clock distribution circuit contained in the clock-related circuits of FIG. 30.

Clock distribution circuit:

FIG. 35 is a circuit diagram of the clock distribution circuit CDA illustratively contained in the clock-related circuits of FIG. 30. In FIG. 35, the clock distribution circuit CDA comprises, and is not limited to, 12 unit distribution circuits UDA 10, UDA 11, UDA 60 and UDA 61, each group of two thereof corresponding to each phase of the complementary internal clock signals $\phi1-\phi6$ coming from the clock shaping circuits CSP 0 and CSP 1, and 60 unit output circuits UEF 10–UEF 19 and UEF 60–UEF 69, each group of 10 thereof corresponding to each phase of the same complementary internal clock signals $\phi1-\phi6$. As illustrated in FIG. 35, the unit distribution circuits UDA 10, UDA 11, UDA 60 and UDA 61 contain, and are not limited to, ECL differential circuits. The unit distribution circuits UEF 10–UEF 19 and UEF 60–UEF 69 are each comprised of a pair of output emitter follower circuits.

The clock distribution circuit CDA causes the complementary internal clock signals $\phi1-\phi6$ to branch by a factor of 10, generating complementary internal clock signals $\phi10-\phi19$ and $\phi60-\phi69$. As described, these complementary internal clock signals are transmitted to the corresponding clock switching amplifiers CSA 0–CSA 9 through the corresponding clock signal lines installed in the dedicated wiring regions.

Figure 36:
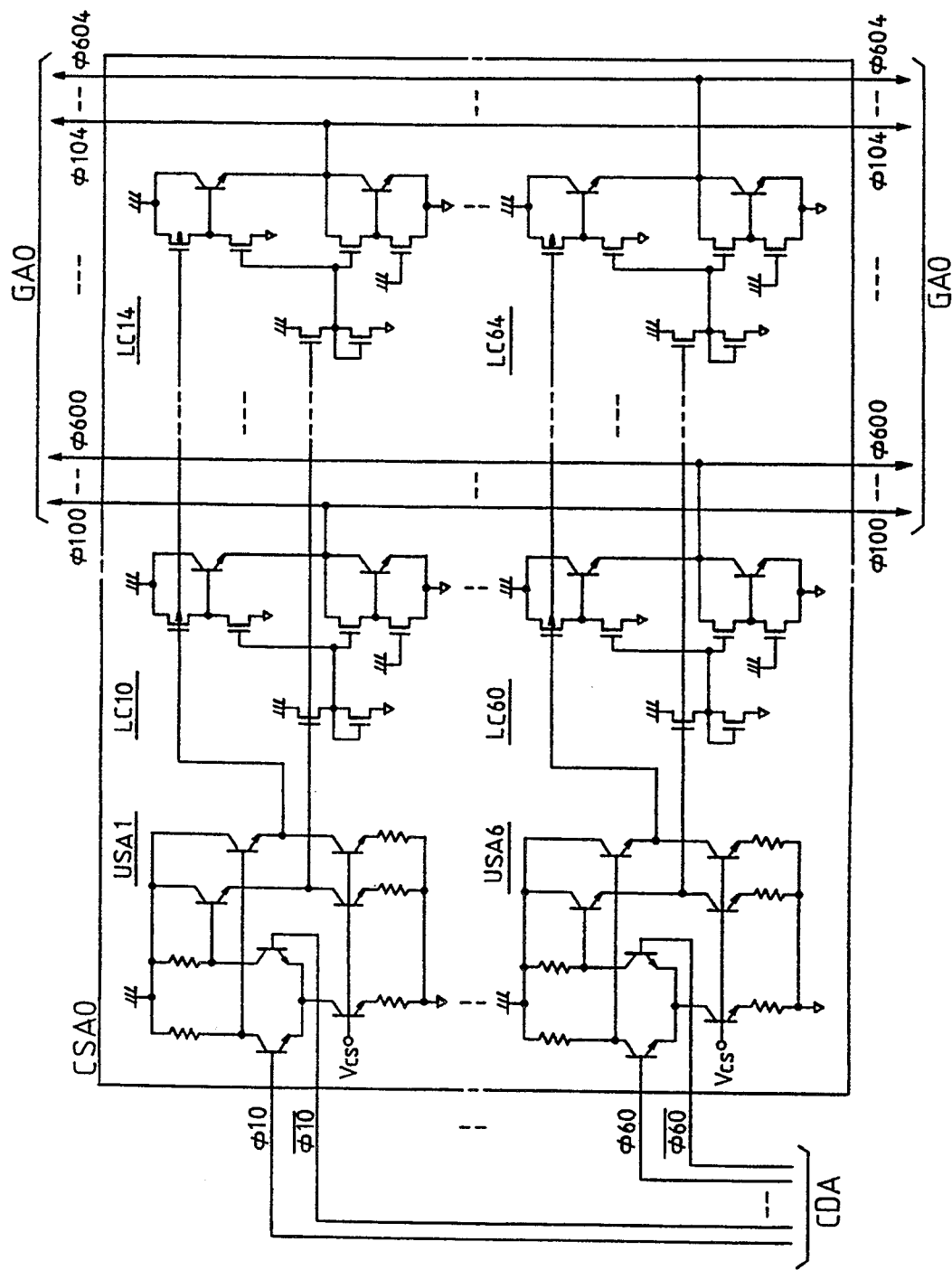
FIG. 36 is a circuit diagram of a clock switching amplifier contained in the clock-related circuits of FIG. 30.

Clock switching amplifiers:

FIG. 36 is a circuit diagram of the clock switching amplifier CSA 0 illustratively contained in the clock-related circuits of FIG. 30. The other clock switching amplifiers CSA 1–CSA 9 have the same circuit configuration as, but is not limited by, that of the clock switching amplifier CSA 0.

As typically shown in the clock switching amplifier CSA 0 of FIG. 36, the clock switching amplifiers CSA 0–CSA 9 contain, and are not limited to, six unit switching amplifiers USA 1–USA 6 corresponding to each phase of the complementary internal clock signals $\phi10-\phi60$, and 30 level conversion circuits LC 10–LC 14 and LC 60–LC 64, each group of five thereof corresponding to these six unit switching amplifiers.

The unit switching amplifiers USA 1–USA 6 comprise, and are not limited to, ECL differential circuits including current switching circuits, as typically shown in the unit switching amplifiers USA 1 and USA 6. The complementary input terminals of these components are supplied with the corresponding complementary internal clock signals $\phi10-\phi60$. The level conversion circuits LC 10–LC 14 and LC 60–LC 64 have the same circuit configuration as, and are not limited by, that of the downstream circuit in the input circuit cell IC 0 of FIG. 7, as shown in FIG. 30. The complementary input terminals of these components are commonly supplied with the complementary output signals of the corresponding unit switching amplifiers USA 1–USA 6.

Using the corresponding complementary internal clock signals $\phi10-\phi60$ and $\phi19-\phi69$, the clock switching amplifiers CSA 1–CSA 9 generate distribution signals $\phi100-\phi104$ and $\phi600-\phi604$ at the MOS level. These distribution signals are supplied to the corresponding gate arrays GA 0–GA 5 or to the corresponding pair of RAM macrocells. Some of the distribution clock signals generated by the clock switching amplifiers CSA 1, CSA 3, CSA 6 and CSA 8 are supplied as clock signals CLK to the write pulse generation circuit WPG of the corresponding pair of RAM macrocells.

Figure 37:
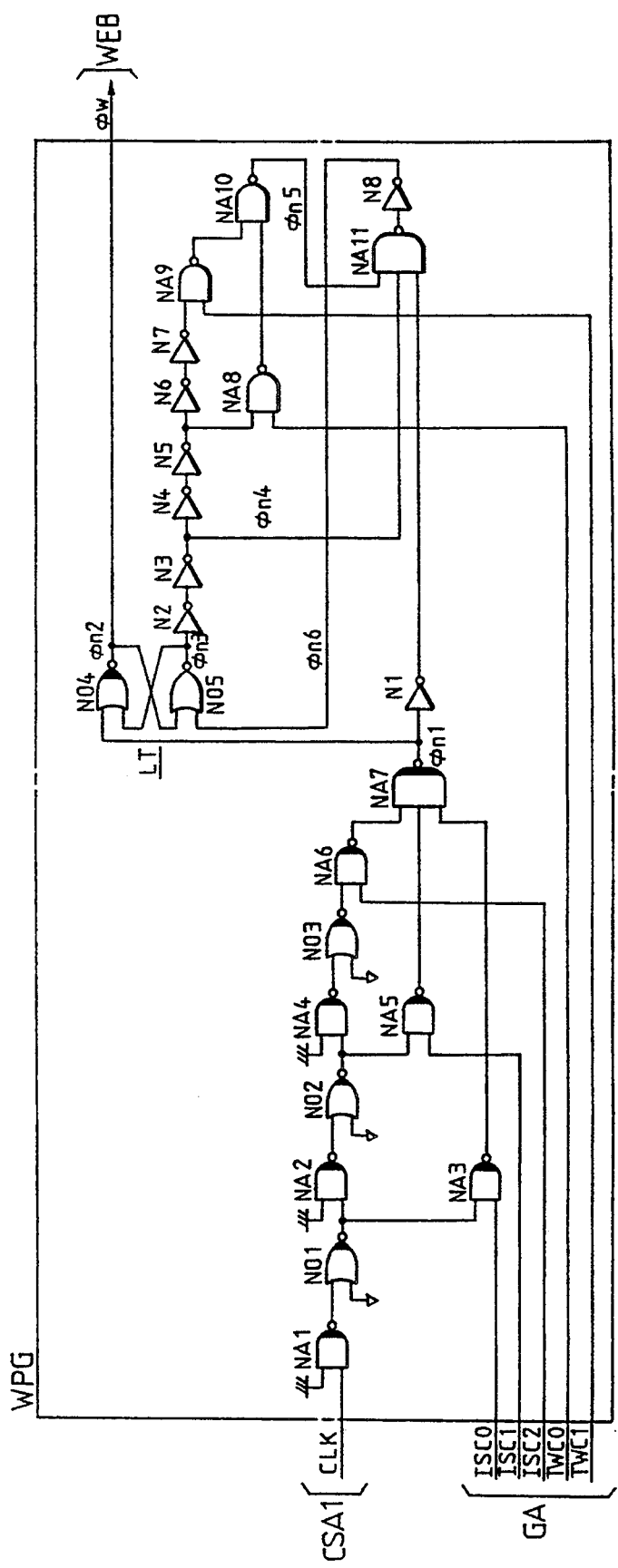
FIG. 37 is a circuit diagram of a write pulse generation circuit contained in the RAM macrocell of FIG. 14.

Write pulse generation circuit:

FIG. 37 is a circuit diagram of the write pulse generation circuit WPG illustratively contained in the RAM macrocell of FIG. 14. As described, the write pulse generation circuit WPG is supplied with clock signals CLK from the corresponding clock switching amplifier CSA 1 and other circuits, with three-bit internal control signals ISC 0–ISC 2, and with two-bit internal control signals TWC 0–TWC 1. These internal control signals are selectively brought High on the ECL level, but not limited thereto, when a plurality of appropriate external terminals of the memory device with logic function are selectively combined and interconnected.

The write pulse generation circuit WPG contains, and is not limited to, 11 NAND gate circuits NA 1–NA 11, five NOR gate circuits NO 1–NO 5, and eight inverter circuits N 1–N 8. Of these circuits, the NAND gate circuits NA 1–NA 7 and NOR gate circuits NO 1–NO 4 take on, but are not limited by, a Bi/CMOS circuit construction; the other NAND gate circuits and NOR gate circuits take on a CMOS circuit construction. Needless to say, each NAND gate circuit doubles as an inverter circuit then one input terminal thereof is connected to the circuit ground potential; each NOR gate circuit also doubles as an inverter circuit when one input terminal thereof is connected to the circuit supply voltage.

In FIG. 37 the clock signals CLK from the corresponding clock switching amplifier CSA 1 and other circuits are consecutively transmitted to, but not limited by, two delay circuits constituted by the NAND gate circuit NA 2, NOR gate circuit NO 2, NAND gate circuit NA 4 and NOR gate circuit NO 3, after passing through a delay circuit constituted by the NAND gate circuit NA 1 and NOR gate circuit NO 1. The output signal from the NOR gate circuit NO 1 is AND'ed with the internal control signal ICS 0 by the NAND gate circuit NA 3, the result being supplied to the third input terminal of the NAND gate circuit NA 7. Likewise, the output signal from the NOR gate circuit NO 2 is AND'ed with the internal control signal ISC 1 by the NAND gate circuit NA 5, the result being supplied to the second input terminal of the NAND gate circuit NA 7. The output signal from the NOR gate circuit NO 3 is AND'ed with the internal control signal ISC 2 by the NAND gate circuit NA 6, the result being supplied to the first input terminal of the NAND gate circuit NA 7.

In the above setup, the delay time of the clock signals CLK is selectively switched by alternatively bringing the internal control signals ISC 0–ISC 2 High, whereby an internal signal $\phi n\ 1$, i.e., the output signal from the NAND gate circuit NA 7, is generated. As will be described later, the switching of the delay time allows the rise timing of a write pulse signal $\phi w$, i.e., setup time, to be selectively changed in accordance with the internal control signals ISC 0–ISC 2.

The output signal of the NAND gate circuit NA 7, i.e., $\phi n\ 1$, is supplied to, but not limited by, the set input terminal of the latch circuit LT comprising the NOR gate circuits NO 4 and NO 5, as well as to the third input terminal of the NAND gate circuit NA 11 past the inverter circuit N 1. The reset input terminal of the latch circuit. LT is supplied with an internal signal $\phi n\ 6$, i.e., the inverted signal of the output signal from the NAND gate circuit NA 11, the inverting being performed by the inverter circuit N 8. In this setup, the latch circuit LT is set when the internal signal $\phi n\ 1$, i.e., clock signal CLK, is brought High, and is reset when the internal signal $\phi n\ 6$ is brought High. Needless to say, when the latch circuit LT is set, two things happen: the inverted output signal thereof, i.e., internal signal $\phi n\ 2$, is brought Low, and the uninverted signal thereof, i.e., internal signal $\phi n\ 3$, is brought High. When the latch circuit LT is reset, the internal signal $\phi n\ 2$ is brought High, and the internal signal $\phi n\ 3$ is brought Low.

The inverted output signal of the latch circuit LT, i.e., internal signal $\phi n\ 2$, is used as, but not limited to, the write pulse signal $\phi w$. As a result, the write pulse signal $\phi w$ is brought High when the latch circuit LT is set, and is brought Low when the latch circuit LT is reset. As described, the write pulse signal $\phi w$ is subjected to gate control provided by the write enable signal buffer WEB based on the write enable signals WE 0–WE 3. The signal is then supplied, along with the corresponding complementary write signals, to the write amplifiers WA 0–WA 7 of the RAM macrocell.

The uninverted output signal of the latch circuit LT, i.e., internal signal $\phi n\ 3$, is consecutively transmitted to, but not limited by, two delay circuits constituted by the inverter circuits N 4, N5, N6 and N7, after passing a delay circuit made up of the inverter circuits N 2 and N 3. The output signal of the inverter circuit N 3, i.e., internal signal $\phi n\ 4$, is supplied to the second input terminal of the NAND gate circuit NA 11. Likewise, the output signal of the inverter circuit N 5 is AND'ed with the internal control signal TWC 0 by the NAND gate circuit NA 8, the result being supplied to one input terminal of the NAND gate circuit NA 10. The output signal of the inverter circuit N 7 is AND'ed with the internal control signal TWC 1 by the NAND gate circuit NA 9, the result being supplied to the other input terminal of the same NAND gate circuit NA 10. The internal signal $\phi n\ 5$, i.e., the output signal of the NAND gate circuit NA 10 is supplied to the first input terminal of the NAND gate circuit NA 11. As described, the output signal of the NAND gate circuit NA 11 is inverted by the inverter circuit N 8, the inverted signal being supplied as the internal signal $\phi n\ 6$ to the reset input terminal of the latch circuit LT.

In the above setup, the internal signal $\phi n\ 6$ is selectively brought High when the internal signal $\phi n\ 1$ is brought Low and the internal signals $\phi n\ 4$ and $\phi n\ 5$ are both brought High. In other words, the signal $\phi n\ 6$ is selectively brought High after the following sequence: that the latch circuit LT is set by bringing the clock signal CLK High, followed by an appropriate delay time designated by the internal control signal TWC 0 or TWC 1, the end of the delay time causing the clock signal CLK to be brought Low. When the internal signal $\phi n\ 6$ is brought High, the latch circuit LT is reset. This action initializes the write pulse generation circuit WPG. As a result, the set timing of the latch circuit LT, i.e., the rise timing of the internal signal $\phi n\ 1$, determines the rise timing of the write pulse signal $\phi w$, i.e., setup time. The period of time between the time the latch circuit LT is set and the time it is reset determines the pulse width of the write pulse signal $\phi w$. The pulse width is selectively switched when the internal control signal TWC 0 or TWC 1 is selectively brought High.

As described, the setup time and pulse width of the write pulse signal $\phi w$ generated by the write pulse generation circuit WPG are selectively switched in accordance with the internal control signals ISC 0–ISC 2 and TWC 0 and TWC 1. In this setup, the skew between the write pulse signal $\phi w$ and the write data supplied to the RAM macrocell is reduced. Thus the speed at which data is written to the memory device with logic function is boosted correspondingly.

Figure 38:
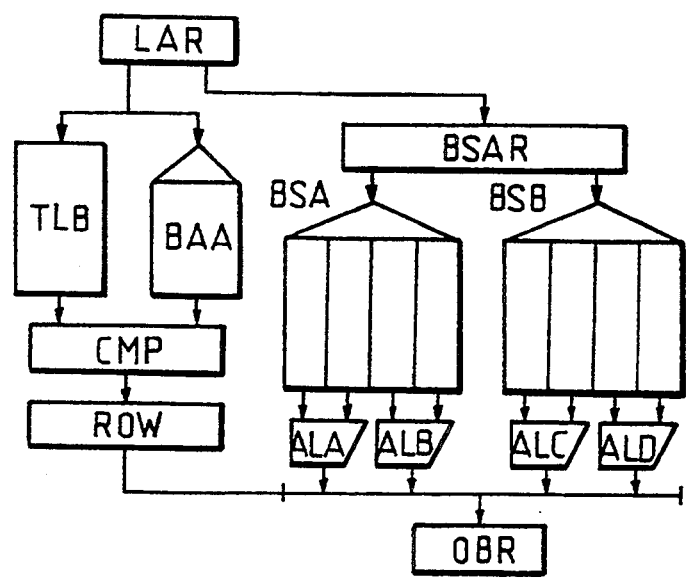
FIG. 38 is a partial block diagram of a central processing unit having buffer storages constituted by the memory devices with logic function shown in FIG. 1.

Application examples of memory device with logic function:

FIG. 38 is a partial block diagram of a central processing unit (CPU) of a computer having buffer storages constituted by the memory device with logic function shown in FIG. 1. FIG. 39 is a partial block diagram of a CPU having buffer storages comprising the prior art memory device with logic function which the inventors of the present invention previously developed. With reference to these two figures, there will be described some examples in which the memory device with logic function according to the present invention is practiced, together with some features associated with such examples.

The CPU of this embodiment comprises, and is not limited to, two pairs of buffer storages BSA and BSB each containing a plurality of memory devices with logic function shown in FIG. 1. These buffer storages temporarily accommodate, but are not limited by, programs, operation data and other software resources needed by the CPU. The CPU first attempts to access these buffer storages that operate at high speeds. If the attempt fails to "hit" what is needed, the CPU then gains access to the main storage that operates at relatively low speeds. As a result, the apparent access time of the storage-related circuits is shortened, and the cycle time of the computer is boosted accordingly.

The CPU of this embodiment operates on, but is not limited by, the virtual storage scheme whereby the address space of the main storage is processed and managed in terms of logical addresses. To implement this feature, the CPU comprises, and is not limited to, an address translator such as an address translation buffer TLB for translating logical addresses of the main storage into actual, i.e., physical addresses thereof.

Furthermore, in accessing the buffer storages BSA and BSB, the CPU must determine whether the stored data corresponding to a specified logical address exists in any of these storages. To implement this feature, the CPU comprises a tag memory BAA. To the tag memory BAA are written physical addresses of the data stored in the buffer storage BSA or BSB. Logical addresses are converted to physical addresses by an address translation buffer TLB which is also provided.

In this embodiment, the tag memory BAA is split into a plurality of units arranged in parallel. The purpose of this arrangement is to make the address space of the tag memory "shallow" so as to shorten the actual access time. Correspondingly, the buffer storages BSA and BSB are each split into a plurality of units arranged in parallel. A physical address from a "hit" unit of the tax memory BAA is compared by a comparator COM with a physical address from the address translation buffer TLB. In case of a match between the two addresses, the data is read from the corresponding unit of the buffer storage BSA or BSB and placed on an internal bus of the CPU. In this respect, the CPU also needs a row selector circuit ROW by which to select data to be output from a plurality of units in the buffer storages BSA and BSB in accordance of the result of the compare operation. Meanwhile, the processing of the CPU is made more efficient by sampling, or providing sequence control over, certain bits of the data read from the buffer storages BSA and BSB. This feature is implemented by use of aligners (sequence control circuits) included in the CPU.

Figure 39:
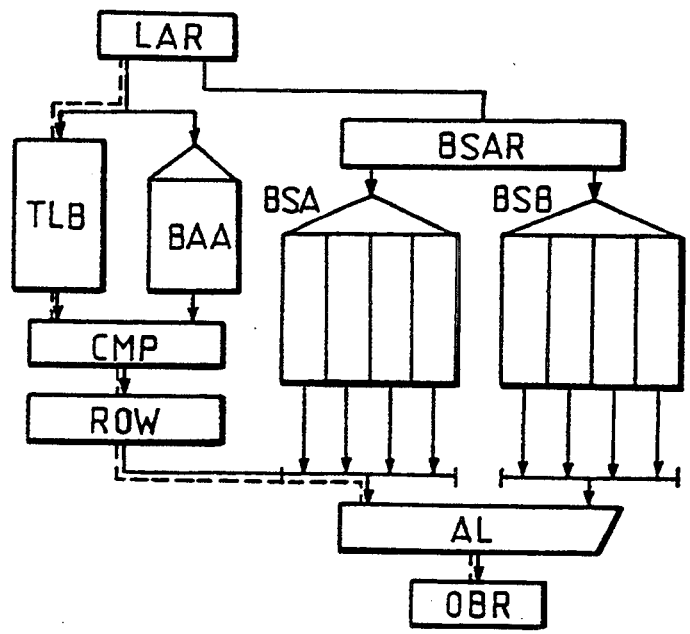
FIG. 39 is a partial block diagram of a typical prior art central processing unit.

In conventional computers, as shown in FIG. 39, the data read from a plurality of units in the buffer storages BSA and BSB is subjected to row selection provided by the row selector circuit ROW that receives the output signal from the comparator COM. The data is then transmitted to the aligner AL for sequence control. Thus in the prior art CPU, the signal path indicated by broken lines in FIG. 39 forms a critical path that restricts the machine cycle of the computer. To circumvent this constraint, as depicted in FIG. 38, the CPU of this embodiment has discrete aligners ALA–ALD located upstream of the row selector circuit ROW and on the same semiconductor substrate that bears the memory device with logic function constituting each buffer storage. The output signals of these aligners are subjected to row selection in accordance with the result of the compare operation by the comparator COM.

In FIG. 38, logical addresses given via the internal bus of the CPU are retained, but not limited, by a logical address register LAR. Part or all of these logical addresses are supplied to the address translation buffer TLB and tag memory BAA, as well as to the buffer storages BSA and BSB via the address register BSAR.

The address translation buffer TLB converts each logical address coming from the logical address register LAR into the corresponding physical address for input to one input terminal of the comparator COM. The tag memory BAA performs read operations on a plurality of units by association using predetermined bits of the logical addresses as the search data. In case of a "hit," the corresponding tag, i.e., the physical address of the data stored in the buffer storage BSA or BSB, is input to the other input terminal of the comparator COM.

The comparator COM compares the physical address from the address translation buffer TLB with the physical address that is output as the tag from the "hit" unit of the tag memory BAA. In case of a match between these addresses, the comparator COM supplies the row selector circuit ROW with a row selection signal for designating the "hit" unit. At this point, the CPU recognizes the hit in the buffer storage and halts its access to the main storage accordingly.

In the meantime, read operations on the buffer storages BSA and BSB continue by use of predetermined bits in the logical addresses, in parallel with the compare operation. Stored data is read from the corresponding addresses in a plurality of units, the data being subjected to sequence control provided by the corresponding aligners ALA–ALD. The output signals of these aligners undergo row selection provided by the row selector circuit ROW and are then placed onto the internal bus of the CPU via an output buffer register OBR. Needless to say, if there is no "hit" between the physical address from the address translation buffer TLB and the physical address from the tag memory BAA, the CPU ignores the data read from the units in the buffer storages BSA and BSB, and proceeds with its access to the main storage.

As described, aligners are installed upstream of the row selector circuit and on the same semiconductor substrate that bears the memory device with logic function constituting the buffer storages BSA and BSB, the aligners selecting certain bits of the data read from the buffer storages for sequence control. This setup optimizes the division of functions in the CPU, shortens the delay time in data transmission of the memory device with logic function including the aligners, and boosts the machine cycle of the computer accordingly.

As embodied in the foregoing, the present invention may be applied to semiconductor integrated circuit devices such as a memory device with logic function, to semiconductor memories such as RAM macrocells included in the memory device, and to digital processors such as computers that use buffer storages comprising the memory device with logic function. These applications yield the following benefits:

(1) RAM macrocells in the memory device with logic function are constructed primarily in the bipolar CMOS RAM form, the gate arrays thereof being comprised of cell units in the bipolar CMOS form. This arrangement retains high operation speeds of the memory device with logic function, reduces the power dissipation thereby, and increases the scale of circuit integration therein.

(2) In connection with the arrangement (1) above, the memory device with logic function has a plurality of RAM macrocells whose total memory capacity is at least 100 kilobits while the gate arrays thereof have at least 4000 gates. This arrangement optimizes the sharing of functions between the computer buffer storage containing the memory device with logic function and other devices, reduces the number of chip-to-chip interconnections, and ensures sufficiently high levels of yield in the production of the memory device or the like.

(3) In connection with the arrangements (1) and (2) above, sequence control circuits constituting aligners or the like are provided inside the memory device with logic function. This arrangement shortens the delay time in actual data transmission of buffer storages containing the memory device, and optimizes the sharing of functions between the devices involved.

(4) The arrangement (3) above further provides a benefit of shortening the critical path of the computer containing the buffer storages, thereby boosting the machine cycle of the computer.

(5) In connection with the arrangements (1) through (4) above, the logic circuits in the memory device with logic function are constructed by selectively combining CMOS, bipolar CMOS or ECL gate circuits depending on the output load capacity, transmission characteristic requirement, power dissipation, and required layout area. This arrangement increases the operation speed of the memory device with logic function, lowers the power dissipation thereby and increases the scale of circuit integration therein.

(6) In connection with the arrangements (1) through (5) above, the level of input and output signals going to and coming out of the memory device with logic function is set to the ECL level, and the level of the signals transmitted inside the memory device is selectively set to either the ECL level or the MOS level depending on the local circuit configuration and transmission characteristic requirement. This arrangement optimizes the way the signals are handled in conjunction with the memory device with logic function, increases the operation speed thereof, and lowers the power dissipation thereby.

(7) In connection with the arrangement (6) above, suitable shielding wires including a supply voltage line or a ground potential line are installed between a signal line on which internal signals are transmitted at the ECL level and another signal line on which the signals are transmitted at the MOS level. This arrangement suppresses the noise that may be induced in the ECL-level internal signals by fluctuations in the MOS-level internal signals, thereby stabilizing the operation of the memory device with logic function.

(8) In connection with the arrangement (1) through (7) above, the memory device with logic function has a diagnostic latch circuit which receives the output signals of the sequence control circuits according to a predetermined clock signal and scans the signals out via suitable external terminals. This arrangement enhances the ability of the memory device with logic function comprising a plurality of RAM macrocells to be diagnosed with more ease and efficiency.

(9) The memory device with logic function having a plurality of RAM macrocells is equipped with the capability to simultaneously place in unselected state all word lines of all RAM macrocells in accordance with an appropriate test control signal. This arrangement also enhances the ability of the memory device to be diagnosed.

(10) In the memory cell having RAM macrocells and gate arrays, the clock-related circuits for transmitting clock signals to the RAM macrocells are provided apart from the clock-related circuits for transmitting clock signals to the gate arrays. This arrangement optimizes the configuration of the clock-related circuits in the memory device with logic function, and boosts the operation speed of the device.

(11) In connection with the arrangement (10), the clock signals supplied at the ECL level to the memory device with logic function are transmitted and distributed therein with their ECL level unchanged, until the signals are converted to the MOS level at the receiving ends of the RAM macrocells and gate arrays. This arrangement shortens the delay time in transmitting the clock signals and reduces the skew thereof.

(12) In connection with the arrangement (11) above, the signal lines over which the clock signals are transmitted are installed in dedicated wiring regions, and the clock-related circuits for transmitting the clock signals are constituted by dedicated embedded circuits. This arrangement further shortens the delay time in transmitting the clock signals and reduces the skew thereof.

(13) The arrangements (11) and (12) above further provide a benefit of boosting the operation speed of the memory device with logic function and stabilizing the operation thereof.

(14) A write pulse generation circuit is equipped with the capability to selectively switch the setup time and pulse width of write pulses according to a predetermined control signal, the circuit generating the write pulses by which to write data to RAM macrocells in accordance with a suitable clock signal. This arrangement makes it possible to adjust the setup time and pulse width of the write pulses according to the delay time of write data transmission and other factors. Accordingly, the write operation to the RAN macrocells is stabilized at high speed.

(15) The RAM macrocells, equipped with read amplifiers which are made up of ECL differential circuits and which simultaneously output multiple bits of stored data at the MOS level, has parity check circuits which receive the output signals of the read amplifiers and which are constituted by ECL differential circuits. This arrangement implements RAM macrocells and a memory device with logic function incorporating parity check circuits without the constraint of an appreciably increased delay time in data transmission.

(16) In connection with the arrangement (15) above, the output signals of the parity check circuits are formed and output in units of eight bits. This arrangement provides byte-by-byte diagnostic processing on the data read from the RAM macrocells and other circuits.

(17) In connection with the arrangements (15) and (16), output control over the read data based on block selection signals or the like is provided by selectively activating output control transistors in the ECL differential circuits of the read amplifiers using the block selection signals or the like. This arrangement reduces the number of logic stages required in the read-related circuits, and boosts the operation speed of the memory device with logic function accordingly.

(18) In RAM macrocells constituted by memory arrays including a plurality of complementary data lines and by a Y switching circuit for selectively connecting these complementary data lines to sense amplifiers or the like, there is provided a pull-up circuit between the memory arrays and the Y switching circuit, the pull-up circuit supplying an appropriate bias voltage to the complementary data lines. This arrangement increases the speed of pull-up operations on each complementary data line, thereby enhancing the operation speed of the RAM macrocells.

(19) In connection with the arrangement (18) above, the output terminals of the sense amplifiers take on the so-called connection logic form each, and there are provided a plurality of adjoining pairs of memory mats which are selectively activated. This arrangement shortens the average length of interconnecting lines between the memory mats, thereby reducing the required layout area of the RAM macrocells.

As described above, many apparently different embodiments of the present invention may be made without departing from the spirit and scope thereof. Thus it is to be understood that the invention is not limited to the specific embodiments thereof except as defined in the appended claims. Some alternatives are outlined below.

For example, in FIG. 1, the number of RAM macrocells to be included in the memory device with logic function may be varied. The memory capacity of the RAM macrocells, the number of cell units in the gate arrays GA, and the number of input/output circuit cell units in the input/output circuit cell section I/O are also variable. The embodiment described poses no specific constraint on the layout of the RAM macrocells, gate arrays GA, input/output circuit cell section I/O, and clock shaping circuits CSP 0 and CSP 1.

In FIGS. 4 and 5, the number of input and output circuit cells constituting the input/output circuit cell unit IOCU and the combination of these cells may be varied. It is not mandatory to integrate the input and output circuit cells into an input/output circuit cell unit; the cells may be installed individually. The bonding pads PADs may be located at the center of the semiconductor substrate SUB. The construction of the input circuit cell IC 0 in FIGS. 6 and 7, and that of the output circuit cell OC 0 in FIG. 8 and 9, may take on many other forms of embodiment.

In FIGS. 10 and 11, the embodiment described poses no specific constraint on the number and combination of circuit elements constituting the cell unit GCU in the gate arrays GA. The layout of the circuit elements may be varied, and the combination of MOSFETs to be connected beforehand is also variable. In FIGS. 14 and 15, the specific construction and combination of memory mats and memory arrays in the RAM macrocells may take on many other forms of embodiment.

In FIG. 17, the layout of the circuits constituting the RAM macrocells is not restricted by the embodiment described. In FIG. 18, the memory array ARY 0 may have redundant word lines and redundant complementary data lines, and may comprise memory cells other than those the high resistance load type. The specific construction of circuits in the memory array and memory mat integrated circuit MPC 00 may take on many other forms of embodiment. In FIG. 19, the construction of the read amplifier RA 0 and others and the logic level of the signals involved may be varied.

In FIG. 20, the combination of read signals that are input to the unit parity check circuits may be varied. It is not mandatory for the parity check circuits to perform checks in units of eight bits. In FIG. 21, the specific construction of the unit parity check circuit UPC 10 and other circuits may be varied, and the level of the output signals therefrom may be switched as needed.

In FIG. 22, the level conversion circuit LC 0 may take on other forms of circuit configuration. In FIGS. 23 and 24, the aligners ALN 0–ALN 2 may perform sequence control on all read data. It is not mandatory to install in the aligners the diagnostic latch circuit for scanning out the read data.

In FIG. 25, the circuit configuration of the X address decoder XD may be varied. Unselected-state control on all word lines based on the test control signal TCS may be taken over by, say, the word line driving circuit WD. The constructions of the data input buffer DIB and data output buffer DOB shown in FIGS. 26, 27 and 29 are only examples.

In FIGS. 30 and 31, the embodiment described poses no specific constraint on the number, combination and layout of components constituting the clock-related circuits. The number of phases for the clock signals supplied to the memory device with logic function, as well as the number of phases for other clock signals used by various circuits inside, may be varied. The constructions of the clock shaping circuit CSP 0, clock distribution circuit CDA and clock switching amplifier CSA 0 shown in FIGS. 33 through 36 may take on many other forms of embodiment.

In FIG. 37, the write pulse generation circuit WPG may take on other forms of circuit configuration. The number of bits in the internal control signal for switching the setup time and pulse width of the write pulses may be varied. In FIG. 38, the embodiment described poses no specific constraint on the construction of the buffer storages of the CPU and the peripheral circuits involved.

The foregoing description has highlighted alternative embodiments in which the present invention is primarily applied to the memory device with logic function and to the computer having buffer storages comprising the memory device, the device stemming from the related art which provided the background of the invention. However, the present invention is not limited to such alternatives alone. The invention may also be applied to dedicated logic integrated circuit devices containing similar RAM macrocells and to various processors comprising memory devices with logic function. In other words, the invention may be applied to semiconductor integrated circuit devices having at least RAM macrocells and logic circuits and to digital processors comprising such semiconductor integrated circuit devices.

Typical arrangements and major benefits of the invention as disclosed herein are summarized as follows: In a semiconductor integrated circuit device comprising a memory device with logic function, there are provided a plurality of RAM macrocells containing bipolar CMOS RAMs with a total memory capacity of at least 100 kilobits, and gate arrays which take on the bipolar CMOS form and which have at least 4000 gates. The logic circuits in the memory device with logic function are constructed by selectively combining CMOS, bipolar CMOS or ECL gate circuits depending on the output load capacity, transmission characteristic requirement, power dissipation, and required layout area. The level of signals at various circuits is selectively set to the ECL level or MOS level depending on the local circuit configuration and other factors. Furthermore, the memory device with logic function incorporates sequence control circuits to be installed downstream of buffer storages of the computer. The advantages of these arrangements are numerous: optimizing the circuit configuration and signal format while maintaining the high-speed operation of the memory device with logic function; reducing the power dissipation by the memory device; boosting the scale of circuit integration in the memory device; reducing the delay time in data transmission of the buffer storages; and enhancing the machine cycle of the computer having the buffer storages.

What follows is a more detailed description of the cell unit GCU and unit cells GC 0–GC 3 illustrated in FIGS. 10 through 13. In the description that follows, the cell unit GCU is referred to as the basic block 4, and the unit cells GC 0–GC 3 are called the basic cells. 4 A, 4 B, 4 C and 4 D, respectively.

Figure 40:
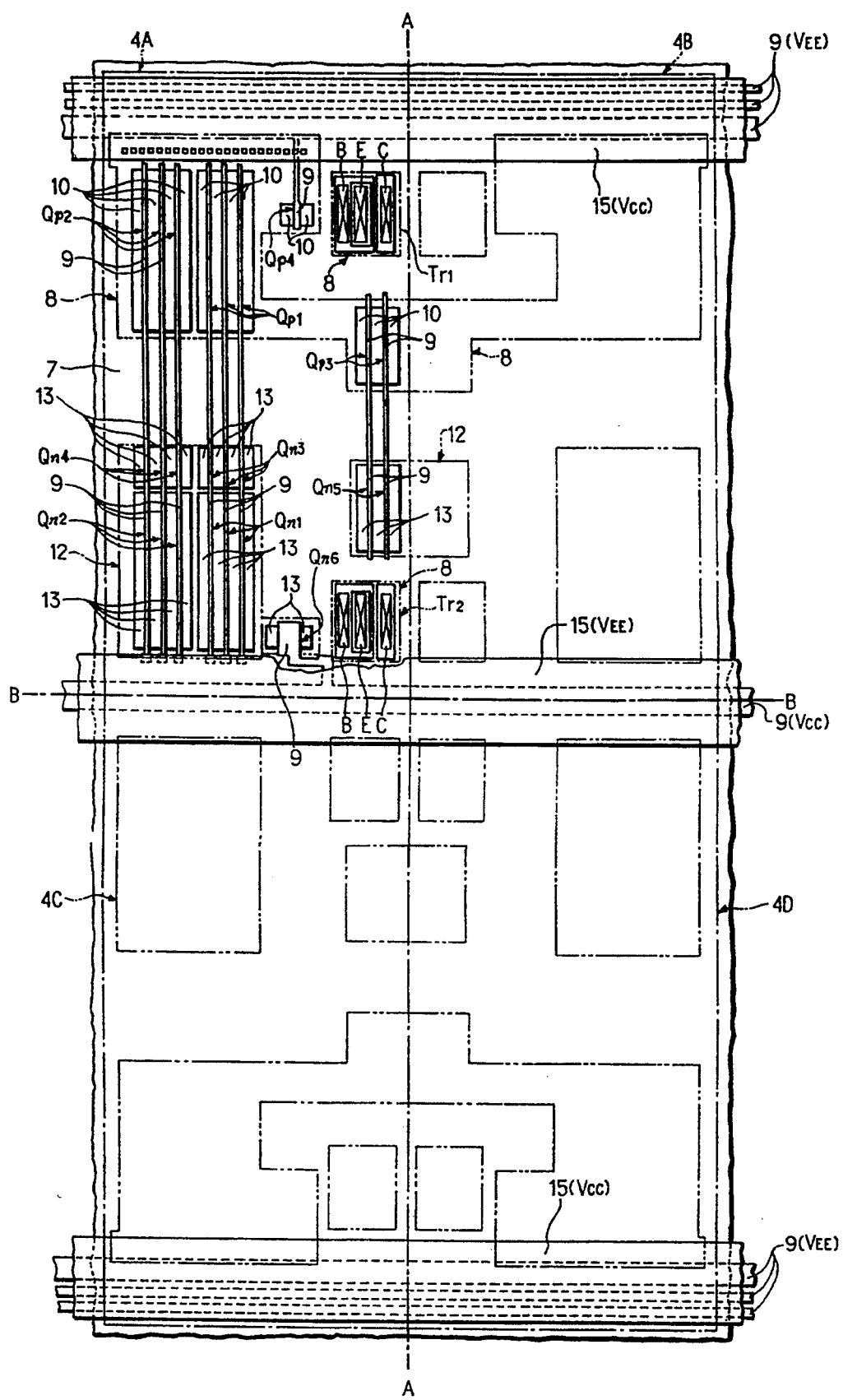
FIGS. 40 through 45 are views describing in more detail the cell unit shown in FIGS. 10 through 13.

FIG. 40 is a partial plan view showing a detailed construction of the basic block 4. As illustrated in FIG. 40, the basic block 4 comprises four basic cells, 4 A 4 B, 4 C and 4 D. Of these basic cells, the cell 4 A contains P-channel MISFETs, N-channel MISFETs and bipolar transistors.

The P-channel MISFETs are comprised of three P-channel MISFETs $Qp_1$, three P-channel MISFETs $Qp_2$, two P-channel MISFETs $Qp_3$, and one P-channel MISFET $Qp_4$. The N-channel MISFETs are made up of three N-channel MISFETs $Qn_1$, three N-channel MISFETs $Qn_2$, three N-channel MISFETs $Qn_3$, three N-channel MISFETs Qn4, two N-channel MISFETs Qn5, and one N-channel MISFET Qn6. The bipolar transistors are comprised of a bipolar transistor Tr1 and a bipolar transistor Tr2. That is, the basic cell 4 A is a mixed cell containing complementary MISFETs (CMOSs) and bipolar transistors.

The P-channel MISFETs Qp1–Qp4 are each formed on the principal plane of an N-type well region 8 inside an active domain surrounded by a field insulation film 7. The P-channel MISFETs Qp1–Qp3 are each constituted by an N-type well region (channel forming region) 8, a gate insulation film, a gate electrode 9, and a pair of P-type semiconductor regions 10 representing a source and a drain region. The P-channel MISFET Qp4, like the P-channel MISFETs Qp1–Qp4, are each constituted by the N-type well region 8, gate insulation film, gate electrode 9, and a pair of P-type semiconductor regions 10 representing the source and drain regions. The N-channel MISFETs Qn1–Qn6 are each formed on the principal plane of a P-type well region 12 inside the active domain surrounded by the field insulation layer 7. The N-channel MISFETs Qn1–Qn5 are each constituted by the P-type well region (channel forming region) 12, gate insulation film, gate electrode 9, and a pair of N-type semiconductor regions 13 representing the source and drain regions. The N-channel MISFET Qn6, like the N-channel MISFETs Qn1–Qn5, is comprised of the N-type well region 12, gate insulation film, gate electrode 9, and a pair of N-type semiconductor regions 12 representing the source and drain regions. The bipolar transistors Tr1 and Tr2 are each formed on the principal plane of the N-type well region 8 inside the active domain surrounded by the field insulation film 7. Each of the bipolar transistors Tr1 and Tr2 is formed in an NPN construction comprising an N-type emitter region E, a P-type base region B and an N-type collector region C, the transistors being oriented in the vertical direction.

The P-channel MISFETs Qp1–Qp3 in the basic cell 4 A each integrally form and serially connect one side of the semiconductor regions 10 adjacent in the gate length direction. Likewise, the N-channel MISFETs Qn1–Qn5 each integrally form and serially connect one side of the semiconductor regions 13 adjacent in the data length direction.

As depicted in FIG. 40 the basic cell 4 B has the same construction as that of the basic cell 4 A, being a mirror image formed around line A—A which is the axis of symmetry. The basic cell 4 C also has the same construction as that of the basic cell 4 A, being a mirror image formed around line B—B as the axis of symmetry. Similarly, the basic cell 4 D has the same construction as that of the basic cell 4 A, being a mirror image formed around line A—A as the axis of symmetry. That is, the basic block 4 is constituted by the four basic cells 4 A, 4 B, 4 C and 4 D having the same construction (i.e., the same cell pattern).

The electrodes (terminals) of each of the P-channel MISFETs, N-channel MISFETs and bipolar transistors making up the basic cells 4 A–4 D are primarily connected by connection wiring 15 (intra-basic cell wiring) formed during manufacture of the first-layer wiring. Interconnecting suitable elements inside the basic cells 4 A–4 D constructs appropriate logic circuits or a part thereof. For example, in the case of a three-layer wiring construction (with aluminum alloy wiring), the logic circuits are interconnected by one or a combination of three kinds of connections: the connections formed during manufacture of the first-layer wiring extended in the column direction on a wiring region 6; the connections formed during manufacture of the second-layer wiring extended in the row direction on the basic block 4 and wiring region 6; and the connections formed during manufacture of the third-layer wiring extended in the column direction on the basic block 4 and wiring region 6.

Power lines 15 are extended in the column direction in the top, middle and bottom portions of the basic block 4 comprising the basic cells 4 A–4 D. The power lines 15 are comprised of an operating power line $V_{CC}$ and a reference power line $V_{EE}$. The operating power line $V_{CC}$ and reference power line $V_{EE}$ illustratively carry a circuit operating voltage of 5 V and a circuit ground voltage of 0 V, respectively. The power line 15 extended in the top and bottom portions of the basic block 4, i.e., close to the P-channel MISFETs, is the operating power line $V_{CC}$. The power line 15 extended in the middle portion of the basic block 4, i.e., close to the N-channel MISFETs, is the reference power line $V_{EE}$. The power lines 15 extended in the top, middle and bottom portions of the basic block 4 are formed during manufacture of the wiring in the first layer, which is the same layer comprising the connections of the elements in the basic cells 4 A–4 D. These power lines 15 primarily supply power to the elements in the basic cells 4 A–4 D.

In the top, middle and bottom portions of the basic block 4, power lines 9 are extended under the above-mentioned power lines 15. The power line 9 extended in the top and bottom portions of the basic block 4, i.e., close to the P-channel MISFET Qn4, is a reference power line $V_{EE}$. The power line 9 extended in the middle portion of the basic block 4, i.e., close to the N-channel MISFET Qn6, is an operating power line $V_{CC}$. These power lines 9 are formed with the same gate layer (e.g., polysilicon film) comprising the gate electrode of each MISFET in the basic cells 4 A–4 D, and are located in a wiring layer below and different from the one containing the power lines 15. The reference power line $V_{EE}$ of the power lines 9 primarily supplies the reference potential $V_{EE}$ to the gate electrode 9 of each P-channel MISFET Qp4 in the basic cells 4 A–4 D; the operating power line $V_{CC}$ principally supplies the operating potential $V_{CC}$ to the gate electrode 9 of each N-channel MISFET Qn6 in the basic cells 4 A–4 D. These power lines 9 are overlaid with the power lines 15 that carry different levels of potential.

Figure 41:
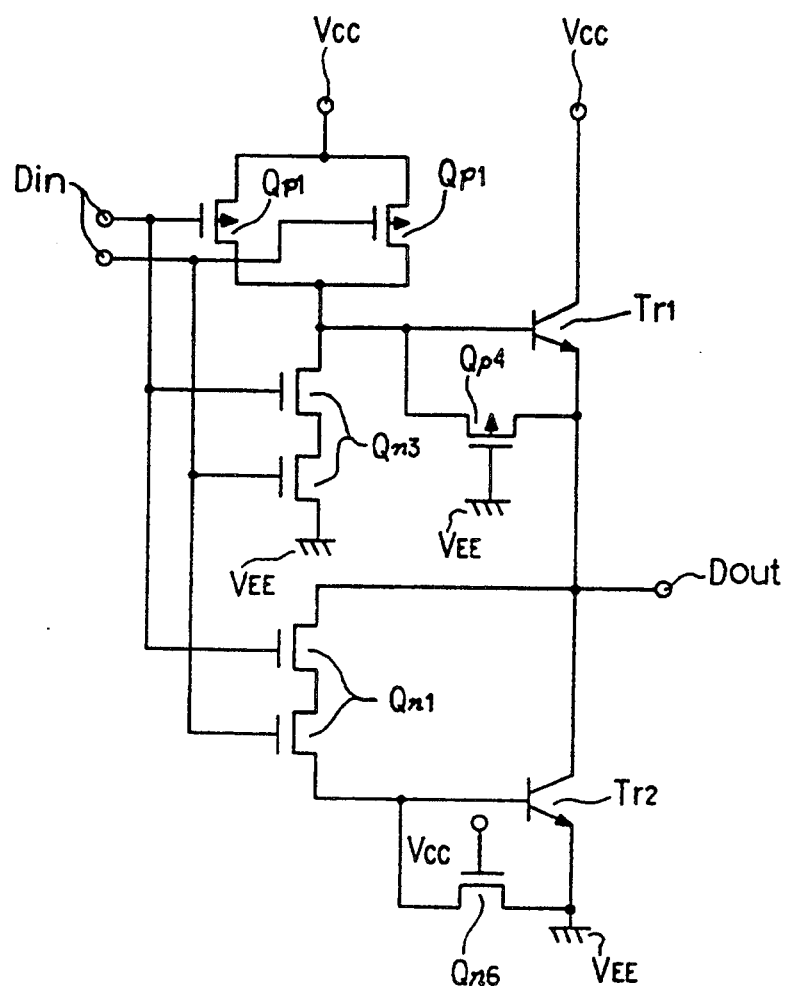
Figure 42:
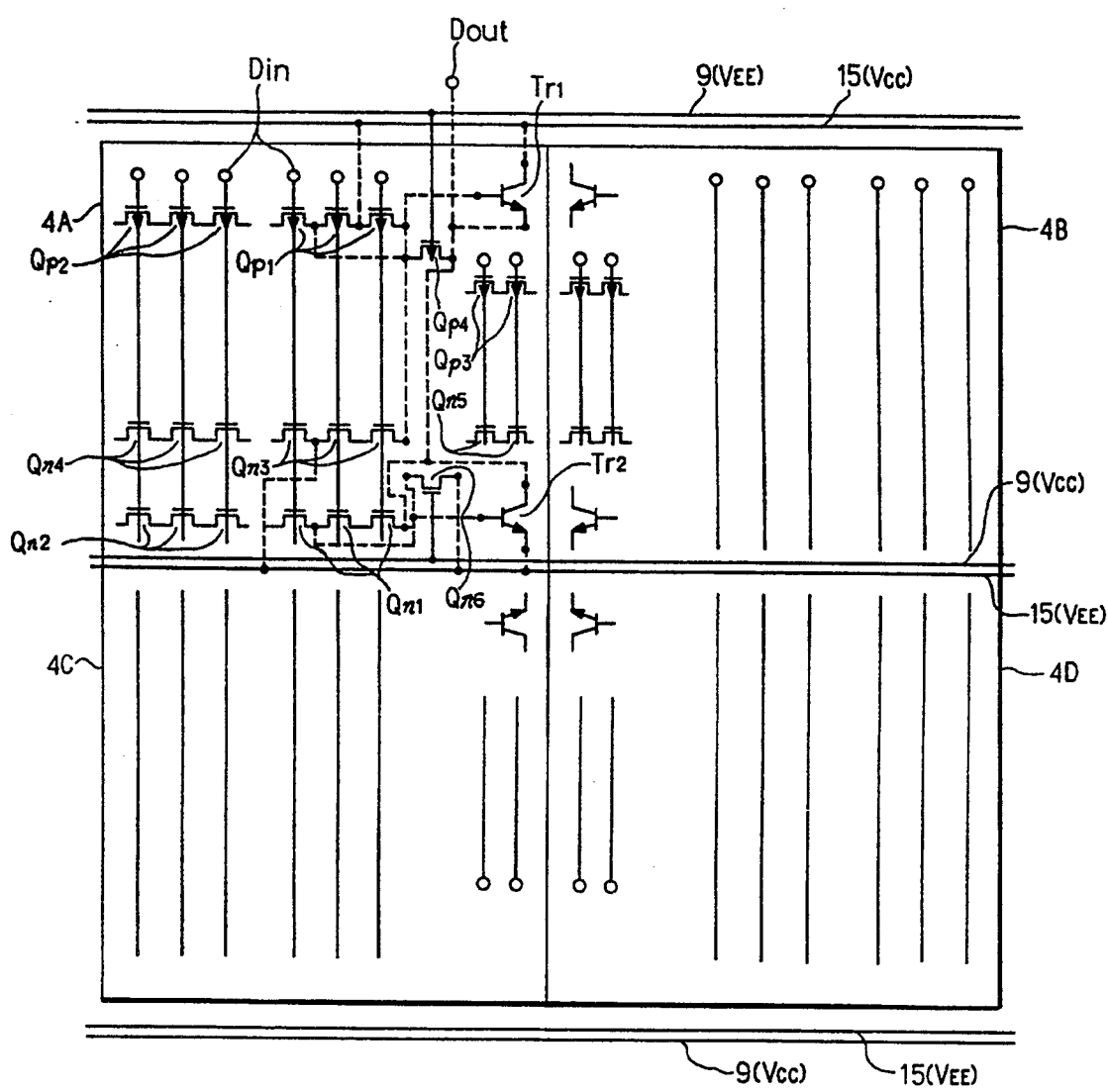

Constructed as described above, the basic block 4 may be expressed in a circuit diagram format shown in FIG. 42 (a circuit diagram corresponding to the basic block). In this circuit diagram, a two-input NAND gate circuit depicted in FIG. 41 (logic circuit diagram) is illustratively laid out.

As shown in FIGS. 41 and 42, the two-input NAND gate circuit comprises an input stage circuit and a totem pole type output stage circuit. The input stage circuit contains two P-channel MISFETs Qp1, two N-channel MISFETs Qn3, and two N-channel MISFETs Qn1. The totem pole type output stage circuit comprises a bipolar transistor Tr1 constituting a charging path, and a bipolar transistor Tr2 constituting a discharging path. The emitter of the bipolar transistor Tr1 is connected to the collector of the bipolar transistor Tr2, the emitter and collector constituting an output node. The bipolar transistors Tr1 and Tr2 are interposingly installed between operating power line $V_{CC}$ 15 and reference power line $V_{EE}$ 15.

A P-channel MISFET $Qn_4$ is located between base and emitter of the bipolar transistor $Tr_1$. The source and drain of the P-channel MISFET $Qp_4$ are connected to the base and emitter of the bipolar transistor $Tr_1$, respectively. As depicted in FIG. 40, the gate electrode 9 of the P-channel MISFET $Qn_4$ is extended in the gate width direction and directly connected to the reference power line $V_{EE}$ of the power lines 9. Because the gate electrode 9 and the reference power line $V_{EE}$ are formed in the same conductive layer, they may be connected free from constraints that may otherwise be imposed by the connections inside the basic cells. An N-channel MISFET $Qn_6$ is located between base and emitter of the bipolar transistor $Tr_2$. The source and drain of the N-channel MISFET $Qn_6$ are connected to the emitter and base of the bipolar transistor $Tr_2$, respectively. The gate electrode of the N-channel MISFET $Qn_6$ is extended in the gate width direction and directly connected to the operating power line $V_{CC}$ of the power lines 9. Because the gate electrode 9 and the operating power line $V_{CC}$ are both formed in the same conductive layer, they may also be connected free of constraints attributable to the connections inside the basic cells.

The P-channel MISFET $Qn_4$ and N-channel MISFET $Qn_6$ are used as high-resistance elements that remain on. These elements are capable of bringing to full amplitude an output level signal, i.e., the charging and discharging voltage that develops in the output node of the totem pole type output stage circuit. Because the P-channel MISFET $Qp_4$ and N-channel MISFET $Qn_6$ have low concentration of impurities in their channel forming regions, a sheet resistivity of as high as 800 to 1000 $\Omega/\square$ is typically available. Small areas measuring 5 $\mu m$ in gate width and 4 $\mu m$ in gate length afford resistivities as high as 17–20K$\Omega$.

As described, in the semiconductor integrated circuit device 1 operating on the gate array scheme, the P-channel MISFET $Qp_4$ is inserted as a high-resistance element between base and emitter of the bipolar transistor $Tr_1$, and the N-channel MISFET $Qn_6$ is inserted as a high-resistance element between base and emitter of the bipolar transistor $Tr_2$, the two bipolar transistors constituting the totem pole type output stage circuit. This setup brings to full amplitude the output signal level that develops in the output node of the totem pole type output stage circuit. The setup also reduces the area occupied by the high-resistance elements, and enhances the scale of circuit integration in semiconductor devices accordingly.

In the related art, the sheet resistivity of the diffused resistor used in the ECL circuit is conventionally set for about 500 $\Omega/\square$. The high resistance element inserted between base and emitter of each of the bipolar transistors constituting the totem pole type output stage circuit needs to have a resistivity of about 20K$\Omega$. When these high resistance elements are implemented in a diffused resistor used in an ECL circuit set for about 500 $\Omega/\square$ in sheet resistivity, the area occupied by these elements amounts to as wide as $4 \times 8 \mu m^2$. The increased high-resistance element area results in smaller scales of circuit integration in prior art semiconductor integrated circuit devices. By contrast, use of the above-described method according to the invention increases the scale of circuit integration in semiconductor integrated circuit devices, particularly the scale of gate array integration.

The gate electrode 9 of the P-channel MISFET $Qn_4$ is directly connected to the reference power line $V_{EE}$ of the power lines 9 in the same gate layer comprising the gate electrode. The gate electrode 9 of the N-channel MISFET $Qn_6$ is directly connected to the operating power line $V_{CC}$ of the power lines 9 in the same gate layer containing the gate electrode. Accordingly, the gate electrodes 9 are connected to the power lines 9 in a gate layer different from the first-layer wiring comprising the connections of the elements in the basic cells 4 A-4 D (intra-basic cell connections). This arrangement eliminates redundancy from the connections in the basic cells (i.e., no wiring needed to circumvent the connections between gate electrode 9 and power line 9), reduces the area occupied by the basic block 4, and enhances the scale of circuit integration in semiconductor integrated circuit devices accordingly.

In addition, the power lines 9 and 15 extended in the top, middle and bottom portions of the basic block 4 may be overlaid with one another at different levels of potential to create a smoothing capacitor between operating power line $V_{CC}$ and reference power line $V_{EE}$. The smoothing capacitor arrangement lowers the power noise, and improves the electrical reliability of semiconductor integrated circuit devices accordingly.

The above-described constructions and their typical features are summarized as follows:

(1) In a semiconductor integrated circuit device having a totem pole type output stage circuit between operating potential and reference potential, there are provided a P-channel MISFET between base and emitter of a bipolar transistor forming a charging path, and an N-channel MISFET between base and emitter of another bipolar transistor forming a discharging path, the two paths constituting the output stage circuit.

(2) In a semiconductor integrated circuit device comprising a plurality of regularly arranged basic cells having a totem pole type output stage circuit between operating potential and reference potential, the device operating on the gate array scheme in which the elements of the basic cells as well as the cells themselves are interconnected, there are provided a P-channel MISFET between base and emitter of a bipolar transistor forming a charging path, an N-channel MISFET between base and emitter of another bipolar transistor forming a discharging path, the two paths constituting the output stage circuit of the basic cells, and operating and reference power lines which supply power to the basic cells and which are formed in a wiring layer different from the one containing the wiring connecting the elements in the basic cells, the operating power line being connected to the gate of the N-channel MISFET in the output stage circuit, the reference power line being connected to the gate of the P-channel MISFET.

(3) The above-described operating power line is overlaid with the reference power line formed in the same wiring layer containing the wiring connecting elements in the basic cells, the reference power line being overlaid with another operating power line formed in the same wiring layer comprising the wiring also connecting elements in the basic cells.

In the arrangement (1) above, the P-channel MISFET and N-channel MISFET may each be used as a high resistance element having a resistivity of about 17K/$\Omega$ for an area of about 20 $\mu m$ consisting of 5 $\mu m$ of gate width and 4 $\mu m$ of gate length. As a result, the area occupied by such high resistance elements is reduced, and the scale of circuit integration in semiconductor integrated circuit devices is enhanced accordingly.

In the arrangement (2) above, the wiring that connects the gate of the P-channel MISFET to the reference power line and the wiring that connects the N-channel MISFET to the operating power line are located away from the layer of wiring that connects the elements in the basic cells. This enhances the degree of freedom in connecting the elements in the basic cells (i.e., redundant connections eliminated) and boosts the scale of circuit integration in semiconductor integrated circuit device accordingly.

In the arrangement (3) above, the operating and reference power lines may be overlaid with one another to create a smoothing capacitor between operating potential and reference potential. The smoothing capacitor absorbs the power noise and boosts the electrical reliability accordingly.

What follows is a more detailed description of the smoothing capacitor described above with reference to FIGS. 40 through 42. The description that follows will be made with particular reference to FIGS. 43 through 45.

Figure 43:
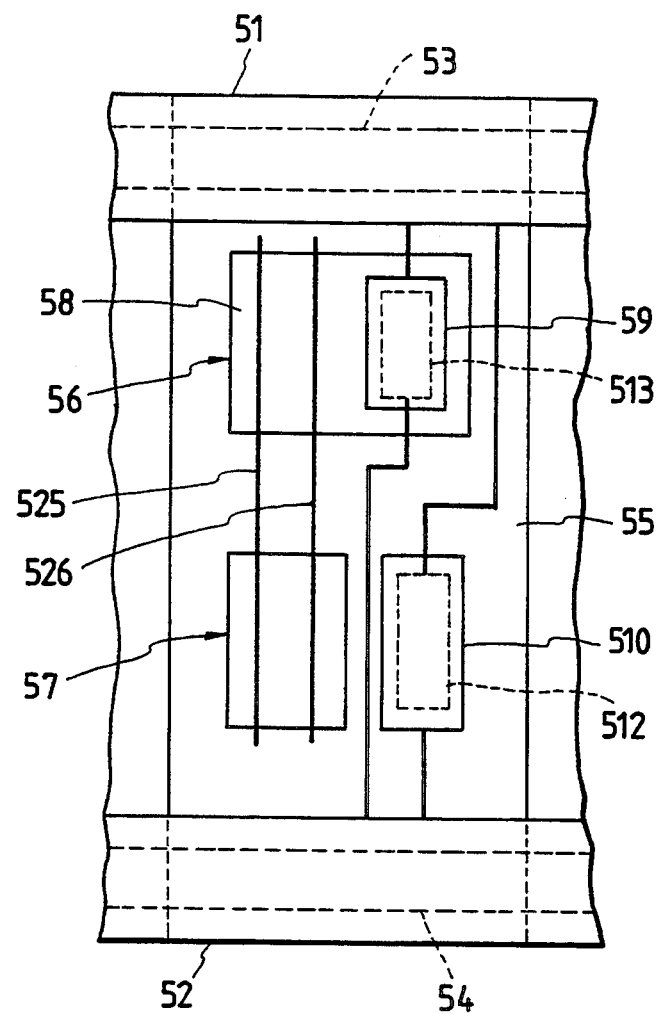

FIG. 43 shows a semiconductor device illustratively practiced according to the invention. This figure is in fact a top view of the CMOS shown in FIG. 40. Above and on both sides of a gate cell 55 (corresponding to basic cell 4 A of FIG. 40), there are provided a $V_{CC}$ power feeder 51 (corresponding to part 15 of FIG. 40) connected to a $V_{CC}$ power supply, and a $V_{EE}$ power feeder 52 (corresponding to part 9 of FIG. 40) connected to a $V_{EE}$ power supply. The $V_{CC}$ power feeder 51 and $V_{EE}$ power feeder 52 supply the $V_{CC}$ and $V_{EE}$ power to the circuits inside each gate cell 55. The gate cell 55 incorporates gate electrodes 525 and 526 that constitute a PMOS 56 and an NMOS 57. On the surface of a P-type semiconductor substrate in the gate cell 5 is a P-type diffused layer 510 for fixing the substrate potential. The $V_{EE}$ power feeder 52 is connected through a contact hole to the P-type diffused layer 510 so as to set the P-type semiconductor substrate to the $V_{EE}$ potential. On the surface of an N well 58 forming the PMOS 56 is an N-type diffused layer 59 for fixing the N well potential. The $V_{CC}$ power feeder 51 is connected through a contact hole to the N-type diffused layer 59 so as to set the N well 58 to the $V_{CC}$ potential.

In the semiconductor device as embodied herein, gates 53 and 54, characteristic of this embodiment, are formed via insulation films, not shown, under the $V_{CC}$ power feeder 51 and $V_{EE}$ power feeder 52, the gates 53 and 54 being connected to the $V_{EE}$ and $V_{CC}$ power supplies, respectively. This arrangement creates a capacitor between $V_{CC}$ power feeder 51 and gate 53 and another capacitor between $V_{EE}$ power feeder 52 and gate 54 (each capacitor representing the capacity between power supplies). The area of these capacitors far exceeds the area formed by free spaces in the typical prior art chip, and thus provides a large capacity.

In FIG. 43, only one gate cell 55 is shown in order to avoid unnecessarily complicating the figure. In practice, numerous gate cells are arranged on both sides of the indicated cell 55.

Figure 44:
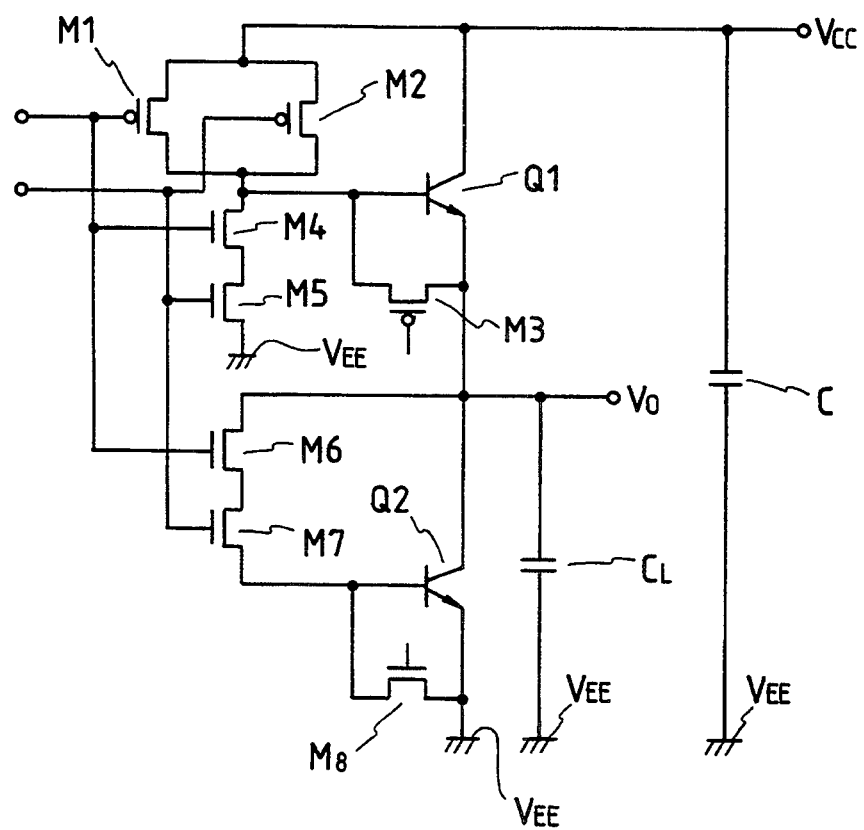

FIG. 44 is an equivalent circuit diagram showing how a Bi/CMOS two-input NAND gate circuit may illustratively be incorporated in a semiconductor device wherein the $V_{CC}$ power feeder 51 and $V_{EE}$ power feeder 52 provide a capacitor each. In FIG. 44, reference characters M1 through M3 stand for PMOSs, M4 through M8 for NMOSs, Q1 and Q2 for a bipolar transistor each, $C_L$ for the load capacity, and $V_O$ for the output potential.

In the circuit of FIG. 44, only a bipolar transistor Q1 is activated when the output potential $V_O$ is brought High; a bipolar transistor Q2 alone is activated when the output potential $V_O$ is brought Low. In each case, the other bipolar transistor Q2 or Q1 remains off. That is, only negligible currents flow through this circuit in its steady state. However, when the output potential $V_O$ goes from Low to High or from High to Low, the load capacity $C_L$ is charged or depleted, generating a large transient current. Since V=Ldi/dt (V stands for electromotive force, L for inductance, i for current, t for time), when the inductance component exists in leads or other parts of the package, a transient current change develops in the form of fluctuations in supply voltage, i.e., as the power noise.

In the semiconductor as embodied herein, the power feeders 51 and 52 create a capacitor each. This means having a capacitor C inserted between $V_{CC}$ power supply and $V_{EE}$ power supply in FIG. 45. The integrating function of the capacitor C suppresses fluctuations in the supply potential levels $V_{CC}$ and $V_{EE}$.

The semiconductor device embodied as described above provides, among others, the following benefit: The power feeders 51 and 52 supplying the $V_{CC}$ and $V_{EE}$ power to the circuits inside each cell 55 are overlaid via insulation films with the gates 53 and 54 connected to the $V_{EE}$ and $V_{CC}$ power supplies. Thanks to this arrangement, a capacitor with a wide area is created. The integrating function of the wide-area capacitor suppresses fluctuations in the power supply potential, substantially reduces the power noise, and stabilizes circuit operations accordingly.

Figure 45:
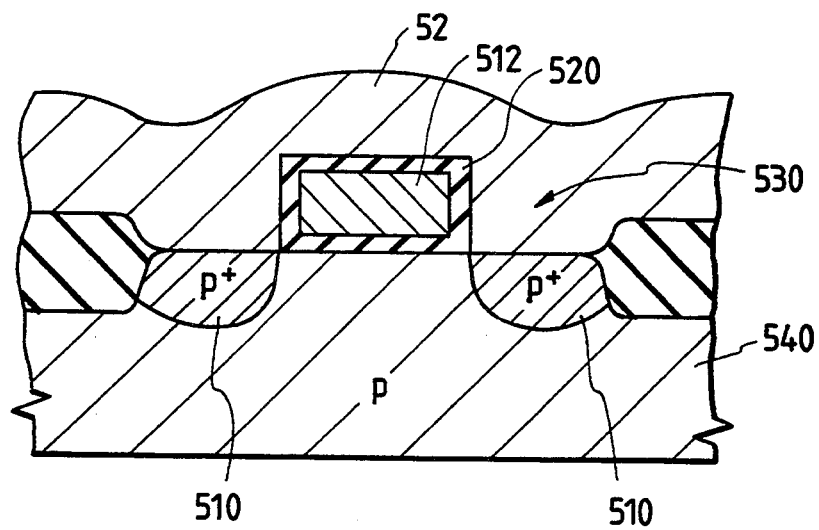

In the semiconductor device as embodied in FIG. 45, a contact hole 530 through which the $V_{EE}$ power feeder 52 is connected to the P-type diffused layer 510 for fixing the substrate potential is overlaid with a gate 512 which is connected to the $V_{CC}$ power supply and the surface of which is surrounded by an insulation film 520, all parts being mounted on a P-type semiconductor substrate 540. This arrangement creates a depletion layer immediately below the gate 512. The capacity of this depletion layer suppresses fluctuations in the substrate potential. Capacitors that are additionally created on the side and on top of the gate 512 further suppress the changes in the substrate potential for stabilization thereof.

In FIG. 45, the P-type diffused layer 510 for fixing the substrate potential is not formed immediately below the gate 512. The reason for this is that the gate 512 is used as the mask in forming the P-type diffused layer 510.

The semiconductor device as embodied in FIG. 45 provides, among others, the following benefit: Inside each cell 55 constituting logic gates, the contact hole 530 (for fixing the substrate-side potential) to which the $V_{EE}$ power feeder 52 is connected is overlaid via the insulation film 520 with the gate 512 connected to the $V_{CC}$ power supply. This arrangement creates a capacitor with a relatively wide area. The integrating function of this capacitor suppresses fluctuations in the substrate potential, substantially lowers the power noise, and stabilizes circuit operations.

In the semiconductor device of the above embodiment, both the currently depicted construction and the previously described construction (shown in FIG. 43)

are adopted. This setup creates a capacitor with a wide area. The integrating function of this wide area capacitor suppresses fluctuations in both power supply potential and substrate potential, substantially reduces the power noise, and stabilizes circuit operations accordingly.

In the semiconductor device of the above embodiment, as shown in the PMOS 56 of FIG. 1, the contact hole through which the $V_{CC}$ power feeder 1 is connected to the N-type diffused layer 59 for fixing the N well potential is overlaid with a gate 513 which is connected to the $V_{EE}$ power supply and the surface of which is surrounded by insulation films. This setup also suppresses fluctuations in the N well potential.

While preferred embodiments of the invention have been described using specific terms, such description is for illustrative purposes only, and it is to be understood that changes and variations may be made without departing from the spirit and scope of the appended claims. Further alternatives to the preceding embodiments are outlined below.

For example, in the preceding embodiments, the $V_{CC}$ power feeder 51 and $V_{EE}$ power feeder 52, as well as the contact holes thereof for fixing the substrate-side potential (substrate potential, well potential), are overlaid with the gates 53, 54, 512 and 513. Alternatively, the lines and wiring involved may be overlaid with one another to implement the same arrangement.

In the preceding embodiments, the gates 53, 54, 512 and 513 are formed under the $V_{CC}$ power feeder 51 and $V_{EE}$ power feeder 52. Alternatively, the gates may be formed above the power feeders.

The capacitor locations are not limited to those included in the preceding embodiments. Alternatively, capacitors may be formed between first- and second-layer gates, between first- and second-layer power feeders, or between any other two layers of wiring (gates).

In the preceding embodiments, the application examples have highlighted the semiconductor device having Bi-CMOS logic gates that generate particularly large power noise. Alternatively, the invention may also be applied to other types of semiconductor device.

Needless to say, the present invention may be applied to semiconductor devices formed by reversing the construction of the conductive types described above.

Representative novelties and typical features of the invention as disclosed in FIGS. 43 through 45 are summarized below.

The power feeder supplying power to the circuits inside each cell is overlaid via insulation films with gates or wiring connected to a power supply different from the one to which that power feeder is connected. This setup creates a wide-area capacitor. The integrating function this capacitor suppresses fluctuations in the power supply potential, substantially lowers the power noise and stabilizes circuit operations.

In each cell, the contact hole (for fixing the substrate-site potential) to which the power feeder is connected is overlaid via insulation films with the gates or wiring connected to a power supply different from the one to which that power feeder is connected. This setup creates a capacitor with a relatively wide area. The integrating function of this capacitor suppresses fluctuations in the substrate-side potential, substantially reduces the power noise, and stabilizes circuit operations.

In the semiconductor device according to the invention, the above two constructions are both incorporated. This setup creates a capacitor with a wide area. The integrating function of this capacitor suppresses fluctuations in both power supply potential and substrate-side potential, substantially reduces the power noise, and stabilizes circuit operations.

What is claimed is:

1. A semiconductor integrated circuit device formed on a semiconductor substrate comprising:

a clock distribution circuit coupled to receive first clock signals and for outputting second clock signals, said first clock signals and said second clock signals being of an ECL level;

a first clock switching amplifier coupled to receive said second clock signals and for outputting third clock signals, said third clock signals being of a MOS level;

a second clock switching amplifier coupled to receive said second clock signals and for outputting fourth clock signals, said fourth clock signals being of said MOS level;

a memory for storing data therein, wherein said memory is coupled to receive said third clock signals; and a gate array coupled to receive said fourth clock signals.

2. A semiconductor integrated circuit device according to claim 1, wherein said clock distribution circuit is located substantially at a center of said semiconductor substrate.

3. A semiconductor integrated circuit device according to claim 1, further comprising:

a clock shaping circuit for receiving external clock signals from outside of said semiconductor integrated circuit device and for outputting said first clock signals, including means for adjusting a setup time and a signal amplitude of said first clock signals based on said external clock signals.

4. A semiconductor integrated circuit device according to claim 3, wherein each of said first to fourth clock signals and said external clock signals comprises complementary signals.

5. A semiconductor integrated circuit device according to claim 1, wherein each of said first clock switching amplifier and said second clock switching amplifier comprises:

a unit switching amplifier receiving said second clock signals for amplifying said second clock signals; and a level conversion circuit receiving the amplified second clock signals from said unit switching amplifier and outputting said third clock signals or said fourth clock signals.

6. A semiconductor integrated circuit device according to claim 5, wherein said unit switching amplifier comprises an ECL differential circuit including a current switching circuit, and wherein said level conversion circuit comprises:

a p-channel MOSFET having a source-drain path coupled to a first supply voltage and a gate coupled to a first input which receives one of the amplified second clock signals;

a first n-channel MOSFET having a gate and a source-drain path coupled between said source-drain path of said p-channel MOSFET and a second supply voltage;

a second n-channel MOSFET having a source-drain path and a gate coupled to said gate of said first n-channel MOSFET;

a third n-channel MOSFET having a gate coupled to said first supply voltage and a source-drain path coupled between said source-drain path of said second n-channel MOSFET and said second supply voltage;

a first bipolar transistor having a base coupled to a connection point of said source-drain path of said p-channel MOSFET and said source-drain path of said first n-channel MOSFET and having an emitter-collector path coupled between said first supply voltage and an output; and a second bipolar transistor having a base coupled to a connection point of said source-drain path of said second n-channel MOSFET and a source-drain path of said third n-channel MOSFET and having an emitter-collector path coupled between said output and said second supply voltage.

7. A semiconductor integrated circuit device according to claim 6, wherein said level conversion circuit further comprises:

a fourth n-channel MOSFET having a gate coupled to a second input which receives another one of the amplified second clock signals and a source-drain path coupled between said first supply voltage and said gate of said first n-channel MOSFET; and a fifth n-channel MOSFET having a gate coupled to said gate of said first n-channel MOSFET and a source-drain path coupled between said gate of said first n-channel MOSFET and said second supply voltage.

8. A semiconductor integrated circuit device according to claim 1, wherein each of said first to fourth clock signals comprises complementary signals.

9. A semiconductor integrated circuit device formed on a semiconductor substrate comprising:

a clock distribution circuit coupled to receive first internal clock signals and for outputting second internal clock signals, said first internal clock signals and said second internal clock signals being of an ECL level;

a first clock switching amplifier coupled to receive said second internal clock signals and for outputting first distribution signals, said first distribution signals being of a MOS level;

a second clock switching amplifier coupled to receive said second internal clock signals and outputting second distribution signals, said second distribution signals being said MOS level;

a first memory for storing data therein, wherein said first memory is coupled to receive said first distribution signals; and a second memory for storing data therein, wherein said second memory is coupled to receive said second distribution signals.

10. A semiconductor integrated circuit device according to claim 9, wherein said clock distribution circuit is located substantially at a center of said semiconductor substrate.

11. A semiconductor integrated circuit device according to claim 1, further comprising:

a clock shaping circuit for receiving external clock signals from outside of said semiconductor integrated circuit device and for outputting said first internal clock signals, and having means for adjusting a setup time and a signal amplitude of said first internal clock signals based on said external clock signals.

12. A semiconductor integrated circuit device according to claim 11, wherein each of first internal clock signals, said second internal clock signals, said first distribution signals, said second distribution signals and said external clock signals comprises complementary signals.

13. A semiconductor integrated circuit device according to claim 9, wherein each of said first clock switching amplifier and said second clock switching amplifier comprises:

a unit switching amplifier receiving said second internal clock signals for amplifying said second internal clock signals; and a level conversion circuit receiving the amplified second internal clock signals from said unit switching amplifier and outputting said first distribution signals or said second distribution signals.

14. A semiconductor integrated circuit device according to claim 13, wherein said unit switching amplifier comprises an ECL differential circuit including a current switching circuit, and wherein said level conversion circuit comprises:

a p-channel MOSFET having a source-drain path coupled to a first supply voltage and a gate coupled to a first input which receives one of the amplified second clock signals;

a first n-channel MOSFET having a gate and a source-drain path coupled between said source-drain path of said p-channel MOSFET and a second supply voltage;

a second n-channel MOSFET having a source-drain path and a gate coupled to said gate of said first n-channel MOSFET;

a third n-channel MOSFET having a gate coupled to said first supply voltage and a source-drain path coupled between said source-drain path of said second n-channel MOSFET and said second supply voltage;

a first bipolar transistor having a base coupled to a connection point of said source-drain path of said p-channel MOSFET and said source-drain path of said first n-channel MOSFET and having an emitter-collector path coupled between said first supply voltage and an output; and a second bipolar transistor having a base coupled to a connection point of said source-drain path of said second n-channel MOSFET and a source-drain path of said third n-channel MOSFET and having an emitter-collector path coupled between said output and said second supply voltage.

15. A semiconductor integrated circuit device according to claim 14, wherein said level conversion circuit further comprises:

a fourth n-channel MOSFET having a gate coupled to a second input which receives another one of the amplified second clock signals and a source-drain path coupled between said first supply voltage and said gate of said first n-channel MOSFET; and a fifth n-channel MOSFET having a gate coupled to said gate of said first n-channel MOSFET and a source-drain path coupled between said gate of said first n-channel MOSFET and said second supply voltage.

16. A semiconductor integrated circuit device according to claim 9, wherein each of said first internal clock signals, said second internal clock signals, said first distribution signals and said second distribution signals comprises complementary signals.

17. A semiconductor integrated circuit device formed on a semiconductor substrate comprising:
   a first gate array;
   a first memory;
   a first clock shaping circuit for receiving first external clock signals having a first level from outside of said semiconductor integrated circuit device, said first clock shaping circuit outputting first internal clock signals having said first level in response to said first external clock signals;
   a second clock shaping circuit for receiving second external clock signals from outside of said semiconductor integrated circuit device, said second clock shaping circuit outputting second internal clock signals in response to said second external clock signals;
   a clock distribution circuit coupled to receive said first and second internal clock signals from said first and second clock shaping circuits, said clock distribution circuit outputting third and fourth internal clock signals both having said first level;
   a first clock switching amplifier coupled to receive said third internal clock signals from said clock distribution circuit, said first clock switching amplifier providing first internal distribution clock signals at a second level, different from said first level, to said first gate array, in response to said third internal clock signal; and
   a second clock switching amplifier coupled to receive said fourth internal clock signals from said clock distribution circuit, said second clock switching amplifier providing second internal distribution clock signals at the second level to said first memory, in response to said fourth internal clock signals.

18. A semiconductor integrated circuit device according to claim 17, wherein said second external clock signals and said second internal clock signals have said first level.

19. A semiconductor integrated circuit device according to claim 18, wherein said first level is an ECL level and said second level is a MOS level.

20. A semiconductor integrated circuit device according to claim 17, wherein said first level is an ECL level and said second level is a MOS level.

21. A semiconductor integrated circuit device according to claim 17, wherein said clock distribution circuit is located substantially in the center of the semiconductor substrate.

22. A semiconductor integrated circuit device according to claim 21, wherein the first clock switching amplifier is substantially in the center of said first gate array.

23. A semiconductor integrated circuit device formed on a semiconductor substrate comprising:
   a plurality of gate arrays;
   a plurality of memories;
   a first clock shaping circuit for receiving first external clock signals having an ECL level from outside of said semiconductor integrated circuit device, said first clock shaping circuit outputting first internal clock signals having said ECL level in response to said first external clock signals;
   a second clock shaping circuit for receiving second external clock signals from outside of said semiconductor integrated circuit device, including means for outputting second internal clock signals in response to said second external clock signals;
   a clock distribution circuit coupled to receive said first and second internal clock signals from said first and second clock shaping circuits, said clock distribution circuit outputting third and fourth internal clock signals both having said ECL level;
   a plurality of first clock switching amplifiers each coupled to receive said third internal clock signals from said clock distribution circuit, wherein each of the first clock switching amplifiers is respectively coupled to one of the gate arrays, and wherein the first clock switching amplifiers provide first internal distribution clock signals at a MOS level to the gate array to which they are coupled, in response to said third internal clock signals; and
   a plurality of second clock switching amplifiers, coupled to receive said fourth internal clock signals from said clock distribution circuit, each of said second clock switching amplifiers providing second internal distribution clock signals at a MOS level to one or more of said memories, in response to said fourth internal clock signals.

24. A semiconductor integrated circuit device according to claim 23, wherein said second external clock signals and said second internal clock signals are ECL level signals.

25. A semiconductor integrated circuit device according to claim 23, wherein said clock distribution circuit is substantially in the center of the semiconductor substrate, and is surrounded by the gate arrays.

26. A semiconductor integrated circuit device according to claim 25, wherein said first clock switching amplifiers are each respectively located substantially in the center of the gate array to which they are coupled.

27. A semiconductor integrated circuit device according to claim 26, wherein said second clock switching amplifiers are each arranged to be coupled to a pair of said memories to provide said second distribution clock signals to said pair of said memories.

28. A semiconductor integrated circuit device formed on a semiconductor substrate comprising:
   a first gate array;
   a first memory;
   a first clock shaping circuit for receiving first external clock signals from outside of said semiconductor integrated circuit device, said first clock shaping circuit outputting first internal clock signals in response to said first external clock signals;
   a second clock shaping circuit for receiving second external clock signals from outside of said semiconductor integrated circuit device, said second clock shaping circuit outputting second internal clock signals in response to said second external clock signals;
   a clock distribution circuit coupled to receive said first and second internal clock signals from said first and second clock shaping circuits, said clock distribution circuit outputting third internal clock signals and fourth internal clock signals each of which are formed based on said first and second internal clock signals;
   a first clock switching amplifier coupled to receive said third internal clock signals from said clock distribution circuit, said first clock switching amplifier providing said first gate array with first internal distribution clock signals in response to said third internal clock signals; and a second clock switching amplifier coupled to receive said fourth internal clock signals from said clock distribution circuit, said second clock switching amplifier providing said first memory with second internal distribution clock signals in response to said fourth internal clock signals.

29. A semiconductor integrated circuit device according to claim 28, wherein said first gate array comprises a plurality of unit cells each of which includes a MOS transistor and a bipolar transistor.

30. A semiconductor integrated circuit device according to claim 28, wherein said first memory comprises a plurality of static type MOS transistors.

31. A semiconductor integrated circuit device according to claim 28, wherein a distance between said first clock shaping circuit and said clock distribution circuit is substantially equal to a distance between said second clock shaping circuit and said clock distribution circuit.

32. A semiconductor integrated circuit device according to claim 28, wherein said clock distribution circuit is located substantially at a center of said semiconductor substrate.

33. A semiconductor integrated circuit device according to claim 28, further comprising:
   a plurality of first clock signal lines on which said first internal clock signals are outputted by said first clock shaping circuit;
   a plurality of second clock signals lines on which said second internal clock signals are outputted by said second clock shaping circuit;
   a supply voltage line on which a first power supply voltage is supplied to said semiconductor integrated circuit device; and
   a ground potential line on which a second power supply voltage different from said first power supply voltage is supplied to said semiconductor integrated circuit device,
   wherein said plurality of first and second clock signal lines are located between said supply voltage line and said ground potential line.

34. A semiconductor integrated circuit device according to claim 33, further comprising:
   a plurality of third clock signal lines on which said third internal clock signals are outputted by said clock distribution circuit; and
   a plurality of fourth clock signal lines on which said fourth internal clock signals are outputted by said clock distribution circuit;
   wherein said plurality of third and fourth clock signal lines are located between said supply voltage line and said ground potential line.

35. A semiconductor integrated circuit device according to claim 28, wherein said semiconductor substrate has a first edge and a second edge opposing to said first edge,
   wherein said first clock shaping circuit is located adjacent to said first edge,
   and wherein said second clock shaping circuit is located adjacent to said second edge.

36. A semiconductor integrated circuit device according to claim 35, wherein said clock distribution circuit is located substantially at a center of said semiconductor substrate.

37. A semiconductor integrated circuit device according to claim 28, further comprising:
   a second gate array;
   a second memory;
   a third clock switching amplifier; and
   a fourth clock switching amplifier,
   wherein said clock distribution circuit outputs fifth internal clock signals and sixth internal clock signals each of which are formed based on said first and second internal clock signals,
   wherein said third clock switching amplifier is coupled to receive said fifth internal clock signals from said clock distribution circuit, said third clock switching amplifier providing said second gate array wit third internal distribution clock signals in response to said fifth internal clock signals; and
   wherein said fourth clock switching amplifier is coupled to receive said sixth internal clock signals from said clock distribution circuit, said fourth clock switching amplifier providing said second memory with fourth internal distribution clock signals in response to said sixth internal clock signals.

* * * * *